United States Patent
Park et al.

(10) Patent No.: US 12,492,218 B2
(45) Date of Patent: Dec. 9, 2025

(54) ORGANOMETALLIC COMPOUND, ORGANIC LIGHT-EMITTING DEVICE INCLUDING THE SAME, AND ELECTRONIC APPARATUS INCLUDING THE ORGANIC LIGHT-EMITTING DEVICE

(71) Applicant: Samsung Electronics Co., Ltd., Suwon-si (KR)

(72) Inventors: Bumwoo Park, Yongin-si (KR); Ohyun Kwon, Seoul (KR); Virendra Kumar RAI, Hwaseong-si (KR); Hyungjun Kim, Suwon-si (KR); Myungsun Sim, Suwon-si (KR); Byoungki Choi, Hwaseong-si (KR); Yasushi Koishikawa, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 937 days.

(21) Appl. No.: 17/199,644

(22) Filed: Mar. 12, 2021

(65) Prior Publication Data

US 2022/0089624 A1   Mar. 24, 2022

(30) Foreign Application Priority Data

Sep. 22, 2020   (KR) .................. 10-2020-0122432

(51) Int. Cl.
*C07F 15/00* (2006.01)
*C09K 11/06* (2006.01)
(Continued)

(52) U.S. Cl.
CPC ....... *C07F 15/0033* (2013.01); *H10K 85/342* (2023.02); *H10K 50/15* (2023.02); *H10K 50/16* (2023.02); *H10K 50/171* (2023.02)

(58) Field of Classification Search
None
See application file for complete search history.

(56) References Cited

U.S. PATENT DOCUMENTS

| 7,534,853 B2 | 5/2009 | Stoessel et al. |
| 8,716,700 B2 | 5/2014 | Lecloux et al. |
| (Continued) | | |

FOREIGN PATENT DOCUMENTS

| CN | 1500093 A | 5/2004 |
| CN | 102484214 A | 5/2012 |
| (Continued) | | |

OTHER PUBLICATIONS

Jiang et al., "Carbazole/phenylpyridine hybrid compound as dual role of efficient host and ligand of iridium complex: Well matching of host-dopant for solution-processed green phosphorescent OLEDs," vol. 150, pp. 130-138 (2018). (Year: 2018).*

(Continued)

*Primary Examiner* — Ha S Nguyen
(74) *Attorney, Agent, or Firm* — CANTOR COLBURN LLP

(57) ABSTRACT

An organometallic compound represented by Formula 1:

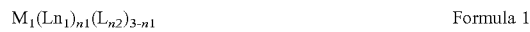

$$M_1(Ln_1)_{n1}(Ln_2)_{3-n1} \quad \text{Formula 1}$$

wherein $M_1$ is a first-row transition metal of the Periodic Table of Elements, a second-row transition metal of the Periodic Table of Elements, or a third-row transition metal of the Periodic Table of Elements, $Ln_1$ is a bidentate ligand, n1 is 0, 1, or 2, and $Ln_2$ is a ligand represented by Formula 1A:

(Continued)

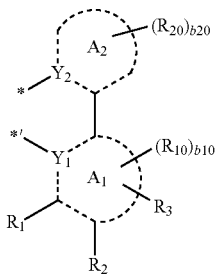

Formula 1A wherein $A_1$, $A_2$, $Y_1$, $Y_2$, $R_1$ to $R_3$, $R_{10}$, $R_{20}$, b10, and b20 are as provided herein, and
* and *' each indicate a binding site to a neighboring atom.

7 Claims, 1 Drawing Sheet

(51) Int. Cl.
  *H10K 50/11* (2023.01)
  *H10K 50/12* (2023.01)
  *H10K 50/15* (2023.01)
  *H10K 50/16* (2023.01)
  *H10K 50/17* (2023.01)
  *H10K 85/30* (2023.01)
  *H10K 85/40* (2023.01)

(56) References Cited

U.S. PATENT DOCUMENTS

| | | | |
|---|---|---|---|
| 9,735,375 B2 | 8/2017 | Herron et al. | |
| 9,923,154 B2 | 3/2018 | Oshiyama et al. | |
| 10,388,903 B2 | 8/2019 | Yamamoto et al. | |
| 2004/0133004 A1* | 7/2004 | Stossel | C07F 15/008 546/2 |
| 2006/0065890 A1 | 3/2006 | Stössel et al. | |
| 2011/0127501 A1* | 6/2011 | Lecloux | H10K 85/342 257/E51.024 |
| 2011/0266524 A1 | 11/2011 | Lecloux et al. | |
| 2013/0088144 A1* | 4/2013 | Inoue | C09K 11/06 313/504 |
| 2015/0048340 A1* | 2/2015 | Herron | H05B 33/10 546/4 |
| 2018/0053898 A1 | 2/2018 | Kim et al. | |
| 2018/0083206 A1* | 3/2018 | Kurihara | H10K 85/654 |
| 2022/0127287 A1 | 4/2022 | Park et al. | |

FOREIGN PATENT DOCUMENTS

| | | | | |
|---|---|---|---|---|
| CN | 103275131 A | * | 9/2013 | |
| CN | 104203967 A | | 12/2014 | |
| CN | 110760305 A | * | 2/2020 | C07F 15/0033 |
| CN | 110790796 A | * | 2/2020 | C07F 15/0033 |
| DE | 10116962 A1 | | 10/2002 | |
| EP | 3261146 A2 | | 12/2017 | |
| EP | 3960747 A1 | | 3/2022 | |
| JP | 2016219490 A | | 12/2016 | |
| JP | 2018052929 A | | 4/2018 | |
| KR | 20030093297 A | | 12/2003 | |
| KR | 20120101030 A | | 9/2012 | |
| KR | 20130037646 A | | 4/2013 | |
| KR | 20140140088 A | | 12/2014 | |
| WO | 2011028479 A2 | | 3/2011 | |
| WO | 2011059791 A2 | | 5/2011 | |
| WO | 2011059825 A2 | | 5/2011 | |
| WO | 2012111548 A1 | | 8/2012 | |
| WO | 2013072740 A2 | | 5/2013 | |
| WO | 2013142633 A1 | | 9/2013 | |
| WO | 2013142634 A1 | | 9/2013 | |
| WO | 2016056562 A1 | | 4/2016 | |

OTHER PUBLICATIONS

Lepeltier et al., "Carbazole-Substituted Iridium Complex as a Solid State Emitter for Two-Photon Intravital Imaging," Inorganic Chemistry, vol. 55, pp. 9586-9595 (2016). (Year: 2016).*
Ono et al., "Synthesis and Electroluminescence Properties of fac-Tris(2-phenylpyridine)-iridium Derivatives Containing Hole-Trapping Moieties," European Journal of Inorganic Chemistry, pp. 3676-3683 (2016). (Year: 2016).*
Liu et al., "Substituent effects on the photophysical and electrochemical properties of iridium(III) complexes containing an arylcarbazolyl moiety," Dyes and Pigments, vol. 109, pp. 13-20 (2014). (Year: 2014).*
Liang et al., "Cationic Polycarbazole Networks as Visible-Light Heterogeneous Photocatalysts for Oxidative Organic Transformations," ACS Catalysis, vol. 8, pp. 5313-5322 (2018) (Year: 2018).*
Office Action issued Sep. 5, 2023 of EP Patent Application No. 21196796.3.
Chun Liu et al., "Substituent effects on the photophysical and electrochemical properties of iridium(III) complexes containing an arylcarbazolyl moiety," Dyes and Pigments, May 9, 2014, pp. 13-20, vol. 109.
Extended European Search report dated Jan. 31, 2022 of EP Patent Application No. 21196796.3.
Hai-Peng Liang et al., "Cationic Polycarbazole Networks as Visible-Light Heterogeneous Photocatalysts for Oxidative Organic Transformations," ACS Catal., Apr. 30, 2018, pp. 5313-5322, vol. 8.
Helen Benjamin et al., "Unusual dual-emissive heteroleptic iridium complexes incorporating TADF cyclometalating ligands," Dalton Trans., Jan. 31, 2020, pp. 2190-2208, vol. 49.
Ledoux Daniel et al., "White organic light-emitting diode luminaires", WO2011059825 A2, (Jan. 1, 2011), pp. 1-3, XKP055880239.
Liu Chun et al., "Carbazolyl-containing ring metal ligand-iridium complex and its preparation method and application", CN103275131 A, (Jan. 1, 2013), pp. 1-4, XP055880238.
Marc Lepeltier et al., "Carbazole-Substituted Iridium Complex as a Solid State Emitter for Two-Photon Intravital Imaging," Inorg Chem, Sep. 12, 2016, pp. 9586-9595, vol. 55.
Margulies Eric A. et al., "Organometallic electroluminescent materials with substituent effect, devices and preparation", EP3261146 A, (Jan. 1, 2017), pp. 1-3, XP055880237.
KR OA issued on Aug. 30, 2024, of KR Patent Application No. 10-2020-0122432.
Office Action issued Dec. 11, 2024 of CN Patent Application No. 202111091201.3.
Office Action issued Aug. 22, 2025 of CN Patent Application No. 202111091201.3.

* cited by examiner

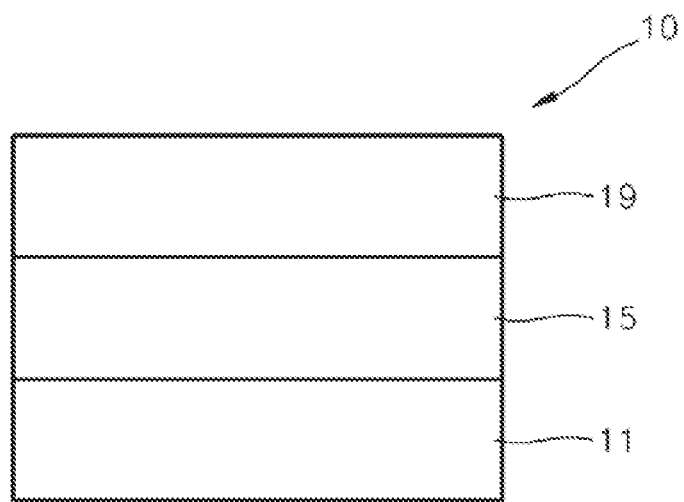

ORGANOMETALLIC COMPOUND, ORGANIC LIGHT-EMITTING DEVICE INCLUDING THE SAME, AND ELECTRONIC APPARATUS INCLUDING THE ORGANIC LIGHT-EMITTING DEVICE

CROSS-REFERENCE TO RELATED APPLICATION

This application claims priority to and the benefit of Korean Patent Application No. 10-2020-0122432, filed on Sep. 22, 2020, in the Korean Intellectual Property Office, and all the benefits accruing therefrom under 35 U.S.C. § 119, the content of which is incorporated by reference herein in its entirety.

BACKGROUND

1. Field

One or more embodiments of the present disclosure relates to organometallic compounds, organic light-emitting devices including the same, and electronic apparatuses including the organic light-emitting devices.

2. Description of Related Art

Organic light-emitting devices are self-emission devices, which have improved characteristics in terms of viewing angles, response time, brightness, driving voltage, and response speed, and produce full-color images.

In an example, an organic light-emitting device includes an anode, a cathode, and an organic layer between the anode and the cathode, wherein the organic layer includes an emission layer. A hole transport region may be arranged between the anode and the emission layer, and an electron transport region may be arranged between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transition from an excited state to a ground state to thereby generate visible light.

SUMMARY

Provided are organometallic compounds, organic light-emitting devices including the same, and electronic apparatuses including the organic light-emitting devices.

Additional aspects will be set forth in part in the description which follows and, in part, will be apparent from the description, or may be learned by practice of the presented embodiments of the disclosure.

According to an aspect of one or more embodiments, provided is an organometallic compound represented by Formula 1:

Formula 1

$$M_1(Ln_1)_{n1}(Ln_2)_{3-n1}$$

Formula 1A

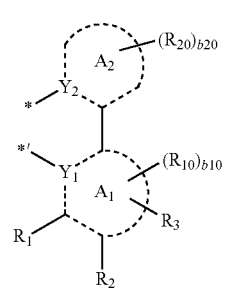

Formula 1-1

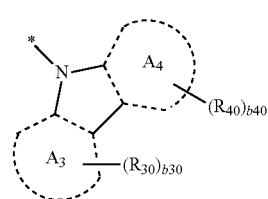

wherein, in Formula 1,
 $M_1$ is a first-row transition metal of the Periodic Table of Elements, a second-row transition metal of the Periodic Table of Elements, or a third-row transition metal of the Periodic Table of Elements,
 $Ln_1$ is a bidentate ligand,
 n1 is 0, 1, or 2, and
 $Ln_2$ is a ligand represented by Formula 1A, and
 in Formulae 1A and 1-1,
 $A_1$, $A_3$, and $A_4$ are each independently a $C_5$-$C_{30}$ carbocyclic group or a $C_1$-$C_{30}$ heterocyclic group,
 $A_2$ is (i) a 6-membered carbocyclic group or a 6-membered heterocyclic group or (ii) a bi- or multi-cyclic $C_5$-$C_{30}$ carbocyclic group including at least one of a 6-membered carbocyclic group and a 6-membered heterocyclic group or a bi- or multi-cyclic $C_1$-$C_{30}$ heterocyclic group including at least one of a 6-membered carbocyclic group and a 6-membered heterocyclic group,
 $Y_1$ is C or N, and $Y_2$ is C or N,
 $R_1$, $R_2$, and $R_3$ are each independently a group represented by Formula 1-1, hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted $C_2$-$C_{60}$ alkylheteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —Ge($Q_1$)($Q_2$)($Q_3$), —N($Q_4$)($Q_5$), —B($Q_1$)($Q_2$), —P(=O)($Q_1$)($Q_2$), or —P($Q_2$)($Q_2$), at least one of $R_1$, $R_2$, and $R_3$ is a group represented by Formula 1-1, $R_{10}$, $R_{20}$, $R_{30}$, and $R_{40}$ are each independently hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted a $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted $C_2$-$C_{60}$ alkylheteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —Ge($Q_1$)($Q_2$)($Q_3$), —B($Q_1$)($Q_2$), —P(=O)($Q_1$)($Q_2$), or —P($Q_2$)($Q_2$), at least two neighboring groups among $R_{10}$, $R_{20}$, $R_{30}$, and $R_{40}$ are optionally linked together to form a substituted or unsubstituted $C_5$-$C_{30}$ carbocyclic group or a substituted or unsubstituted $C_1$-$C_{30}$ heterocyclic group, b10 and b20 are each independently an integer from 1 to 10, b30 and b40 are each independently an integer from 1 to 10, when $A_1$ is a benzene group, (i) at least one of $R_{20}$(s) in the number of b20 is a substituted or unsubstituted $C_1$-$C_{60}$ alkyl group, —Si($Q_1$)($Q_2$)($Q_3$), or —Ge($Q_1$)($Q_2$)($Q_3$), or (ii) $R_1$ or $R_2$ is a group represented by Formula 1-1,

* and *' each indicate a binding site to a neighboring atom, and at least one substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted $C_2$-$C_{60}$ alkylheteroaryl group, the substituted monovalent non-aromatic condensed polycyclic group, and the substituted monovalent non-aromatic condensed heteropolycyclic group is:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with one or more of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted $C_2$-$C_{60}$ alkylheteroaryl group, a monovalent non-aromatic condensed polycyclic group, a monovalent non-aromatic condensed heteropolycyclic group, —Si($Q_{11}$)($Q_{12}$)($Q_{13}$), —Ge($Q_{11}$)($Q_{12}$)($Q_{13}$), —N($Q_{11}$)($Q_{12}$), —B($Q_{16}$)($Q_{17}$), —P(=O)($Q_1$)($Q_2$), or —P($Q_2$)($Q_2$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, or a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each substituted with one or more of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, a monovalent non-aromatic condensed heteropolycyclic group, —Si($Q_{21}$)($Q_{22}$)($Q_{23}$), —Ge($Q_{21}$)

$(Q_{22})(Q_{23})$, $-N(Q_{21})(Q_{22})$, $-B(Q_{26})(Q_{27})$-$P(=O)$ $(Q_1)(Q_2)$, or $-P(Q_2)(Q_2)$; and $-Si(Q_{31})(Q_{32})(Q_{33})$, $-Ge(Q_{31})(Q_{32})(Q_{33})$, $-N(Q_{31})(Q_{32})$, and $-B(Q_{31})(Q_{32})$, wherein $Q_1$ to $Q_3$, $Q_{11}$ to $Q_{13}$, $Q_{21}$ to $Q_{23}$, and $Q_{31}$ to $Q_{33}$ are each independently hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted $C_2$-$C_{60}$ alkylheteroaryl group, a substituted or unsubstituted monovalent non-aromatic condensed polycyclic group, or a substituted or unsubstituted monovalent non-aromatic condensed heteropolycyclic group.

According to an aspect of another embodiment, there is provided an organic light-emitting device including: a first electrode; a second electrode; and an organic layer arranged between the first electrode and the second electrode and including an emission layer, wherein the organic layer includes at least one organometallic compound as provided herein.

The organometallic compound as provided herein may be included in the emission layer of the organic layer, and the organometallic compound included in the emission layer may act as a dopant.

According to an aspect of another embodiment, there is provided an electronic apparatus including the organic light-emitting device as described herein.

BRIEF DESCRIPTION OF THE DRAWINGS

The above and other aspects, features, and advantages of certain embodiments of the disclosure will be more apparent from the following description taken in conjunction with the FIGURE, which shows a schematic cross-sectional view of an organic light-emitting device according to one or more embodiments.

DETAILED DESCRIPTION

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, in further detail to explain aspects. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to a cross section illustration that is a schematic illustration of one or more idealized embodiments. As such, variations from the shapes of the illustration as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the FIGURE are schematic in nature and their shapes are not intended to illustrate the precise shape of a region and are not intended to limit the scope of the present claims.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within +30%, 20%, 10%, 5% of the stated value.

An aspect of the present disclosure provides an organometallic compound represented by Formula 1:

$$M_1(Ln_1)_{n1}(Ln_2)_{3-n1} \quad \text{Formula 1}$$

wherein, $M_1$ in Formula 1 is a first-row transition metal of the Periodic Table of Elements, a second-row transition metal of the Periodic Table of Elements, or a third-row transition metal of the Periodic Table of Elements.

In one or more embodiments, $M_1$ may be beryllium (Be), magnesium (Mg), aluminum (Al), calcium (Ca), titanium (Ti), manganese (Mn), cobalt (Co), copper (Cu), zinc (Zn), gallium (Ga), germanium (Ge), zirconium (Zr), ruthenium (Ru), rhodium (Rh), palladium (Pd), silver (Ag), rhenium (Re), iridium (Ir), osmium (Os), platinum (Pt), or gold (Au).

In one or more embodiments, $M_1$ may be Ir, Os, Pt, Pd, or Au.

In one or more embodiments, $M_1$ may be Ir.

In Formula 1, $Ln_1$ may be a bidentate ligand.

In Formula 1, n1 may be 0, 1, or 2.

In Formula 1, $Ln_2$ may be a ligand represented by Formula 1A:

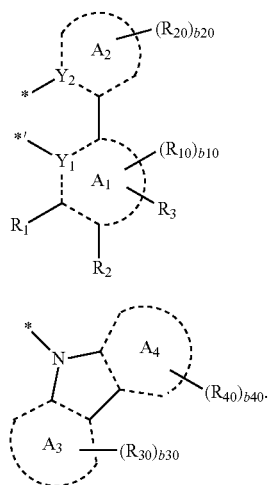

In Formulae 1A and 1-1, $A_1$, $A_3$, and $A_4$ may each independently be a $C_5$-$C_{60}$ carbocyclic group or a $C_1$-$C_{60}$ heterocyclic group.

For example, $A_1$, $A_3$, and $A_4$ may each independently be i) a first ring, ii) a second ring, iii) a condensed ring in which two or more first rings are condensed with each other, iv) a condensed ring in which two or more second rings are condensed with each other, or v) a condensed ring in which one or more first rings and one or more second rings are condensed with each other, wherein the first ring may be a cyclopentane group, a cyclopentadiene group, a furan group, a thiophene group, a pyrrole group, a silole group, an indene group, a benzofuran group, a benzothiophene group, an indole group, a benzosilole group, an oxazole group, an isoxazole group, an oxadiazole group, an isozadiazole group, an oxatriazole group, an isoxatriazole group, a thiazole group, an isothiazole group, a thiadiazole group, an isothiadiazole group, a thiatriazole group, an isothiatriazole group, a pyrazole group, an imidazole group, a triazole group, a tetrazole group, an azasilole group, a diazasilole group, or a triazasilole group, and the second ring may be an adamantane group, a norbornene group, a bicyclo[1.1.1]pentane group, a bicyclo[2.1.1]hexane group, a bicyclo[2.2.1]heptane(norbornane) group, a bicyclo[2.2.2]octane group, a cyclohexane group, a cyclohexene group, a benzene group, a pyridine group, a pyrimidine group, a pyrazine group, a pyridazine group, or a triazine group.

In one or more embodiments, $A_1$ to $A_4$ may each independently be a benzene group, a naphthalene group, an anthracene group, a phenanthrene group, a triphenylene group, a pyrene group, a chrysene group, a 1,2,3,4-tetrahydronaphthalene group, a thiophene group, a furan group, a pyrrole group, a cyclopentadiene group, a silole group, a borole group, a phosphole group, a selenophene group, a germole group, a benzothiophene group, a benzofuran group, an indole group, an indene group, a benzosilole group, a benzoborole group, a benzophosphole group, a benzoselenophene group, a benzogermole group, a dibenzothiophene group, a dibenzofuran group, a carbazole group, a fluorene group, a dibenzosilole group, a dibenzoborole group, a dibenzophosphole group, a dibenzoselenophene group, a dibenzogermole group, a dibenzothiophene 5-oxide group, a 9H-fluoren-9-one group, a dibenzothiophene 5,5-dioxide group, an azabenzothiophene group, an azabenzofuran group, an azaindole group, an azaindene group, an azabenzosilole group, an azabenzoborole group, an azabenzophosphole group, an azabenzoselenophene group, an azabenzogermole group, an azadibenzothiophene group, an azadibenzofuran group, an azacarbazole group, an azafluorene group, an azadibenzosilole group, an azadibenzoborole group, an azadibenzophosphole group, an azadibenzoselenophene group, an azadibenzogermole group, an azadibenzothiophene 5-oxide group, an aza-9H-fluoren-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, an oxazole group, an isoxazole group, a thiazole group, isothiazole group, an oxadiazole group, a thiadiazole group, a benzopyrazole group, a benzimidazole group, a benzoxazole group, a benzothiazole group, a benzoxadizole group, a benzothiadiazole group, a 5,6,7,8-tetrahydroisoquinoline group, a 5,6,7,8-tetrahydroquinoline group, an adamantane group, a norbornane group, or a norbornene group.

In one or more embodiments, $A_1$ may be a benzene group, a naphthalene group, a 1,2,3,4-tetrahydronaphthalene group, a benzothiophene group, a benzofuran group, an indole group, an indene group, a benzosilole group, a dibenzothiophene group, a dibenzofuran group, a carbazole group, a fluorene group, or a dibenzosilole group.

In one or more embodiments, $A_1$ may be a benzene group, a dibenzothiophene group, a dibenzofuran group, a carbazole group, a fluorene group, or a dibenzosilole group.

In Formula 1A, $A_2$ may be (i) a 6-membered carbocyclic group or a 6-membered heterocyclic group or (ii) a bi- or multi-cyclic $C_5$-$C_{30}$ carbocyclic group including at least one of a 6-membered carbocyclic group and a 6-membered heterocyclic group or a bi- or multi-cyclic $C_1$-$C_{30}$ heterocyclic group including at least one of a 6-membered carbocyclic group and a 6-membered heterocyclic group.

In one or more embodiments, $A_2$ may be an azabenzothiophene group, an azabenzofuran group, an azaindole group, an azaindene group, an azabenzosilole group, an azabenzoborole group, an azabenzophosphole group, an azabenzoselenophene group, an azabenzogermole group, an azadibenzothiophene group, an azadibenzofuran group, an azacarbazole group, an azafluorene group, an azadibenzosilole group, an azadibenzoborole group, an azadibenzophosphole group, an azadibenzoselenophene group, an azadibenzogermole group, an azadibenzothiophene 5-oxide group, an aza-9H-fluoren-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a 5,6,7,8-tetrahydroisoquinoline group, or a 5,6,7,8-tetrahydroquinoline group.

In one or more embodiments, $A_2$ may be a pyridine group, a pyrimidine group, a pyridazine group, a triazine group, a quinoline group, an isoquinoline group, a quinoxaline group, a quinazoline group, or a phenanthroline group.

In one or more embodiments, $A_3$ and $A_4$ may each independently be a benzene group, a naphthalene group, a 1,2,3,4-tetrahydronaphthalene group, a benzothiophene group, a benzofuran group, an indole group, an indene group, a benzosilole group, a dibenzothiophene group, a dibenzofuran group, a carbazole group, a fluorene group, or a dibenzosilole group.

In one or more embodiments, $A_3$ and $A_4$ may each independently be a benzene group, a dibenzothiophene group, a dibenzofuran group, a carbazole group, a fluorene group, or a dibenzosilole group.

In Formula 1A, $Y_1$ may be C or N, and $Y_2$ may be C or N.

In Formulae 1 and 1A, a bond between $M_1$ and $Y_1$ may be a covalent bond or a coordinate bond.

In Formulae 1 and 1A, a bond between $M_1$ and $Y_2$ may be a covalent bond or a coordinate bond.

In one or more embodiments, $Y_1$ may be C, $Y_2$ may be N, a bond between $M_1$ and $Y_1$ may be a covalent bond, and a bond between $M_1$ and $Y_2$ may be a coordinate bond.

In Formula 1A, $R_1$, $R_2$, and $R_3$ may each independently be a group represented by Formula 1-1, hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted $C_2$-$C_{60}$ alkylheteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —Ge($Q_1$)($Q_2$)($Q_3$), —N($Q_4$)($Q_5$), —B($Q_6$)($Q_7$), —P(=O)($Q_1$)($Q_2$), or —P($Q_2$)($Q_2$), and at least one of $R_1$, $R_2$, and $R_3$ may be a group represented by Formula 1-1.

In one or more embodiments, $R_1$, $R_2$, and $R_3$ may each independently be:

a group represented by Formula 1-1;

hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, —SF$_5$, a $C_1$-$C_{20}$ alkyl group $C_2$-$C_{20}$ alkenyl group, a $C_1$-$C_{20}$ alkoxy group, or a $C_1$-$C_{20}$ alkylthio group;

a $C_1$-$C_{20}$ alkyl group, a $C_2$-$C_{20}$ alkenyl group, a $C_1$-$C_{20}$ alkoxy group, or a $C_1$-$C_{20}$ alkylthio group, each substituted with one or more of deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, a cyclopentyl group, a cyclohexyl group, a cycloheptyl group, a cyclooctyl group, an adamantanyl group, a norbornanyl group (a bicyclo[2.2.1]heptyl group), a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a pyridinyl group, or a pyrimidinyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or azadibenzothiophenyl group, each unsubstituted or substituted with one or more of deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a C$_1$-C$_{20}$ alkyl group, a deuterated C$_1$-C$_{20}$ alkyl group, a C$_1$-C$_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a (C$_1$-C$_{20}$ alkyl)cyclopentyl group, a (C$_1$-C$_{20}$ alkyl)cyclohexyl group, a (C$_1$-C$_{20}$ alkyl)cycloheptyl group, a (C$_1$-C$_{20}$ alkyl)cyclooctyl group, a (C$_1$-C$_{20}$ alkyl)adamantanyl group, a (C$_1$-C$_{20}$ alkyl)norbornanyl group, a (C$_1$-C$_{20}$ alkyl)norbornenyl group, a (C$_1$-C$_{20}$ alkyl)cyclopentenyl group, a (C$_1$-C$_{20}$ alkyl)cyclohexenyl group, a (C$_1$-C$_{20}$ alkyl)cycloheptenyl group, a (C$_1$-C$_{20}$ alkyl)bicyclo[1.1.1]pentyl group, a (C$_1$-C$_{20}$ alkyl)bicyclo[2.1.1]hexyl group, a (C$_1$-C$_{20}$ alkyl)bicyclo[2.2.2]octyl group, a phenyl group, a (C$_1$-C$_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group; or —Si(Q$_1$)(Q$_2$)(Q$_3$), —Ge(Q$_1$)(Q$_2$)(Q$_3$), —N(Q$_4$)(Q$_5$), —B(Q$_1$)(Q$_2$), —P(=O)(Q$_1$)(Q$_2$), or —P(Q$_2$)(Q$_2$), wherein Q$_1$ to Q$_5$ may each independently be:

deuterium, —F, —CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CD$_2$H, —CD$_2$CDH$_2$, —CF$_3$, —CF$_2$H, —CFH$_2$, —CH$_2$CF$_3$, —CH$_2$CF$_2$H, —CH$_2$CFH$_2$, —CHFCH$_3$, —CHFCF$_2$H, —CHFCFH$_2$, —CHFCF$_3$, —CF$_2$CF$_3$, —CF$_2$CF$_2$H, or —CF$_2$CFH$_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, —F, C$_1$-C$_{10}$ alkyl group, or a phenyl group, and at least one of R$_1$, R$_2$, and R$_3$ may be a group represented by Formula 1-1.

In one or more embodiments, R$_1$, R$_2$, and R$_3$ may each independently be a group represented by Formula 1-1, hydrogen, deuterium, a methyl group, an ethyl group, an n-propyl group, an isopropyl group, an n-butyl group, an isobutyl group, a sec-butyl group, a tert-butyl group, an n-pentyl group, an isopentyl group, a 2-methylbutyl group, a sec-pentyl group, a tert-pentyl group, a neo-pentyl group, a 3-pentyl group, a 3-methyl-2-butyl group, a phenyl group, a biphenyl group, a C$_1$-C$_{20}$ alkylphenyl group, a naphthyl group, —Si(Q$_1$)(Q$_2$)(Q$_3$), or —Ge(Q$_1$)(Q$_2$)(Q$_3$), wherein at least one of R$_1$, R$_2$, and R$_3$ may be a group represented by Formula 1-1.

In one or more embodiments, any one of R$_1$ to R$_3$ may be a group represented by Formula 1-1.

For example, R$_2$ may be a group represented by Formula 1-1, and each of R$_1$ and R$_3$ may be hydrogen.

In Formulae 1A and 1-1, R$_{10}$, R$_{20}$, R$_{30}$, and R$_{40}$ may each independently be hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted C$_1$-C$_{60}$ alkyl group, a substituted or unsubstituted C$_2$-C$_{60}$ alkenyl group, a substituted or unsubstituted C$_2$-C$_{60}$ alkynyl group, a substituted or unsubstituted C$_1$-C$_{60}$ alkoxy group, a substituted or unsubstituted C$_3$-C$_{10}$ cycloalkyl group, a substituted or unsubstituted C$_1$-C$_{10}$ heterocycloalkyl group, a substituted or unsubstituted C$_3$-C$_{10}$ cycloalkenyl group, a substituted or unsubstituted C$_1$-C$_{10}$ heterocycloalkenyl group, a substituted or unsubstituted C$_6$-C$_{60}$ aryl group, a substituted or unsubstituted C$_6$-C$_{60}$ aryloxy group, a substituted or unsubstituted C$_6$-C$_{60}$ arylthio group, a substituted or unsubstituted C$_7$-C$_{60}$ arylalkyl group, a substituted or unsubstituted C$_1$-C$_{60}$ heteroaryl group, a substituted or unsubstituted C$_1$-C$_{60}$ heteroaryloxy group, a substituted or unsubstituted C$_1$-C$_{60}$ heteroarylthio group, a substituted or unsubstituted C$_2$-C$_{60}$ heteroarylalkyl group, a substituted or unsubstituted C$_2$-C$_{60}$ alkylheteroaryl group, a substituted or unsubstituted monovalent non-aromatic condensed polycyclic group, a substituted or unsubstituted monovalent non-aromatic condensed heteropolycyclic group, —Si(Q$_1$)(Q$_2$)(Q$_3$), —Ge(Q$_1$)(Q$_2$)(Q$_3$), —B(Q$_1$)(Q$_2$), —P(=O)(Q$_1$)(Q$_2$), or —P(Q$_2$)(Q$_2$).

In Formulae 1A and 1-1, R$_{10}$, R$_{20}$, R$_{30}$, and R$_{40}$ may each independently be:

hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, —SF$_5$, a C$_1$-C$_{20}$ alkyl group C$_2$-C$_{20}$ alkenyl group, a C$_1$-C$_{20}$ alkoxy group, or a C$_1$-C$_{20}$ alkylthio group;

a C$_1$-C$_{20}$ alkyl group, a C$_2$-C$_{20}$ alkenyl group, a C$_1$-C$_{20}$ alkoxy group, or a C$_1$-C$_{20}$ alkylthio group, each substituted with one or more of deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a C$_1$-C$_{10}$ alkyl group, a cyclopentyl group, a cyclohexyl group, a cycloheptyl group, a cyclooctyl group, an adamantanyl group, a norbornanyl group (a bicyclo[2.2.1]heptyl group), a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2] octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a pyridinyl group, or a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or azadibenzothiophenyl group, each unsubstituted or substituted with one or more of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a deuterated $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group; or —Si($Q_1$)($Q_2$)($Q_3$), —Ge($Q_1$)($Q_2$)($Q_3$), or —B($Q_1$)($Q_2$), wherein $Q_1$ to $Q_5$ may each independently be:

deuterium, —F, —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, —$CD_2CDH_2$, —$CF_3$, —$CF_2H$, —$CFH_2$, —$CH_2CF_3$, —$CH_2CF_2H$, —$CH_2CFH_2$, —$CHFCH_3$, —$CHFCF_2H$, —$CHFCFH_2$, —$CHFCF_3$, —$CF_2CF_3$, —$CF_2CF_2H$, or —$CF_2CFH_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, —F, $C_1$-$C_{10}$ alkyl group, or a phenyl group.

In Formula 1A, b10 indicates the number of $R_{10}$(s), and may be an integer from 1 to 10. In Formula 1A, b20 indicates the number of $R_{20}$(s), and may be an integer from 1 to 10.

In Formula 1-1, b30 indicates the number of $R_{30}$(s), and may be an integer from 1 to 10. In Formula 1-1, b40 indicates the number of $R_{40}$(s), and may be an integer from 1 to 10.

In one or more embodiments, $R_{10}$, $R_{20}$, $R_{30}$, and $R_{40}$ may each independently be a group represented by one of Formulae 9-1 to 9-43, 9-201 to 9-237, 10-1 to 10-129, or 10-201 to 10-350:

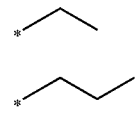

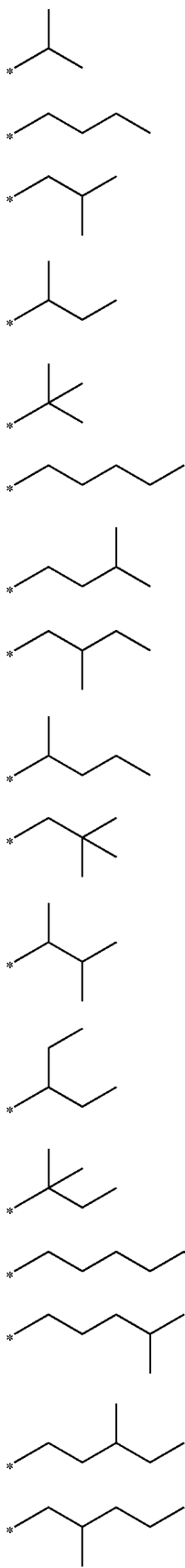
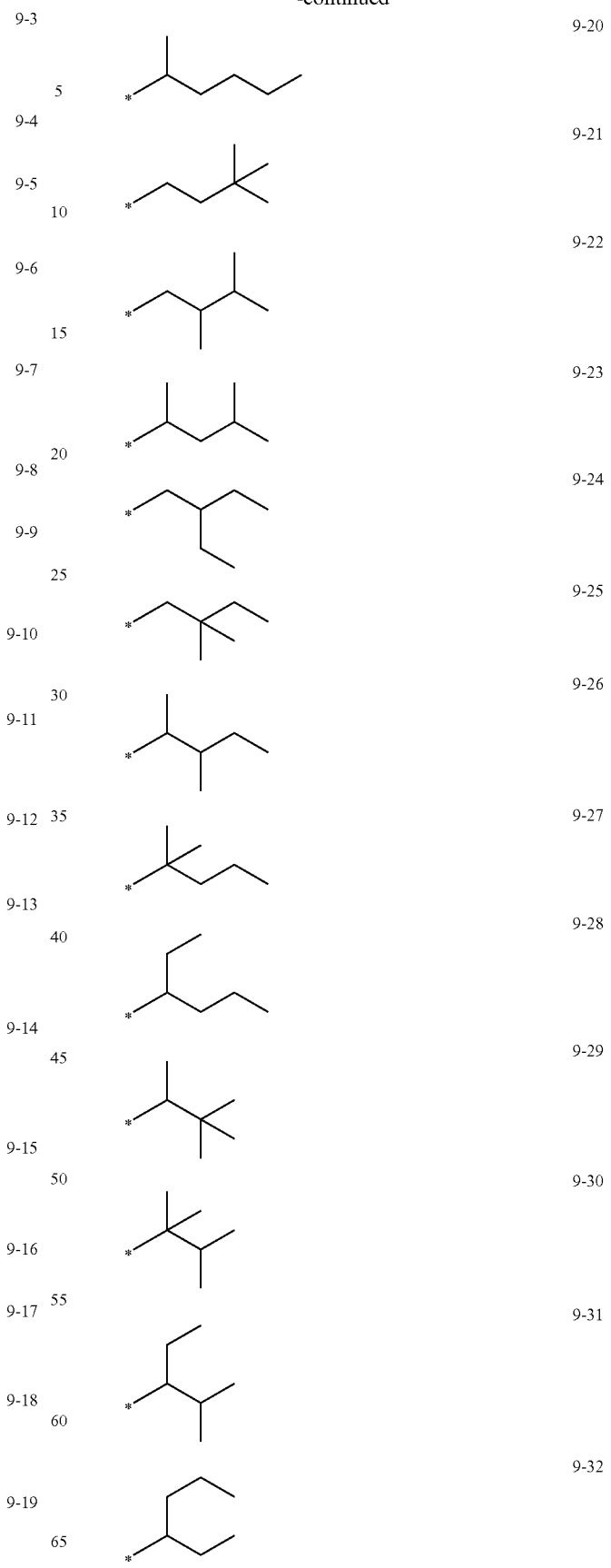

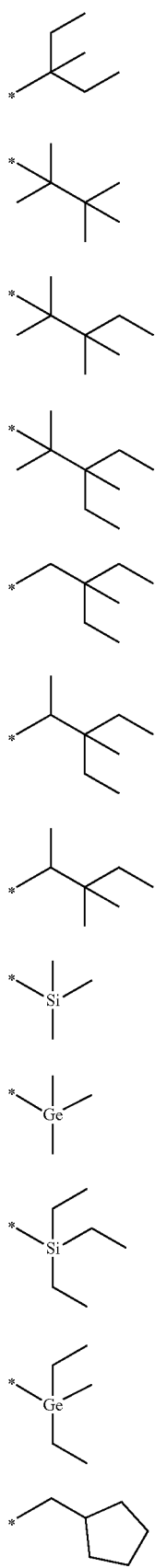
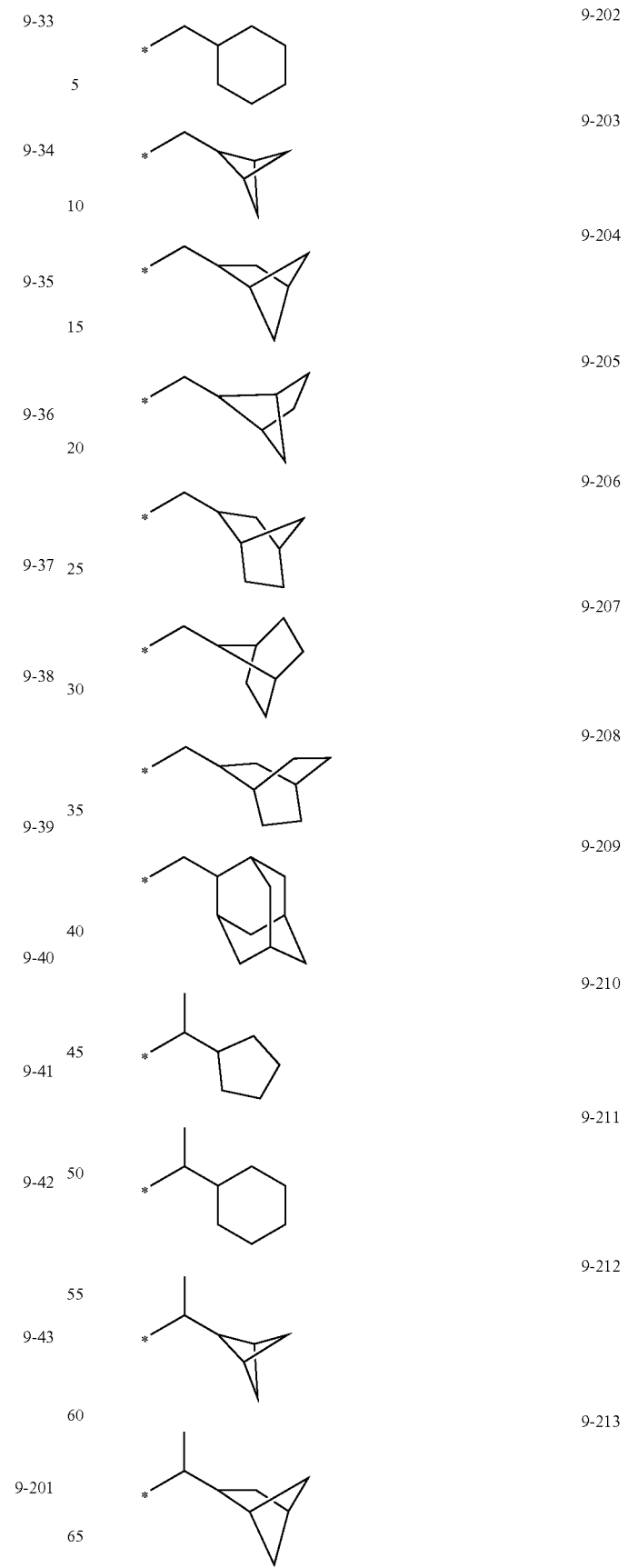

-continued
| | |
|---|---|
| 9-214 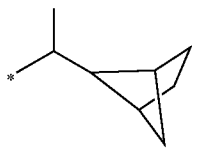 | 9-224 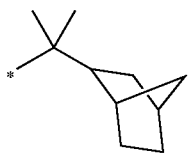 |
| 9-215 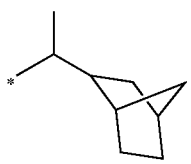 | 9-225 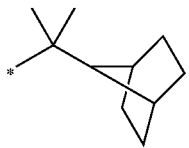 |
| 9-216 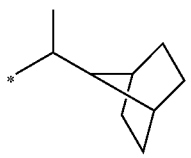 | 9-226  |
| 9-217 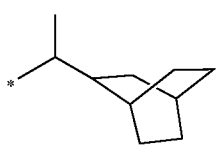 | 9-227 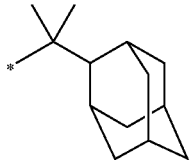 |
| 9-218 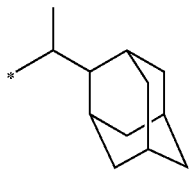 | 9-228 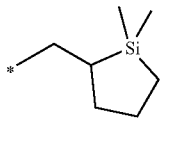 |
| 9-219 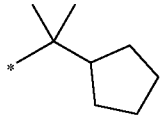 | 9-229 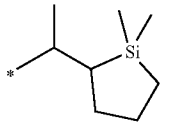 |
| 9-220 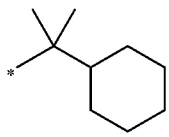 | 9-230 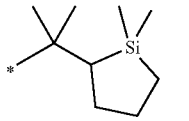 |
| 9-221 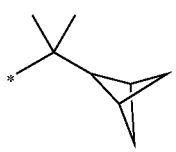 | 9-231 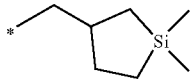 |
| 9-222 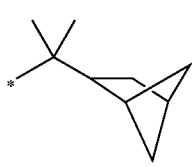 | 9-232 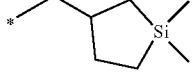 |
| 9-223 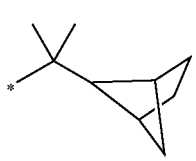 | 9-233 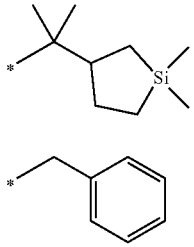 |
| | 9-234 |

| | |
|---|---|
| 9-235 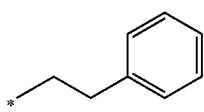 | 10-10 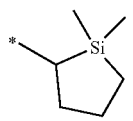 |
| 9-236 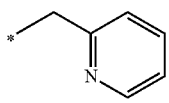 | 10-11 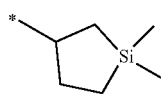 |
| 9-237 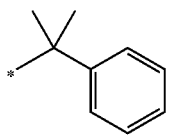 | |
| 10-1 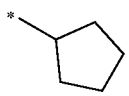 | 10-12 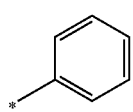 |
| 10-2 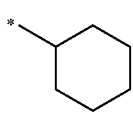 | 10-13 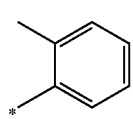 |
| 10-3 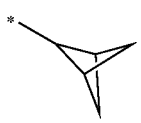 | 10-14 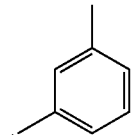 |
| 10-4 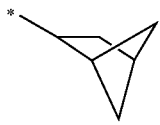 | 10-15 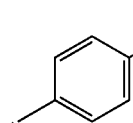 |
| 10-5 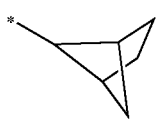 | 10-16 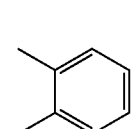 |
| 10-6 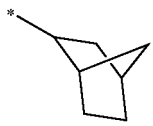 | 10-17 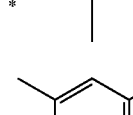 |
| 10-7 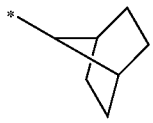 | 10-18 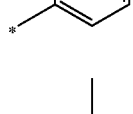 |
| 10-8 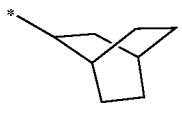 | 10-19 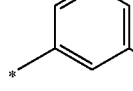 |
| 10-9 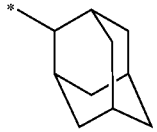 | 10-20 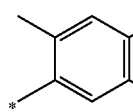 |

| | |
|---|---|
| 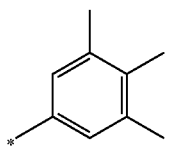 | 10-21 |
| 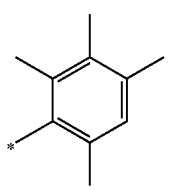 | 10-22 |
| 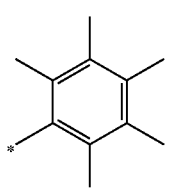 | 10-23 |
| 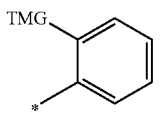 | 10-24 |
| 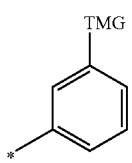 | 10-25 |
| 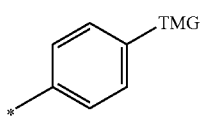 | 10-26 |
| 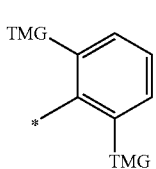 | 10-27 |
| 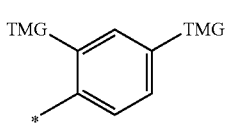 | 10-28 |
| 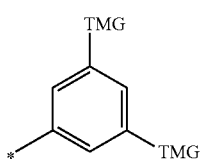 | 10-29 |
| 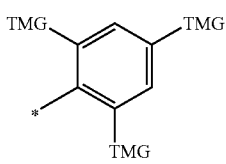 | 10-30 |
| 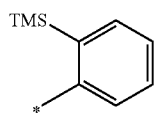 | 10-31 |
| 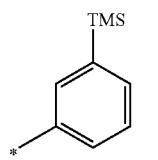 | 10-32 |
| 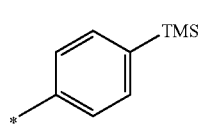 | 10-33 |
| 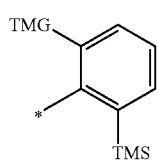 | 10-34 |
| 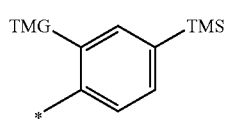 | 10-35 |
| 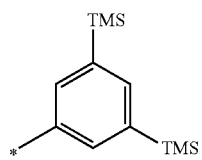 | 10-36 |
| 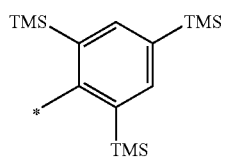 | 10-37 |
| 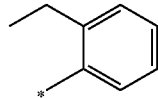 | 10-38 |
| 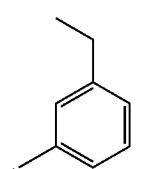 | 10-39 |
| 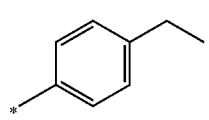 | 10-40 |

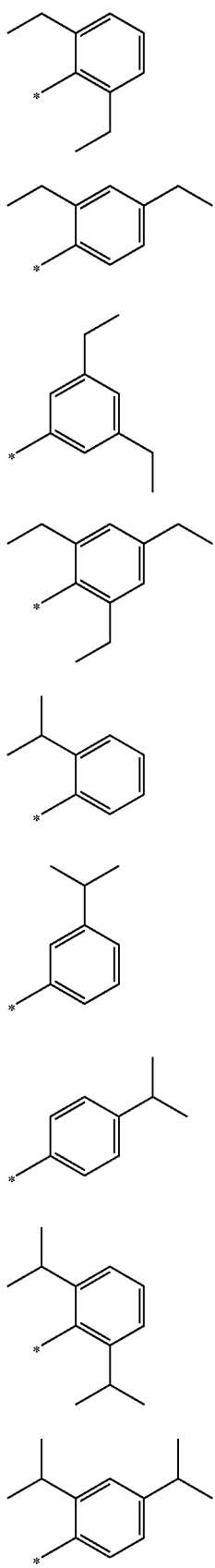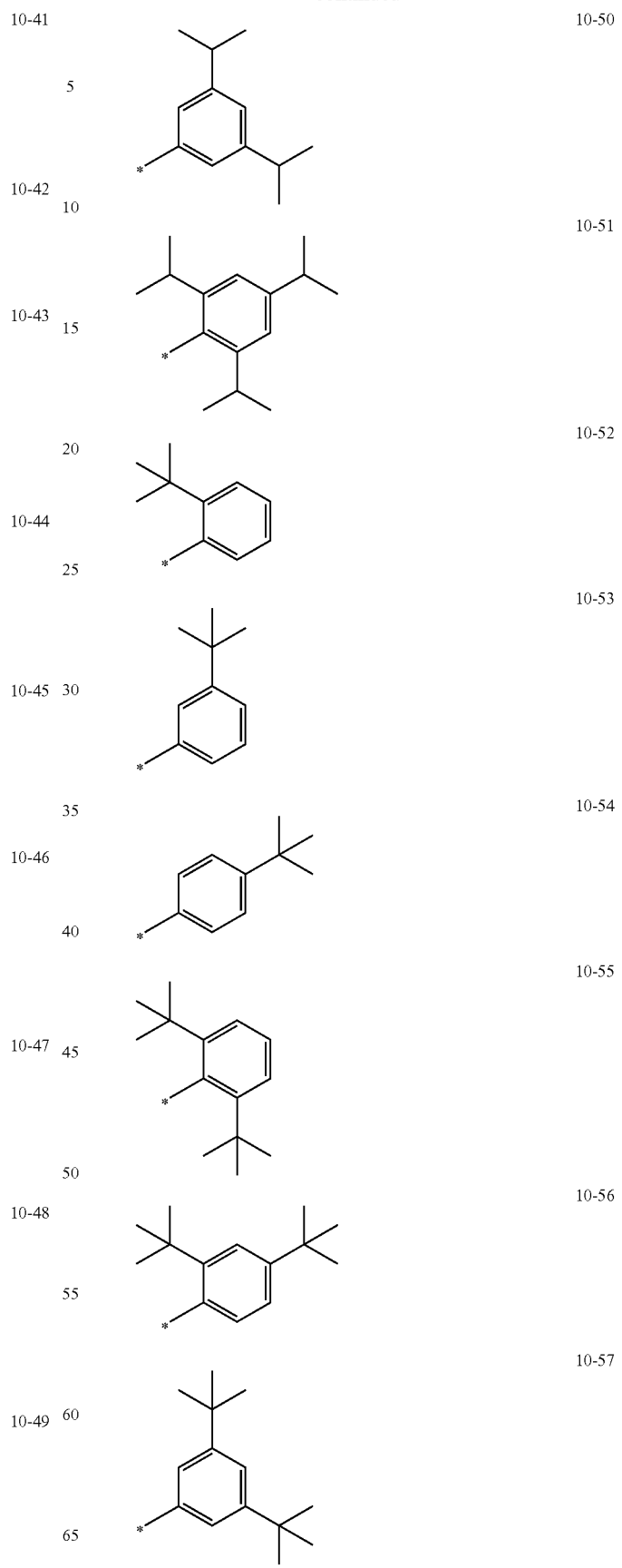

-continued
10-58
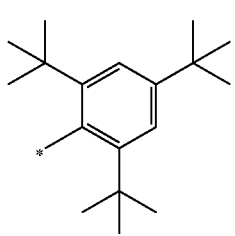
10-59
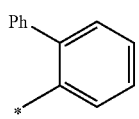
10-60
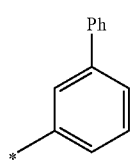
10-61
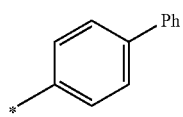
10-62
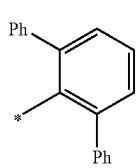
10-63
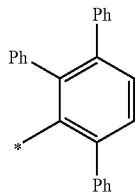
10-64
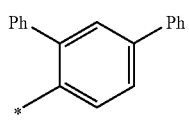
10-65
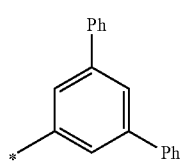
10-66
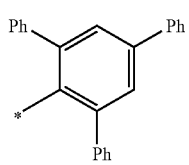
10-67
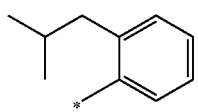
-continued
10-68
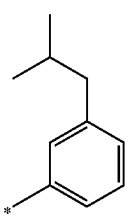
10-69
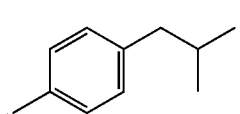
10-70
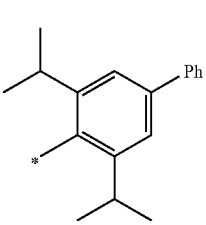
10-71
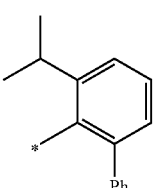
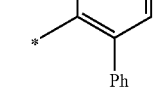
10-72
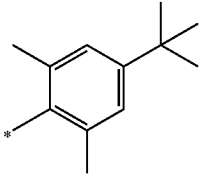
10-73
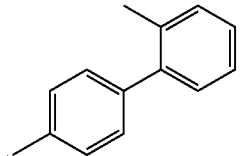
10-74
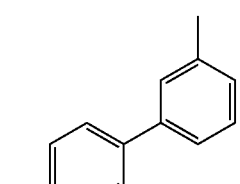
10-75
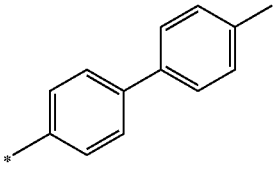

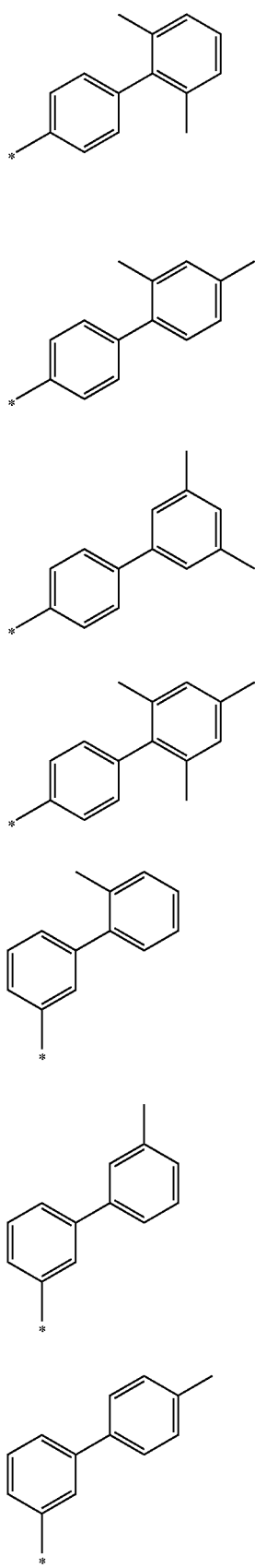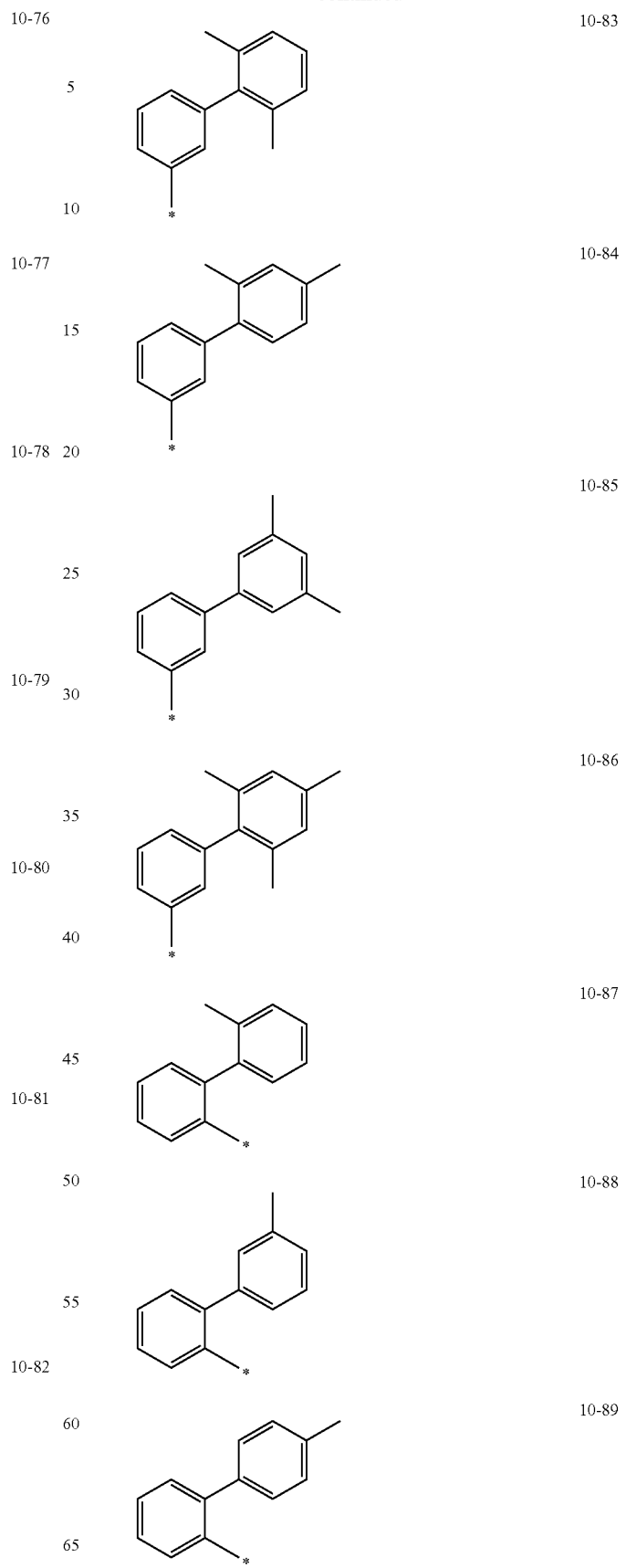

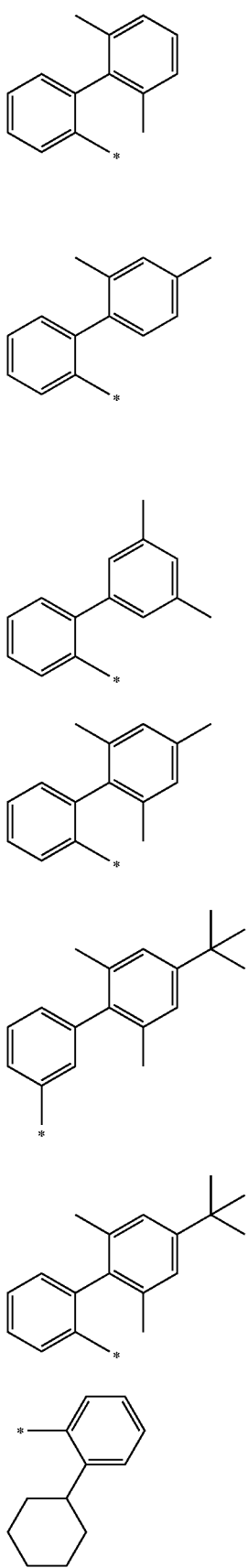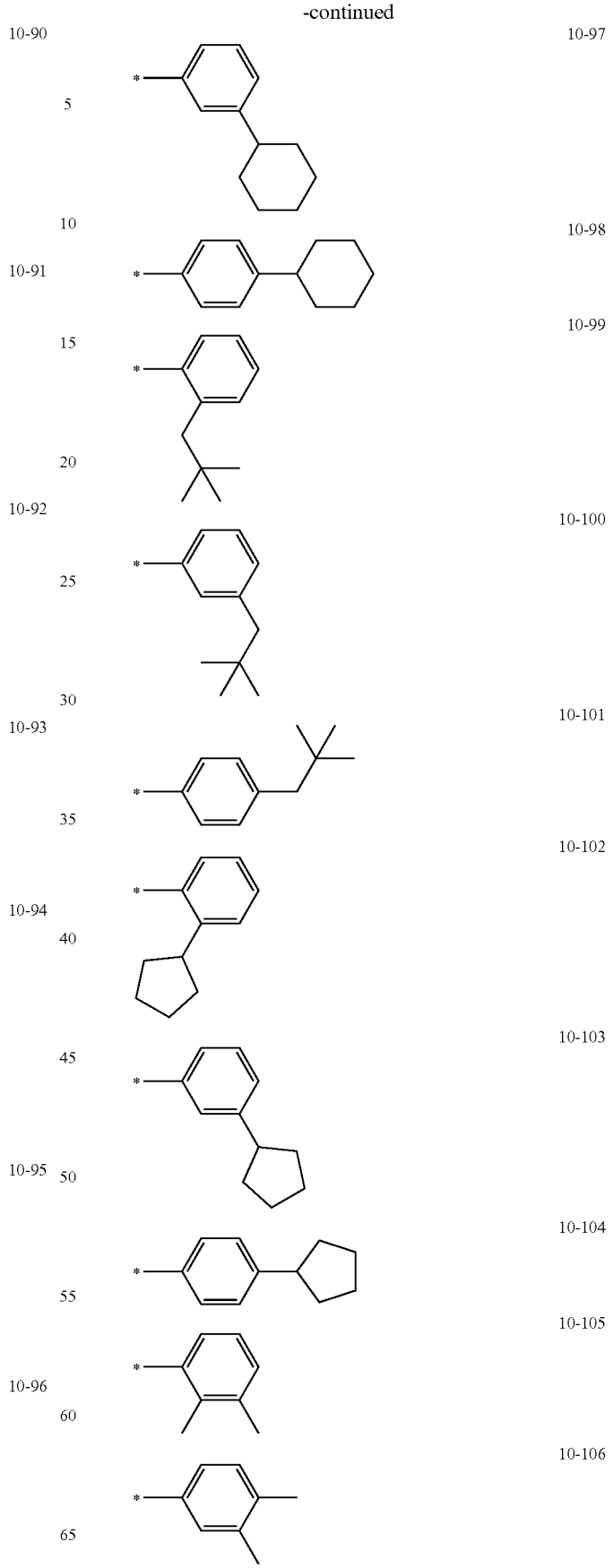

-continued
10-107 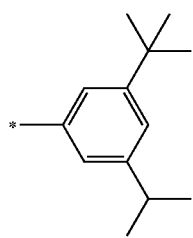
10-108 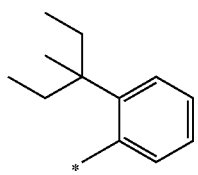
10-109 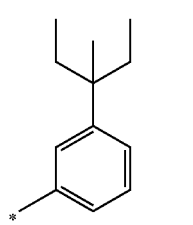
10-110 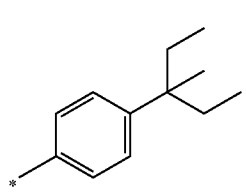
10-111 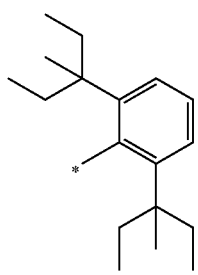
10-112 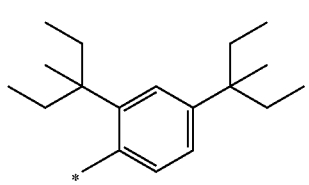
10-113 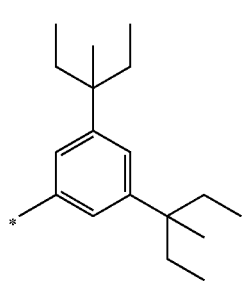
-continued
10-114 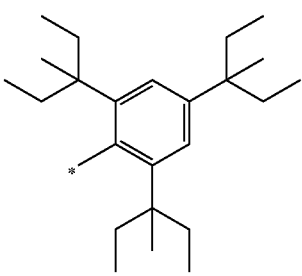
10-115 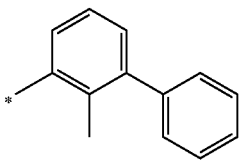
10-116 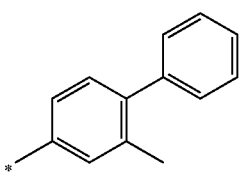
10-117 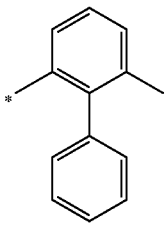
10-118 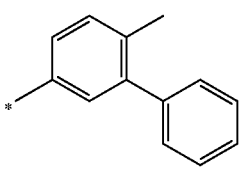
10-119 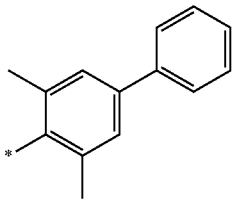
10-120 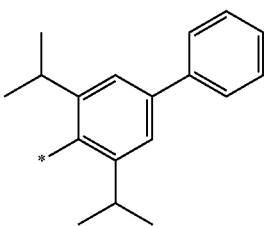

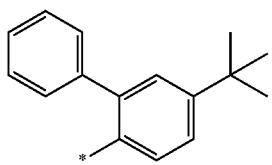
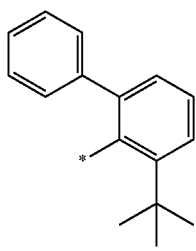
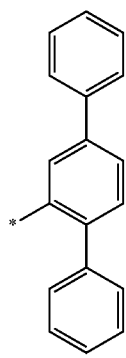
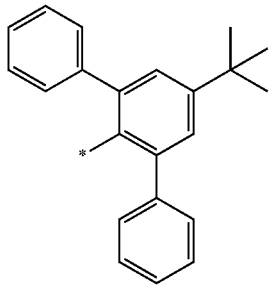
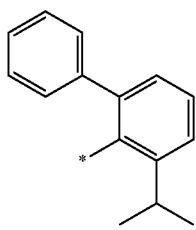
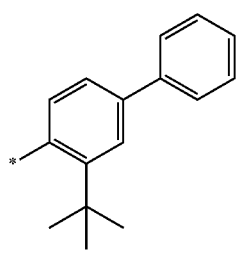
10-121
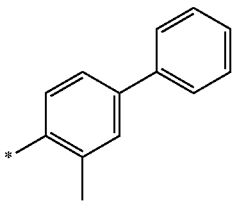
10-122
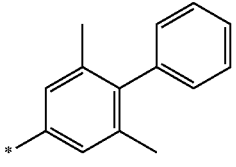
10-123
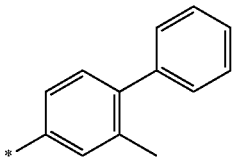
10-124
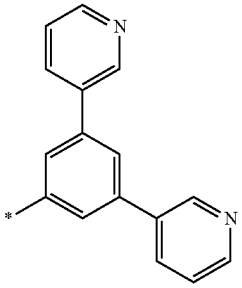
10-125
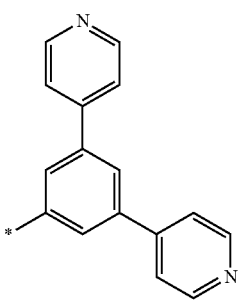
10-126
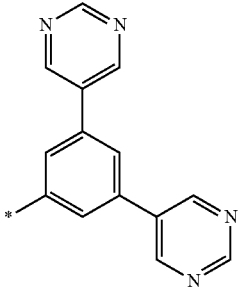
10-127
10-128
10-129
10-201
10-202
10-203

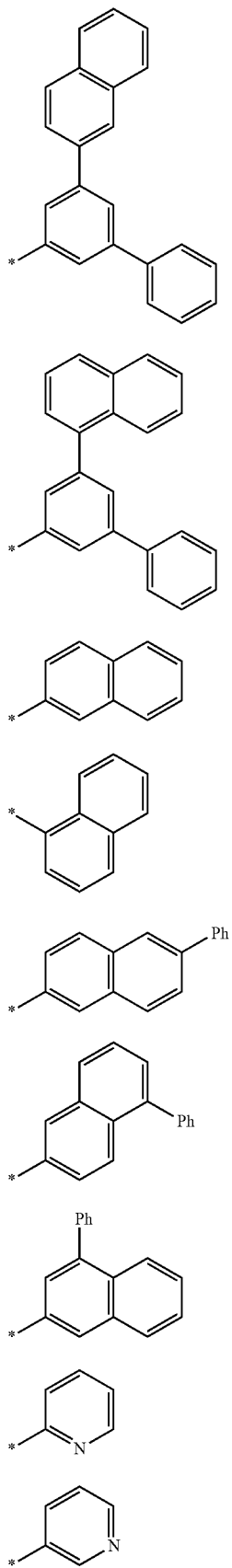

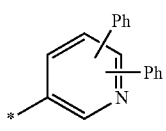
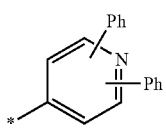
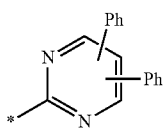
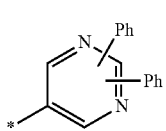
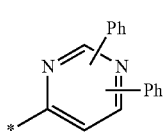
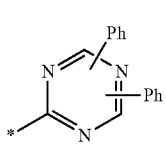
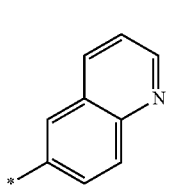
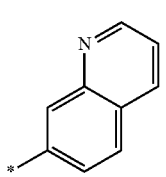
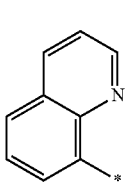
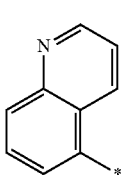
10-226
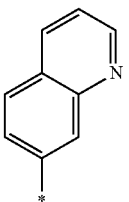
10-227
10-228
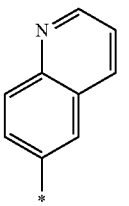
10-229
10-230
10-231
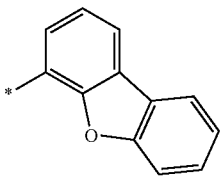
10-232
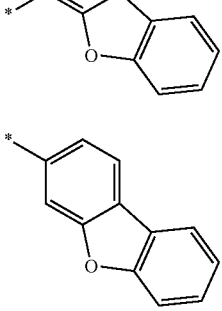
10-233
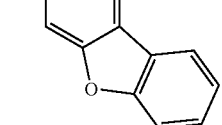
10-234
10-235
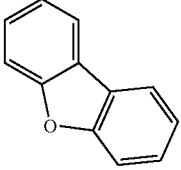
10-236
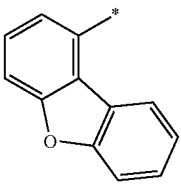
10-237
10-238
10-239
10-240
10-241
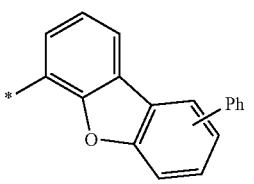
10-242
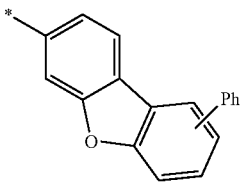
10-243

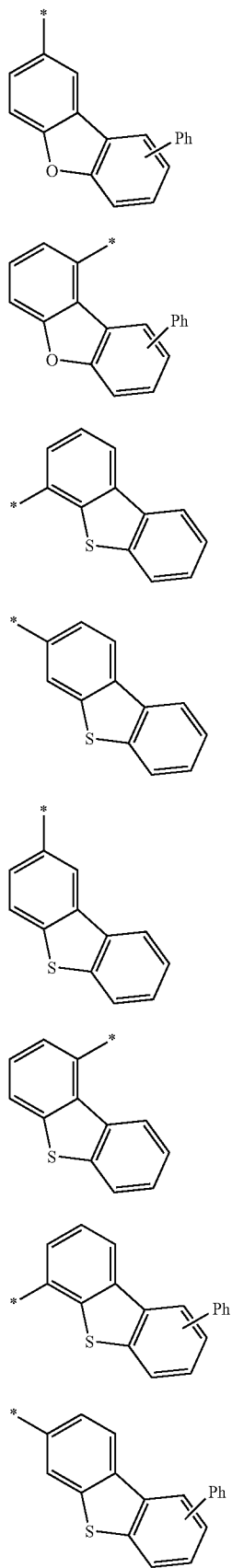
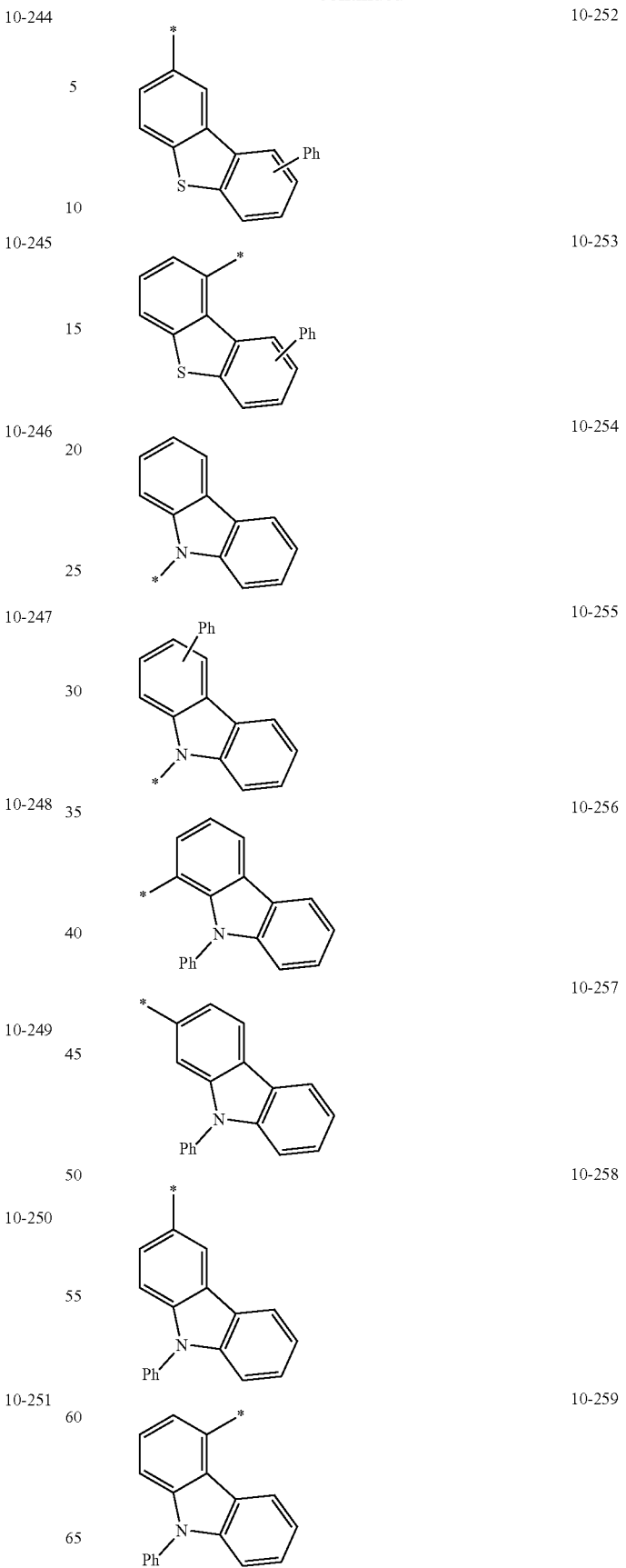

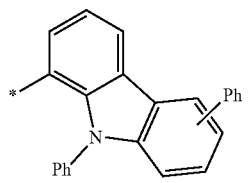
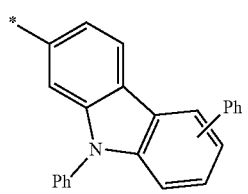
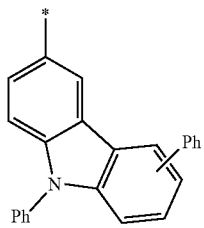
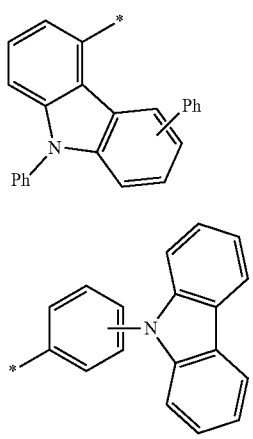
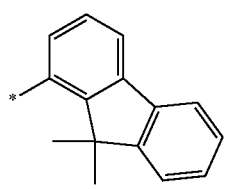
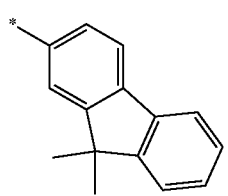
10-260
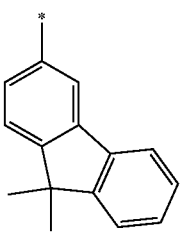
10-261
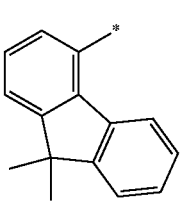
10-262
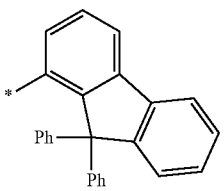
10-263
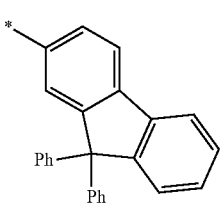
10-264
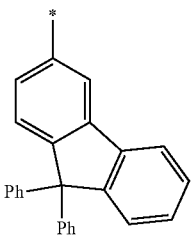
10-265
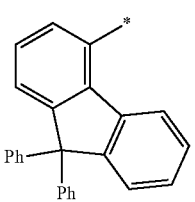
10-266
10-267
10-268
10-269
10-270
10-271
10-272
10-273
10-274
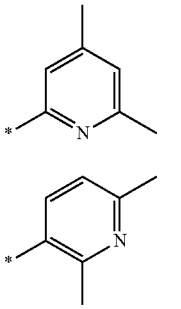

| | | | |
|---|---|---|---|
| | 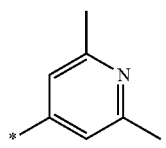 | 10-275 | 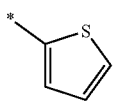 10-285 |
| | 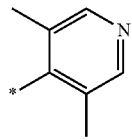 | 10-276 | 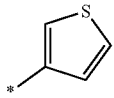 10-286 |
| | 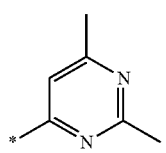 | 10-277 | 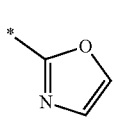 10-287 |
| | 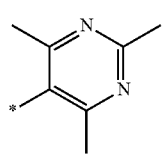 | | 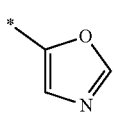 10-288 |
| | 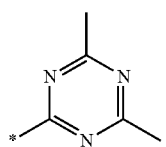 | 10-278 | 10-289 |
| | | 10-279 | 10-290 |
| | 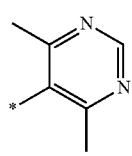 | | 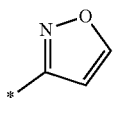 10-291 |
| | 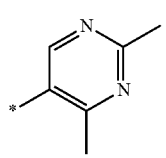 | 10-280 | 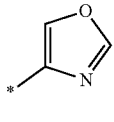 10-292 |
| | | 10-281 | 10-293 |
| | 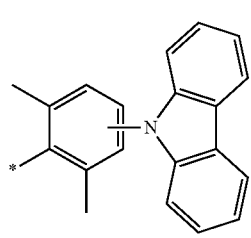 | | 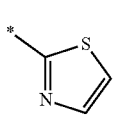 10-294 |
| | | 10-282 | 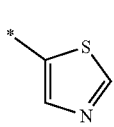 10-295 |
| | 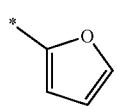 | | 10-296 |
| | 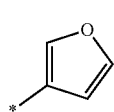 | 10-283 | 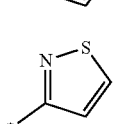 10-297 |
| | | 10-284 | 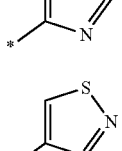 10-298 |

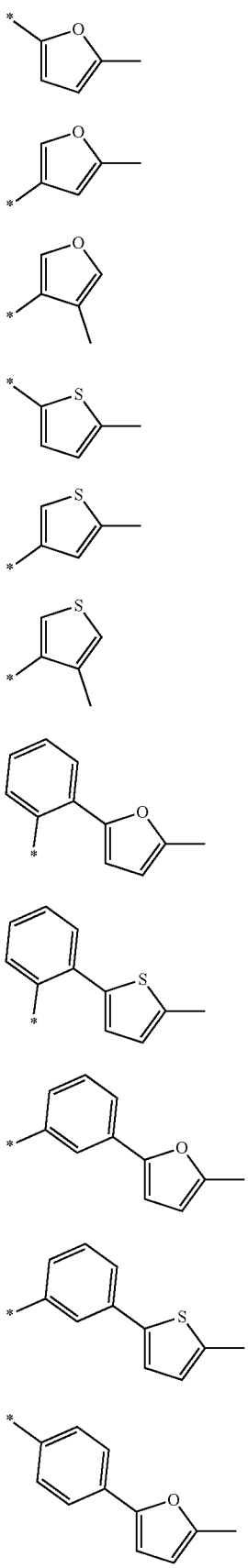
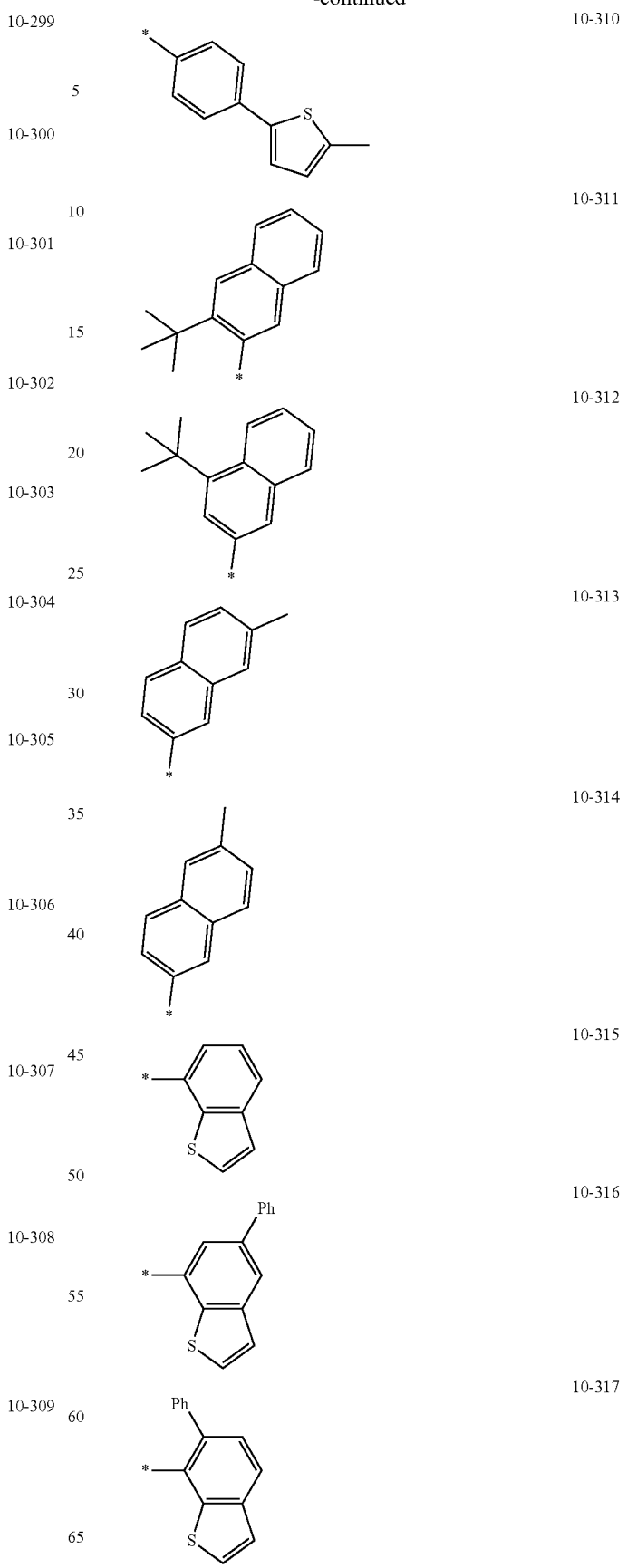

| | |
|---|---|
| 10-318 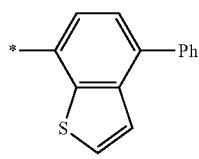 | 10-326 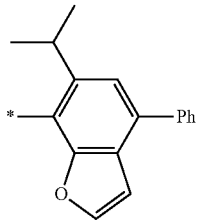 |
| 10-319 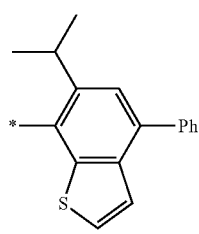 | 10-327 |
| 10-320 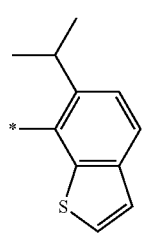 | 10-328 |
| 10-321 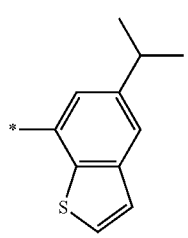 | 10-329 |
| 10-322 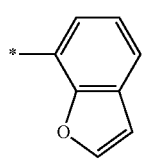 | 10-330 |
| 10-323 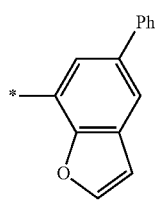 | 10-331 |
| 10-324 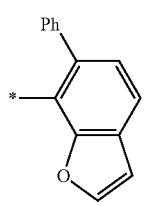 | 10-332 |
| 10-325 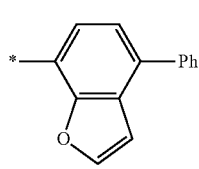 | |

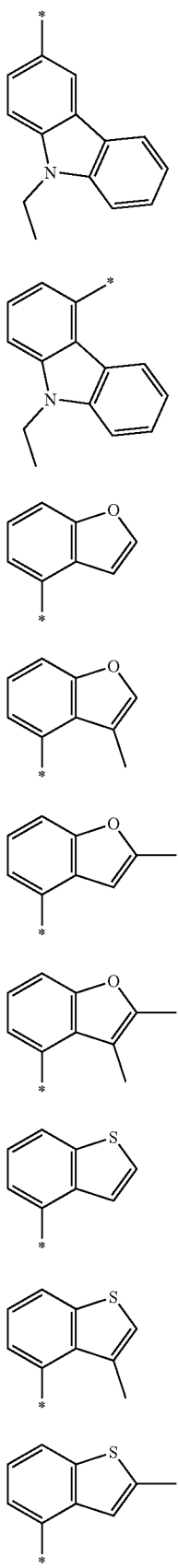
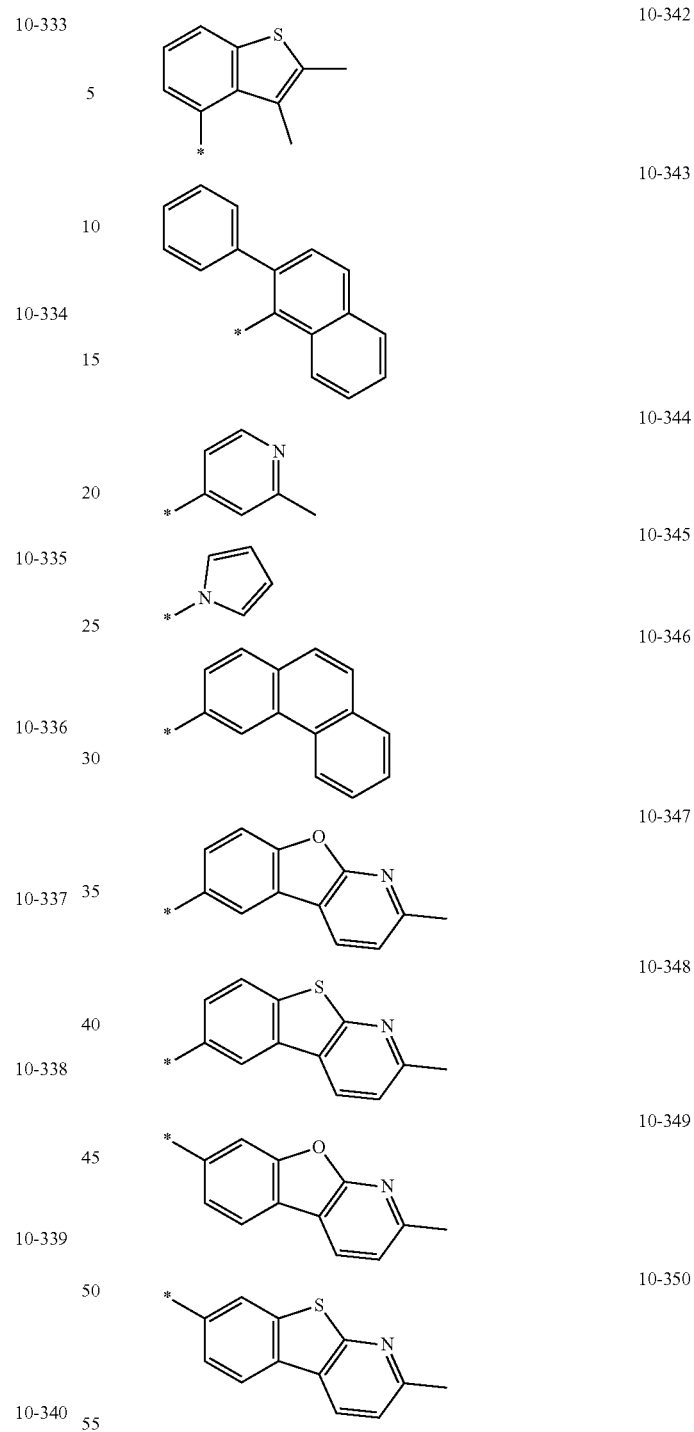

wherein, in Formulae 9-1 to 9-43, 9-201 to 9-237, 10-1 to 10-129, and 10-201 to 10-350, * indicates a binding site to a neighboring atom, Ph is phenyl group, TMS is a trimethylsilyl group, and TMG is a trimethylgermyl group.

In Formula 1A, when $A_1$ is a benzene group, (i) at least one of $R_{20}$(s) in the number of b20 may be a substituted or unsubstituted $C_1$-$C_{60}$ alkyl group, —Si($Q_1$)($Q_2$)($Q_3$), or —Ge($Q_1$)($Q_2$)($Q_3$), or (ii) $R_1$ or $R_2$ may be a group represented by Formula 1-1.

In Formula 1-1, * indicates a binding site to a neighboring atom in Formula 1.

In one or more embodiments, $R_{20}$ may be hydrogen, deuterium, a methyl group, an ethyl group, an n-propyl group, an isopropyl group, an n-butyl group, an isobutyl group, a sec-butyl group, a tert-butyl group, an n-pentyl group, an isopentyl group, a 2-methylbutyl group, a sec-pentyl group, a tert-pentyl group, a neo-pentyl group, a 3-pentyl group, a 3-methyl-2-butyl group, a phenyl group, a biphenyl group, a $C_1$-$C_{20}$ alkylphenyl group, a naphthyl group, —Si($Q_1$)($Q_2$)($Q_3$), or —Ge($Q_1$)($Q_2$)($Q_3$).

In Formula 1A, * and *' each indicate a binding site to a neighboring atom.

In Formulae 1A and 1-1, at least two neighboring groups among $R_{10}$, $R_{20}$, $R_{30}$, and $R_{40}$ may optionally be linked together form a substituted or unsubstituted $C_5$-$C_{30}$ carbocyclic group or a substituted or unsubstituted $C_1$-$C_{30}$ heterocyclic group.

In one or more embodiments, at least two neighboring groups among $R_{10}$, $R_{20}$, $R_{30}$, and $R_{40}$ may optionally be linked together via a single bond, a double bond, or a first linking group, to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$ (for example, a fluorene group, a xanthene group, an acridine group, or the like, each unsubstituted or substituted with at least one $R_{10a}$), wherein $R_{10a}$ may be the same as described in connection with $R_{10}$.

The first linking group may be *—N($R_8$)—*', *—B($R_8$)—*', *—P($R_8$)—*', *—C($R_8$)($R_9$)—*, *—Si($R_8$)($R_9$)—*', *—Ge($R_8$)($R_9$)—*', *—S—*', *—Se—*', *—O—*', *—C(=O)—*' *—S(=O)—*', *—S(=O)$_2$—*', *—C($R_8$)=*', *=C($R_8$)—*', *—C($R_8$)=C($R_9$)—*', *—C(=S)—*', or *—C≡C*', wherein $R_8$ and $R_9$ may each be the same as described in connection with $R_{10}$, and * and *' each indicate a binding site to a neighboring atom.

In one or more embodiments, $Ln_1$ may be represented by one of Formulae 8-1 to 8-12, or in one or more embodiments, $Ln_2$ may be represented by Formula 5:

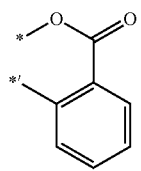

8-1

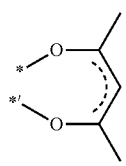

8-2

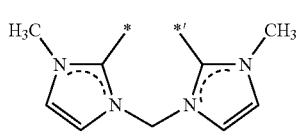

8-3

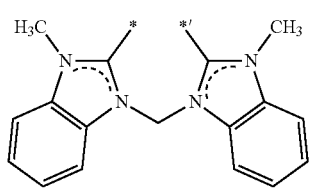

8-4

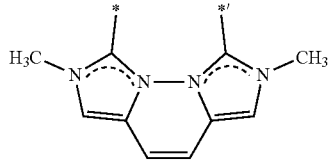

8-5

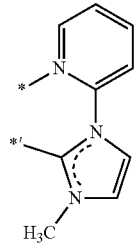

8-6

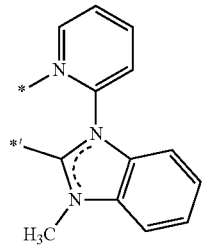

8-7

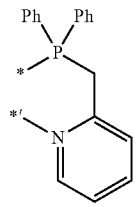

8-8

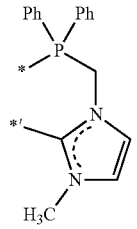

8-9

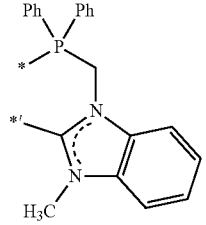

8-10

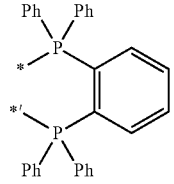

8-11

-continued

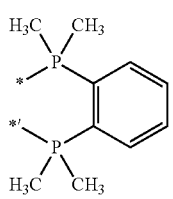

8-12

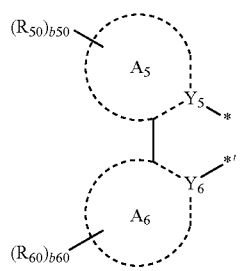

Formula 5 wherein, in Formula 5,
$A_5$ and $A_6$ may each independently be a $C_5$-$C_{30}$ carbocyclic group or a $C_1$-$C_{30}$ heterocyclic group,
$Y_5$ may be C or N, and $Y_6$ may be C or N,
$R_{50}$ and $R_{60}$ may each independently be hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted $C_2$-$C_{60}$ alkylheteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —Ge($Q_1$)($Q_2$)($Q_3$), —B($Q_1$)($Q_2$), —P(=O)($Q_1$)($Q_2$), or —P($Q_2$)($Q_2$),
b50 and b60 may each independently be an integer from 1 to 10, and
* and *' each indicate a binding site to a neighboring atom.

In one or more embodiments, $A_5$ may be a pyridine group, a pyrimidine group, a pyridazine group, a triazine group, a quinoline group, an isoquinoline group, a quinoxaline group, a quinazoline group, a phenanthroline group, a pyrazole group, a triazole group, an imidazole group, an indole group, a benzopyrazole group, or a benzimidazole group.

In one or more embodiments, $A_6$ may be a benzene group, a naphthalene group, a 1,2,3,4-tetrahydronaphthalene group, a benzothiophene group, a benzofuran group, an indole group, an indene group, a benzosilole group, a dibenzothiophene group, a dibenzofuran group, a carbazole group, a fluorene group, or a dibenzosilole group.

In one or more embodiments, $Y_5$ may be N, and $Y_6$ may be C,
a bond between $M_1$ and $Y_5$ may be a coordinate bond, and
a bond between $M_1$ and $Y_6$ may be a covalent bond.

In one or more embodiments, $R_{50}$ and $R_{60}$ may each independently be the same as described in connection with $R_{10}$, $R_{20}$, $R_{30}$, or $R_{40}$.

In one or more embodiments, $Ln_1$ may be one of Formulae 5-1 to 5-116:

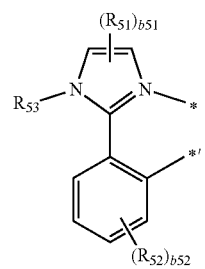

5-1

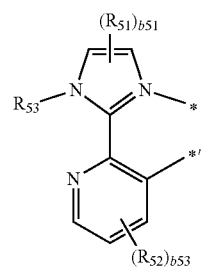

5-2

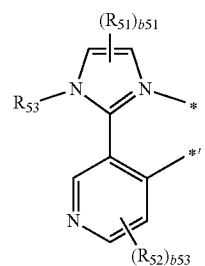

5-3

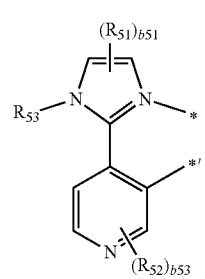

5-4

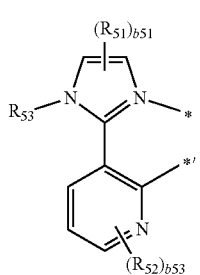 5-5 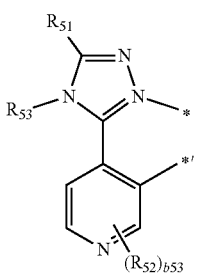 5-11
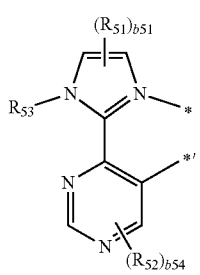 5-6 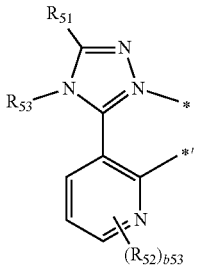 5-12
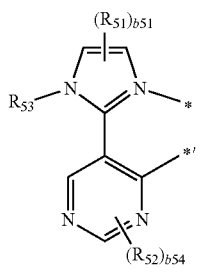 5-7 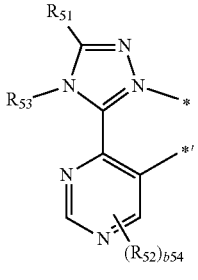 5-13
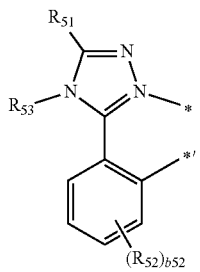 5-8 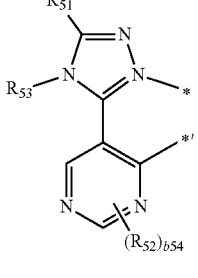 5-14
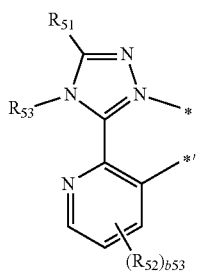 5-9 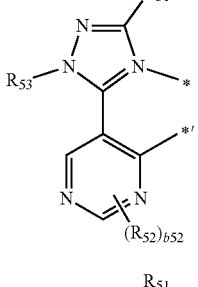 5-15
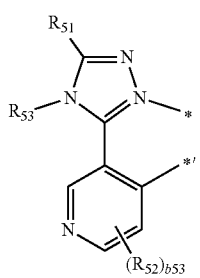 5-10 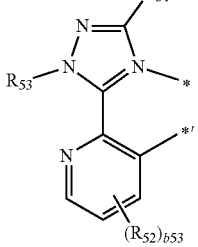 5-16

5-17 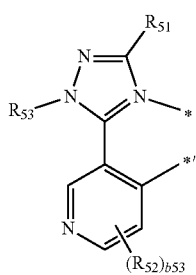
5-18 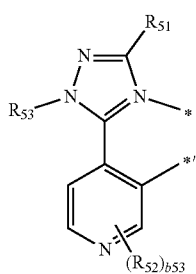
5-19 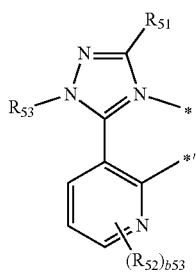
5-20 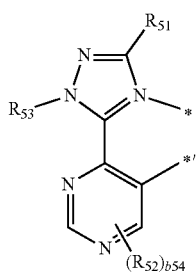
5-21 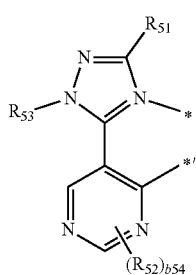
5-22 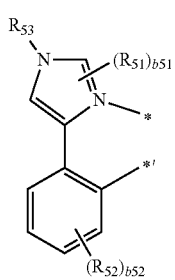
5-23 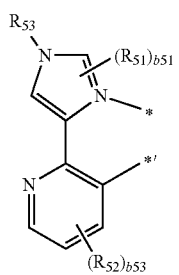
5-54 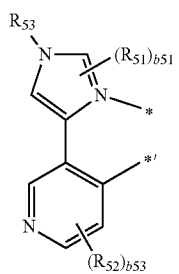
5-25 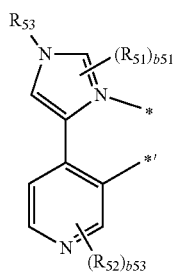
5-26 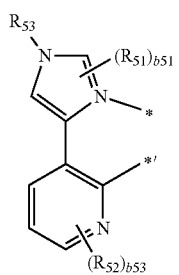
5-27 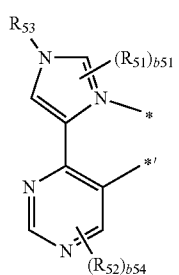
5-28 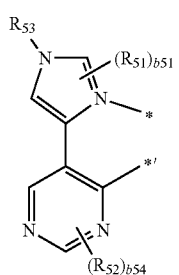

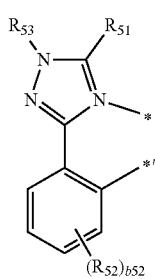
5-29
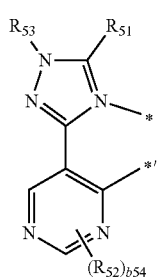
5-35
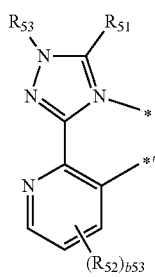
5-30
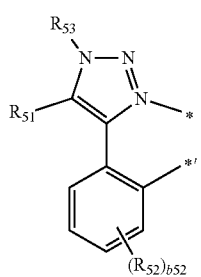
5-36
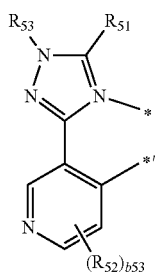
5-31
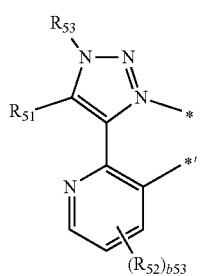
5-37
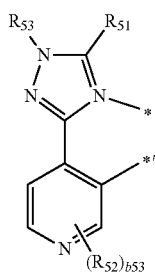
5-32
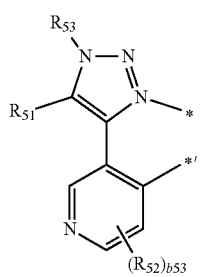
5-38
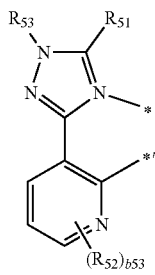
5-33
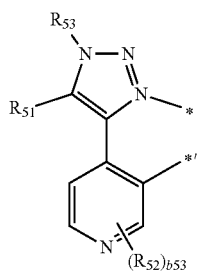
5-39
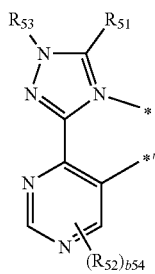
5-34
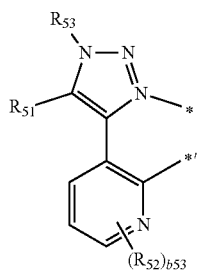
5-40

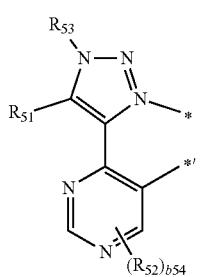
5-41
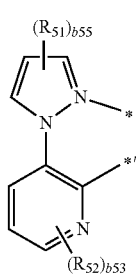
5-47
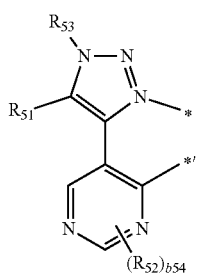
5-42
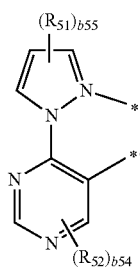
5-48
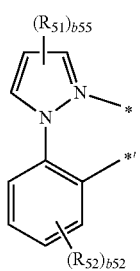
5-43
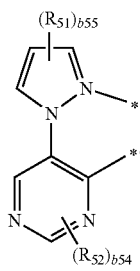
5-49
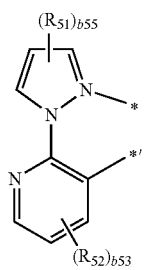
5-44
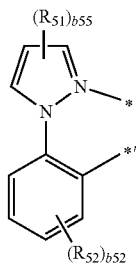
5-50
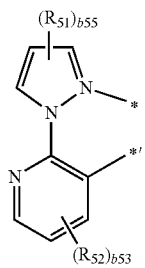
5-45
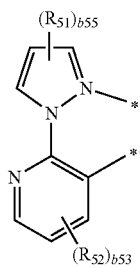
5-51
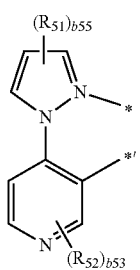
5-46
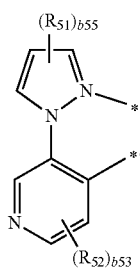
5-52

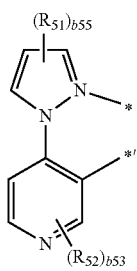
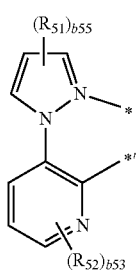
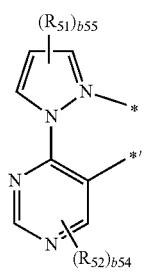
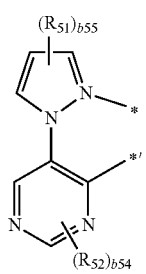
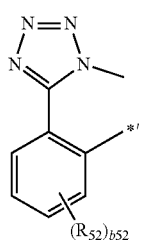
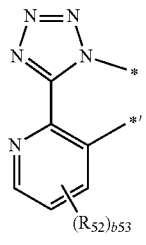
5-53
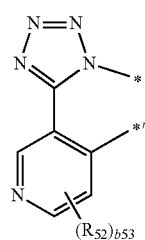
5-54
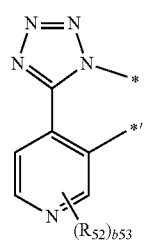
5-55
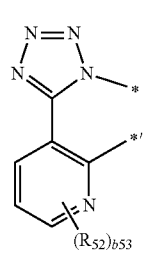
5-56
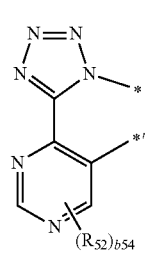
5-57
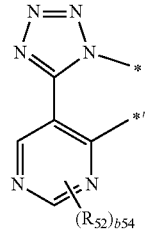
5-58
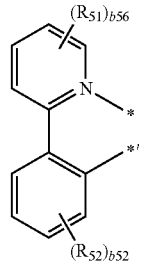

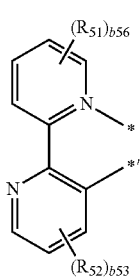 5-65
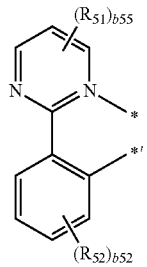 5-71
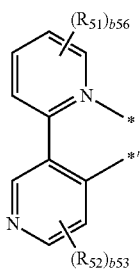 5-66
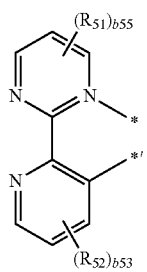 5-72
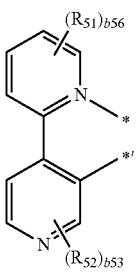 5-67
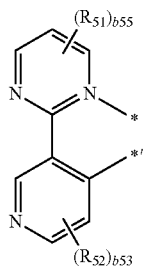 5-73
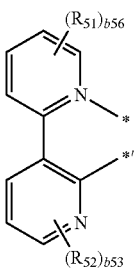 5-68
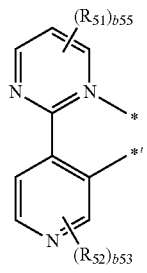 5-74
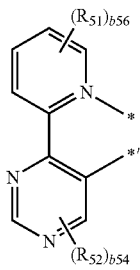 5-69
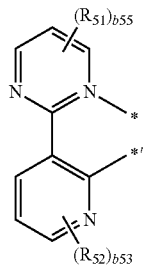 5-75
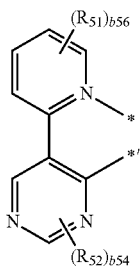 5-70
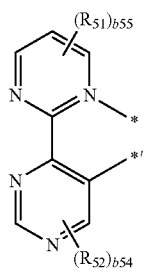 5-76

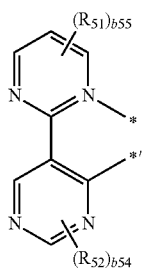 5-77
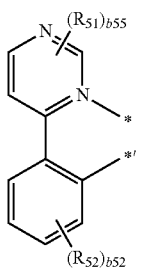 5-78
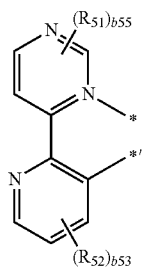 5-79
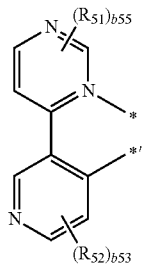 5-80
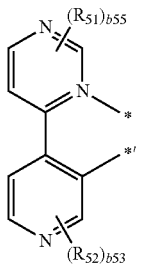 5-81
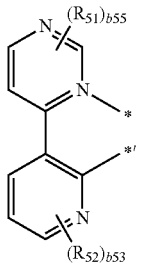 5-82
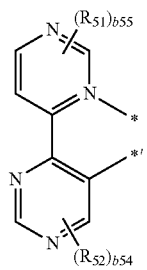 5-83
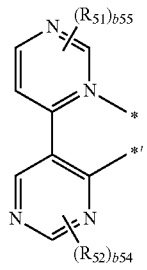 5-84
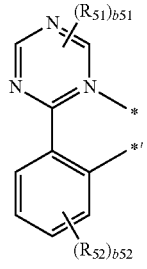 5-85
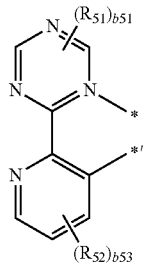 5-86
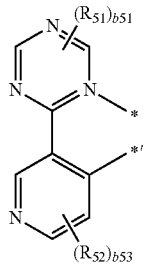 5-87
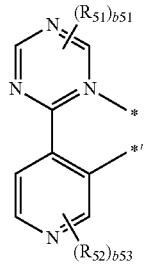 5-88

-continued
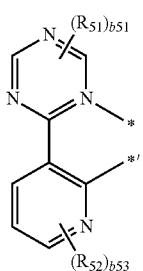
5-89
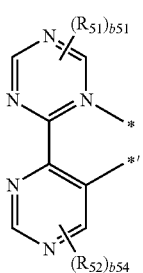
5-90
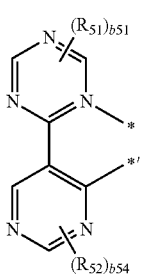
5-91
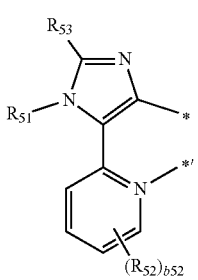
5-92
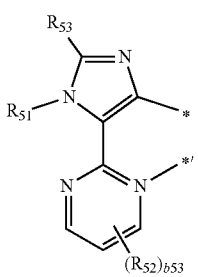
5-93
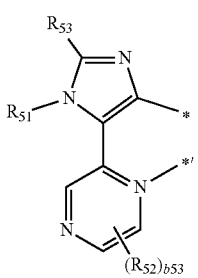
5-94
-continued
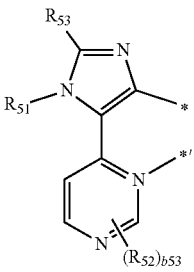
5-95
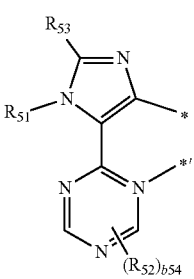
5-96
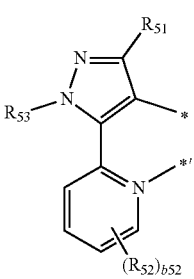
5-97
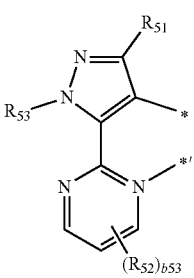
5-98
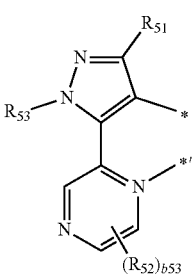
5-99
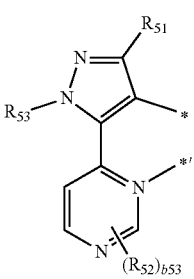
5-100

5-101 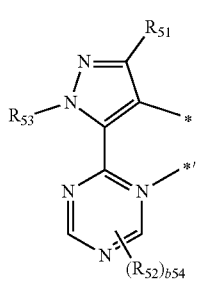
5-102 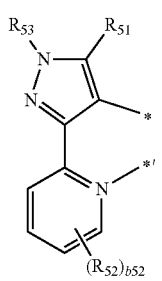
5-103 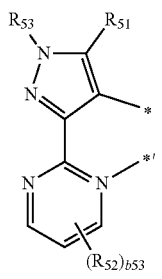
5-104 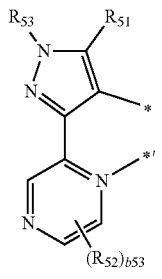
5-105 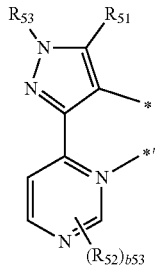
5-106 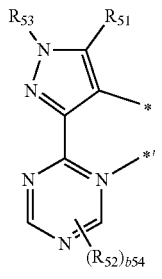
5-107 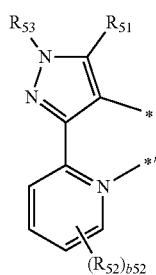
5-108 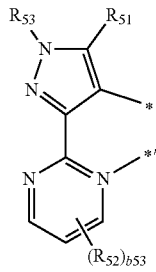
5-109 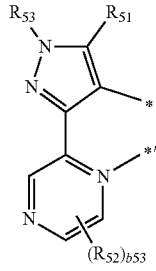
5-110 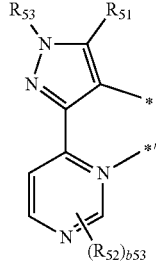
5-111 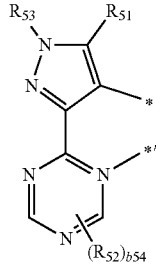
5-112 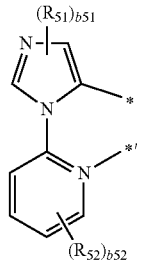

-continued

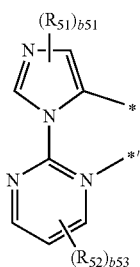

5-113

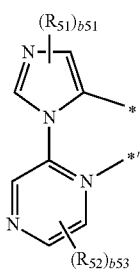

5-114

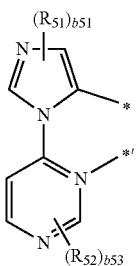

5-115

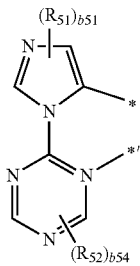

5-116 wherein, in Formulae 5-1 to 5-116, $R_{51}$ to $R_{53}$ may each independently be hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —SF$_5$, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with one or more of deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, a bicyclo[2.2.1]heptanyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{20}$ alkylphenyl group, a naphthyl group, a pyridinyl group, or a pyrimidinyl group;

a cyclopentyl group, a cyclohexyl group, a cycloheptyl group, a cyclooctyl group, a bicyclo[2.2.1]heptanyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, or an imidazopyrimidinyl group;

a cyclopentyl group, a cyclohexyl group, a cycloheptyl group, a cyclooctyl group, a bicyclo[2.2.1]heptanyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, or an imidazopyrimidinyl group, each substituted with one or more of deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, a bicyclo[2.2.1]heptanyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group, —Si($Q_{11}$)($Q_{12}$)($Q_{13}$), —B($Q_{11}$)($Q_{12}$), or —N($Q_{11}$)($Q_{12}$); or
—Si($Q_1$)($Q_2$)($Q_3$), —B($Q_1$)($Q_2$), or —N($Q_1$)($Q_2$), wherein $Q_1$ to $Q_3$ and $Q_{11}$ to $Q_{13}$ may each independently be:
  a methyl group, an ethyl group, an n-propyl group, an isopropyl group, an n-butyl group, an isobutyl group, a sec-butyl group, a tert-butyl group, an n-pentyl group, an isopentyl group, a 2-methylbutyl group, a sec-pentyl group, a tert-pentyl group, a neo-pentyl group, a 3-pentyl group, a 3-methyl-2-butyl group, a phenyl group, a biphenyl group, a $C_1$-$C_{20}$ alkylphenyl group, or a naphthyl group; and
  a methyl group, an ethyl group, an n-propyl group, an isopropyl group, an n-butyl group, an isobutyl group, a sec-butyl group, a tert-butyl group, an n-pentyl group, an isopentyl group, a 2-methylbutyl group, a sec-pentyl group, a tert-pentyl group, a neo-pentyl group, a 3-pentyl group, a 3-methyl-2-butyl group, a phenyl group, or a naphthyl group, each substituted with one or more of deuterium or a phenyl group.

In Formulae 5-1 to 5-116, b51 and b54 may each independently be 1 or 2;
  b53 and b55 may each independently be 1, 2, or 3;
  b52 may be 1, 2, 3, or 4;
  Ph may be a phenyl group;
  Ph-d5 may be a phenyl group in which each hydrogen is substituted with deuterium; and
  * and *' each indicate a binding site to a neighboring atom.

In one or more embodiments, the organometallic compound may be a compound represented by one of Formulae 11-1 to 11-3:

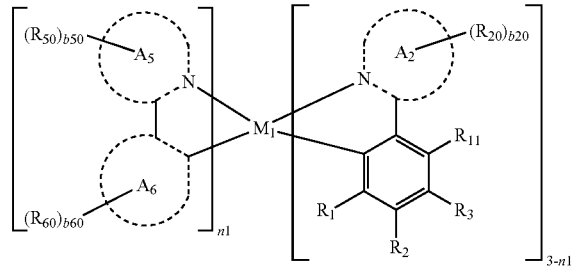

Formula 11-1

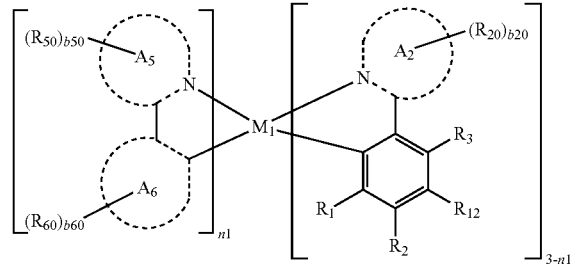

Formula 11-2

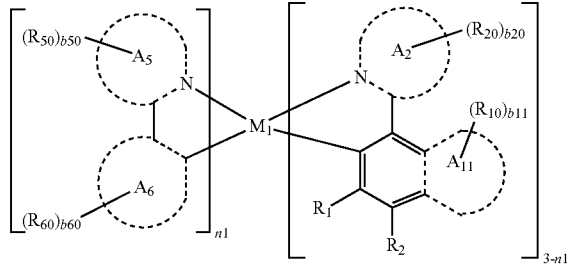

Formula 11-3 wherein, in Formulae 11-1 to 11-3, $M_1$, n1, $A_2$, $R_1$, $R_2$, $R_3$, $R_{10}$, $R_{20}$, and b20 may each be same as described herein, $A_{11}$ may be a benzene group, an indene group, an indole group, a benzofuran group, a benzothiophene group, or a benzosilole group, b11 may be 1, 2, 3, 4, 5, or 6, $R_{11}$ and $R_{12}$ may each independently be the same as described in connection with $R_{10}$, $A_5$ and $A_6$ may each independently be a $C_5$-$C_{30}$ carbocyclic group or a $C_1$-$C_{30}$ heterocyclic group, $R_{50}$ and $R_{60}$ may each independently be hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted $C_2$-$C_{60}$ alkylheteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —Ge($Q_1$)($Q_2$)($Q_3$), —B($Q_1$)($Q_2$), —P(=O)($Q_1$)($Q_2$), or —P($Q_2$)($Q_2$), and b50 and b60 may each independently be an integer from 1 to 10.

In one or more embodiments, in Formulae 11-1 and 11-2, (i) at least one of $R_{20}$(s) in the number of b20 may be a substituted or unsubstituted $C_1$-$C_{60}$ alkyl group, —Si($Q_1$)($Q_2$)($Q_3$), or —Ge($Q_1$)($Q_2$)($Q_3$), or (ii) $R_1$ or $R_2$ may be a group represented by Formula 1-1.

In one or more embodiments, the organometallic compound may be represented by Formula 12-1:

wherein, in Formula 12-1, $M_1$, n1, $A_1$, $R_1$, $R_2$, $R_3$, $R_{10}$, and b10 may each be same as described herein, $R_{21}$ to $R_{24}$ may each independently be the same as described in connection with $R_{20}$, $A_5$ and $A_6$ may each independently be a $C_5$-$C_{30}$ carbocyclic group or a $C_1$-$C_{30}$ heterocyclic group, $R_{50}$ and $R_{60}$ may each independently be hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted $C_2$-$C_{60}$ alkylheteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —Ge($Q_1$)($Q_2$)($Q_3$), —B($Q_1$)($Q_2$), —P(=O)($Q_1$)($Q_2$), or —P($Q_2$)($Q_2$), and b50 and b60 may each independently be an integer from 1 to 10.

In one or more embodiments, in Formula 12-1, when $A_1$ is a benzene group, (i) at least one of $R_{21}$ to $R_{24}$ may be a substituted or unsubstituted $C_1$-$C_{60}$ alkyl group, —Si($Q_1$)($Q_2$)($Q_3$), or —Ge($Q_1$)($Q_2$)($Q_3$), or (ii) $R_1$ or $R_2$ may be a group represented by Formula 1-1.

In one or more embodiments, in Formula 12-1, when $A_1$ is a benzene group, (i) at least one of $R_{22}$ and $R_{23}$ may be a substituted or unsubstituted $C_1$-$C_{60}$ alkyl group, —Si($Q_1$)($Q_2$)($Q_3$), or —Ge($Q_1$)($Q_2$)($Q_3$), or (ii) $R_1$ or $R_2$ may be a group represented by Formula 1-1.

In one or more embodiments, the organometallic compound may be represented by one of Formulae 21-1 to 21-5:

Formula 12-1

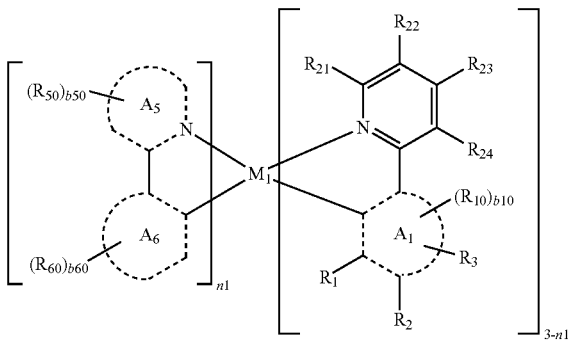

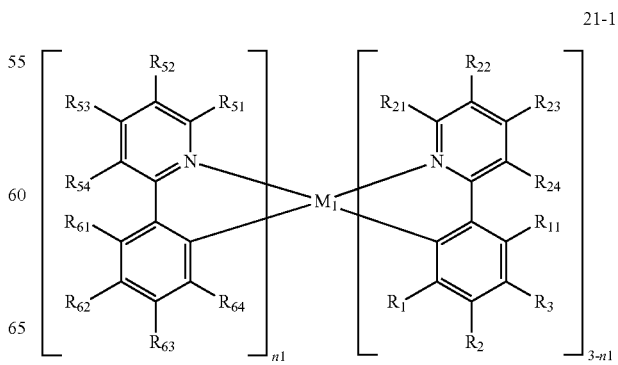

21-1

-continued

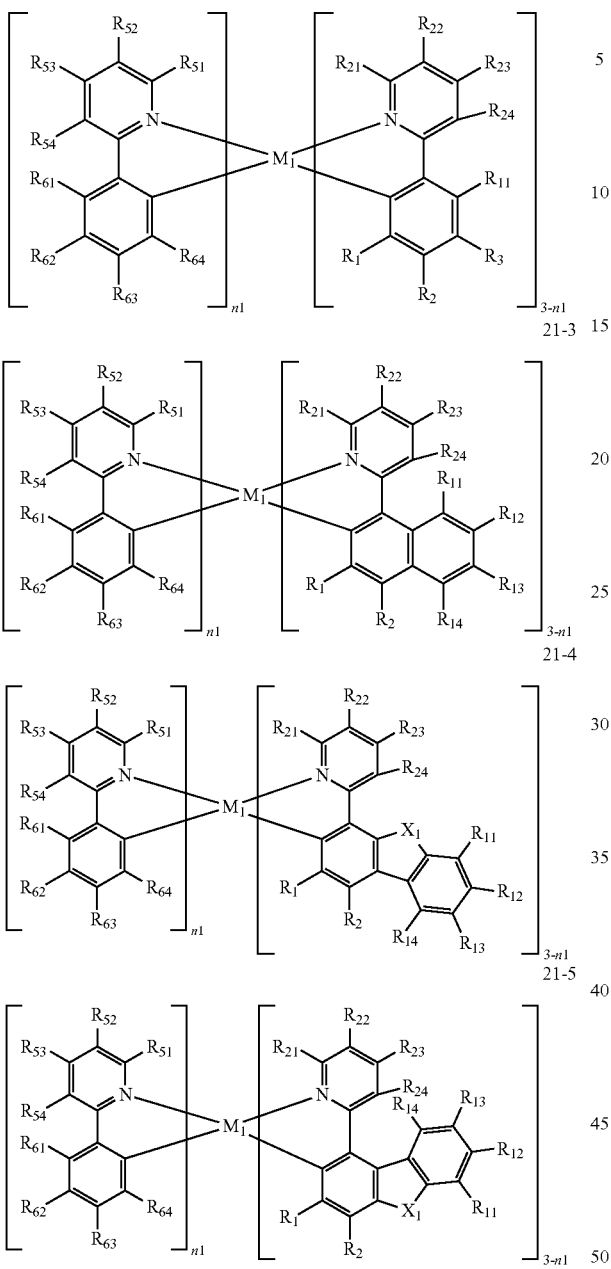

wherein, in Formulae 21-1 to 21-5,
$M_1$, n1, $R_1$, and $R_2$ may each be the same as described herein,
$X_1$ may be O, S, $N(R_{15})$, $C(R_{15})(R_{16})$, or $Si(R_{15})(R_{16})$,
$R_{11}$ to $R_{16}$ may each independently be the same as described in connection with $R_{10}$,
$R_{21}$ to $R_{24}$ may each independently be the same as described in connection with $R_{20}$,
$R_{51}$ to $R_{54}$ may each independently be the same as described in connection with $R_{50}$, and
$R_{61}$ to $R_{64}$ may each independently be the same as described in connection with $R_{60}$.

In one or more embodiments, in Formulae 21-1 and 21-2, (i) at least one of $R_{21}$ to $R_{24}$ (or at least one of $R_{22}$ and $R_{23}$) may be a substituted or unsubstituted $C_1$-$C_{60}$ alkyl group, —$Si(Q_1)(Q_2)(Q_3)$, or —$Ge(Q_1)(Q_2)(Q_3)$, or (ii) $R_1$ or $R_2$ may be a group represented by Formula 1-1.

In one or more embodiments, in Formulae 21-3 to 21-5, $R_1$ or $R_2$ may be a group represented by Formula 1-1.

In one or more embodiments, each ligand $Ln_2$ in Formula 1 may be independently represented by one of Formulae 2-1 to 2-27:

2-1

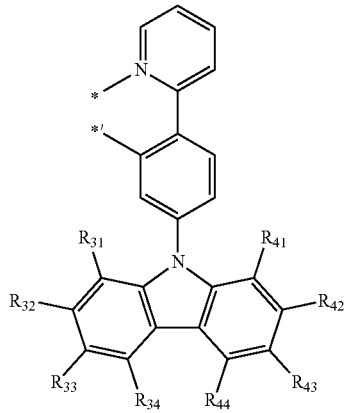

2-2

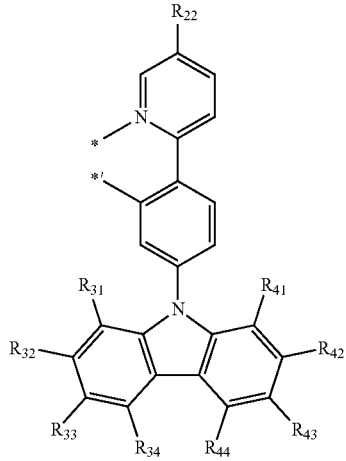

2-3

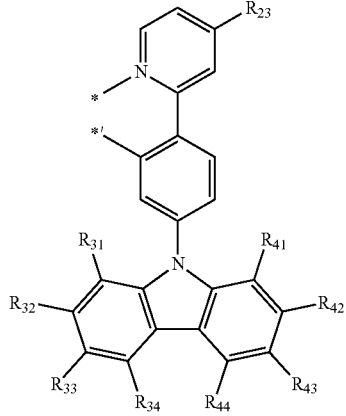

2-4
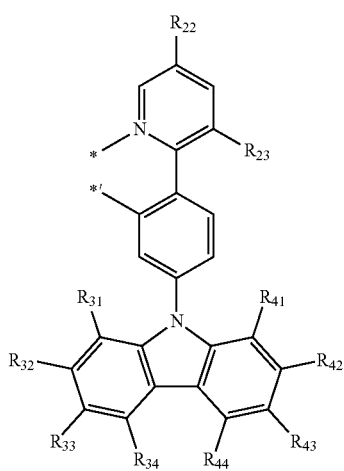
2-5
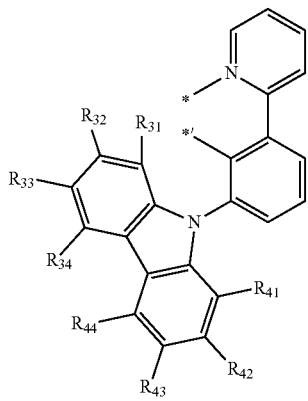
2-6
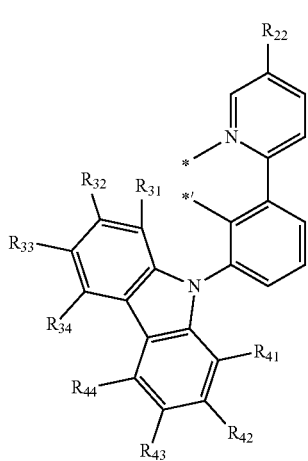
2-7
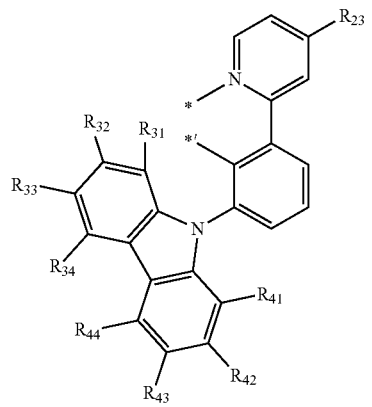
2-8
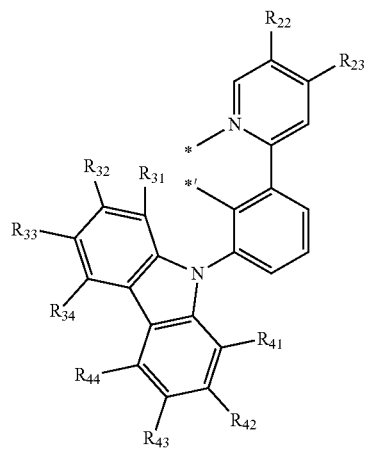
2-9
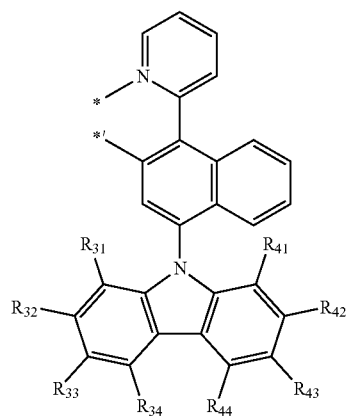

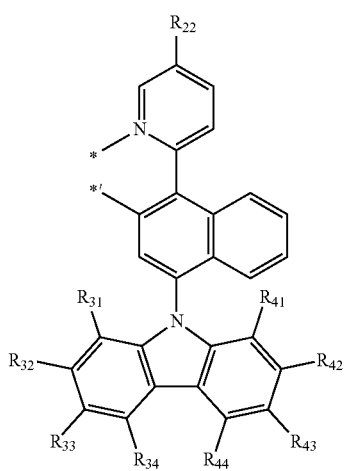
2-10
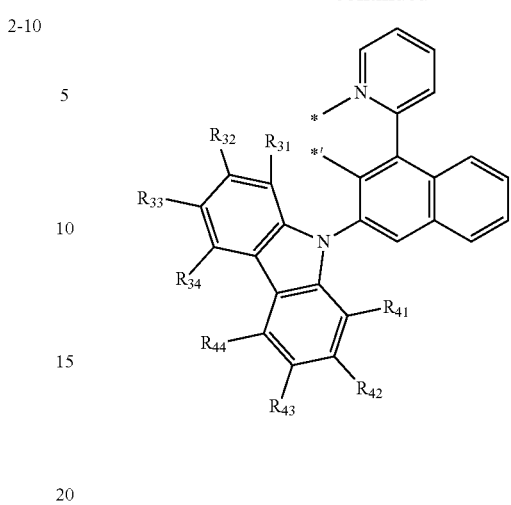
2-13
2-11
2-14
2-12
2-15

2-16
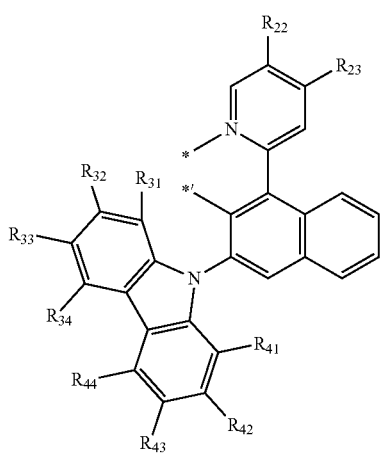
2-17
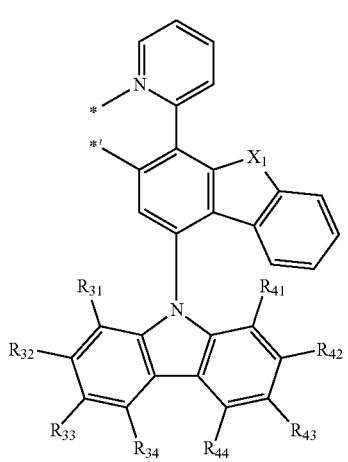
2-18
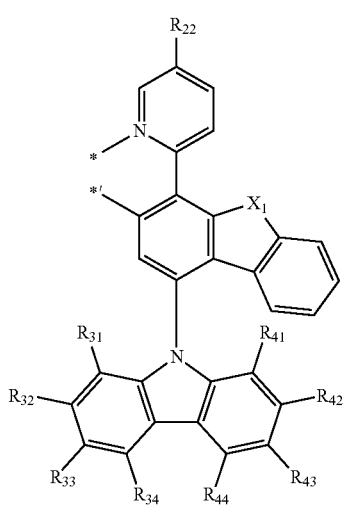
2-19
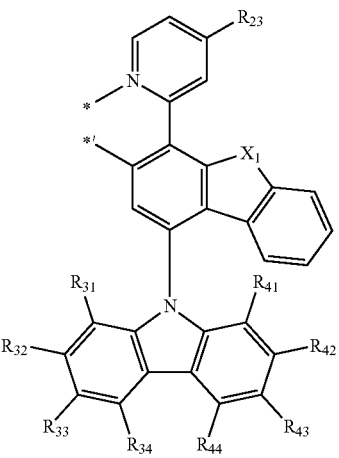
2-20
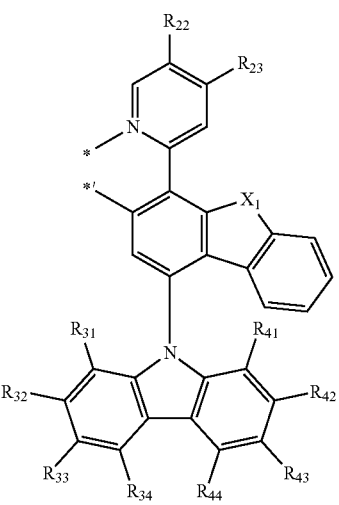
2-21
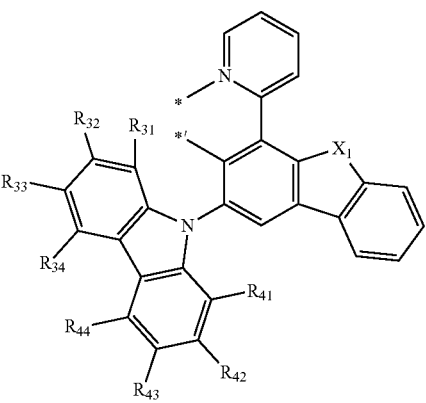

2-22
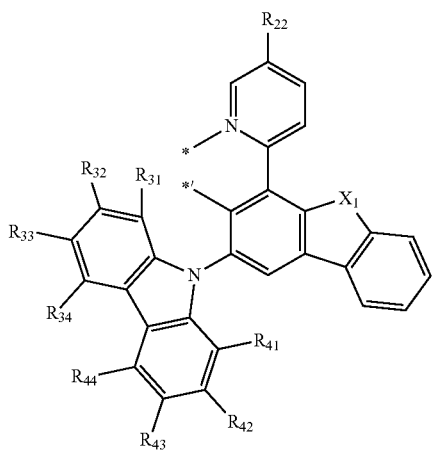

2-23
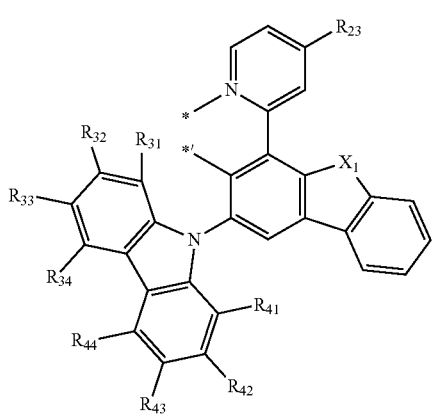

2-24
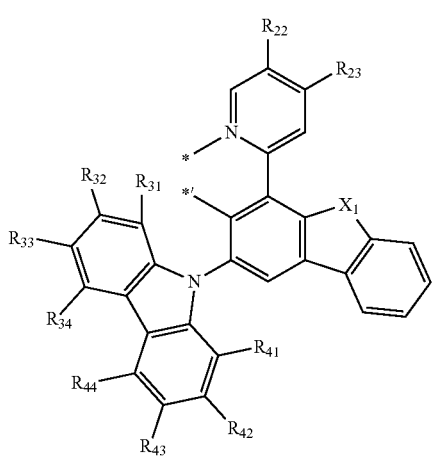

2-25
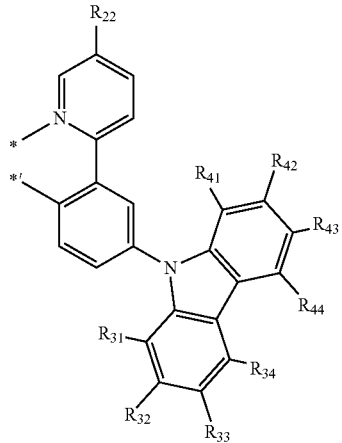

2-26
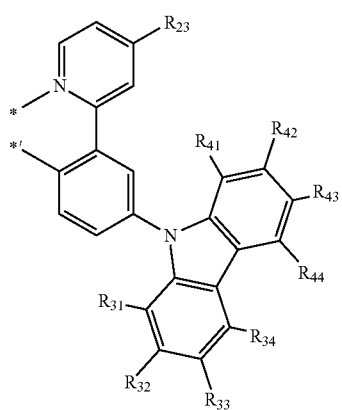

2-27
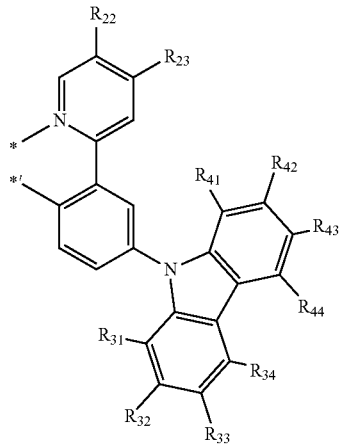

wherein, in Formulae 2-1 to 2-27,
  $X_1$ may be O, S, N($R_{15}$), C($R_{15}$)($R_{16}$), or Si($R_{15}$)($R_{16}$),
  $R_{15}$ and $R_{16}$ may each independently be the same as described in connection with $R_{10}$,
  $R_{22}$ and $R_{23}$ may each independently be a $C_1$-$C_{20}$ alkyl group, —Si($Q_{51}$)($Q_{52}$)($Q_{53}$), or —Ge($Q_{51}$)($Q_{52}$)($Q_{53}$),
  $Q_{51}$ to $Q_{53}$ may each independently be a $C_1$-$C_{20}$ alkyl group,
  $R_{31}$ to $R_{34}$ may each independently be the same as described in connection with $R_{30}$,
  $R_{41}$ to $R_{44}$ may each independently be the same as described in connection with $R_{40}$, and
  * to *' each indicate a binding site to $M_1$.

In one or more embodiments, the organometallic compound may not include an amine group.

Although not wishing to be limited by a specific theory, when an amine group is substituted on $A_2$ which is a moiety related to a lowest unoccupied molecular orbital (LUMO) energy level of the organometallic compound represented by Formula 1, the electron donating effect increases. Accordingly, the emission wavelength of the organometallic compound may become longer, making it difficult to exhibit a desired emission wavelength with high color purity (for example, an emission wavelength of pure green). In addition, since the amine group exhibits melting characteristics during a deposition process of the organometallic compound, such a material may be highly susceptible to deterioration, resulting in deterioration of characteristics of a formed organic light-emitting device.

In the present specification, TMS represents *—Si(CH$_3$)$_3$, and TMG represents *—Ge(CH$_3$)$_3$.

In one or more embodiments, the organometallic compound represented by Formula 1 may be a compound represented by one of Compounds 1 to 36:

1

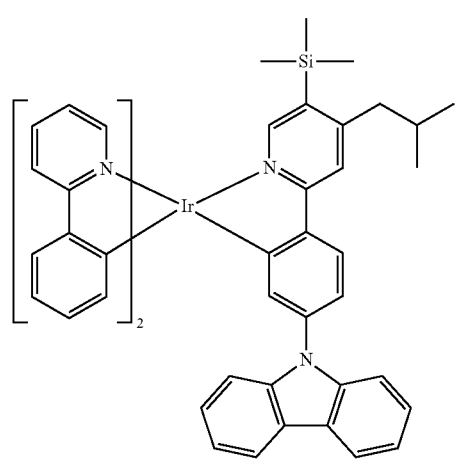

2

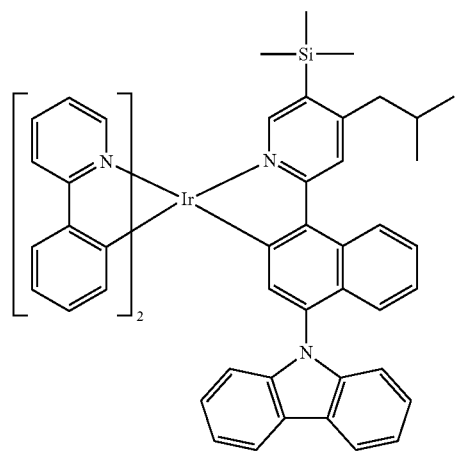

3

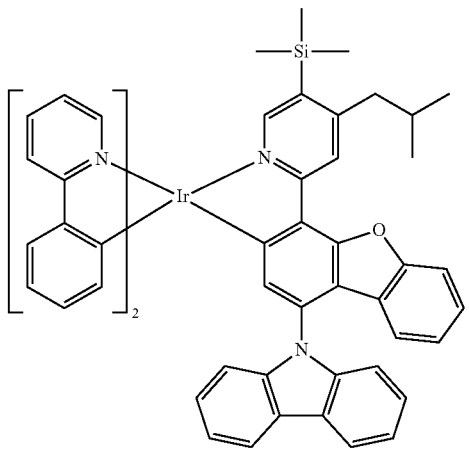

4

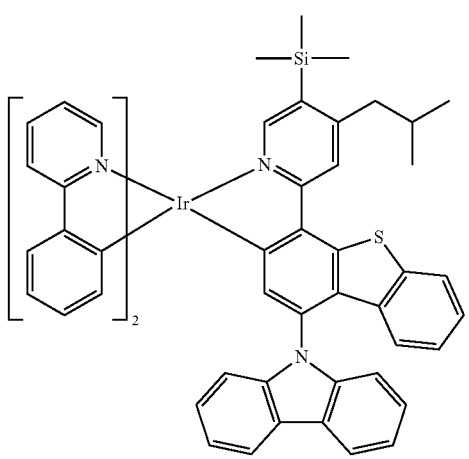

5

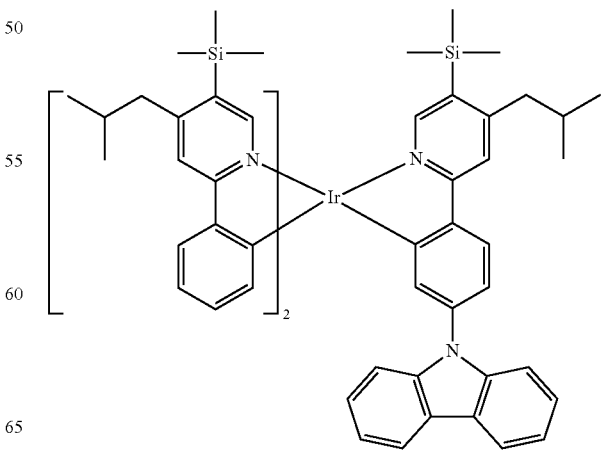

6
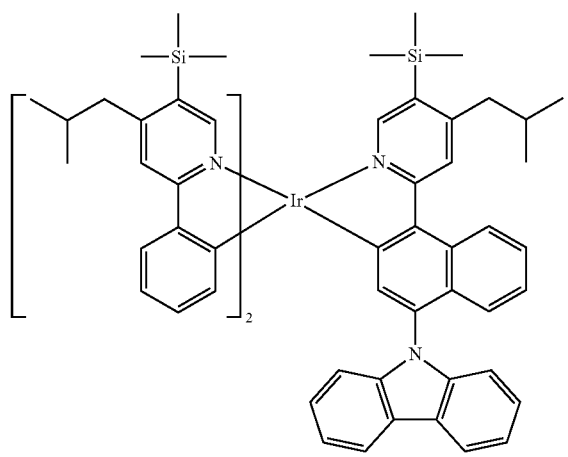
9
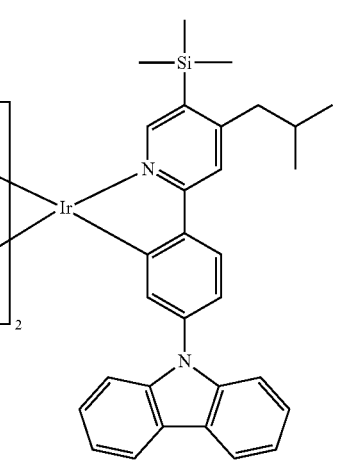
7
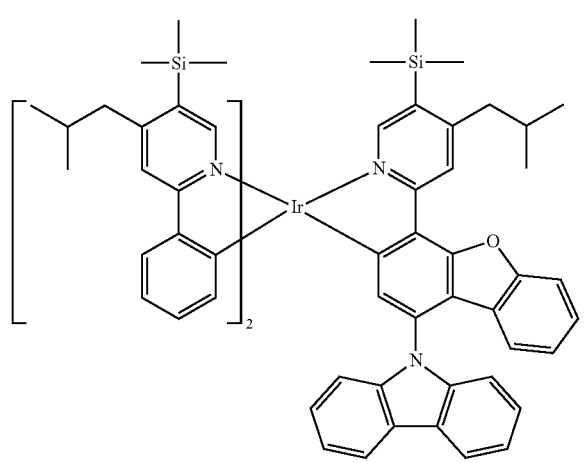
10
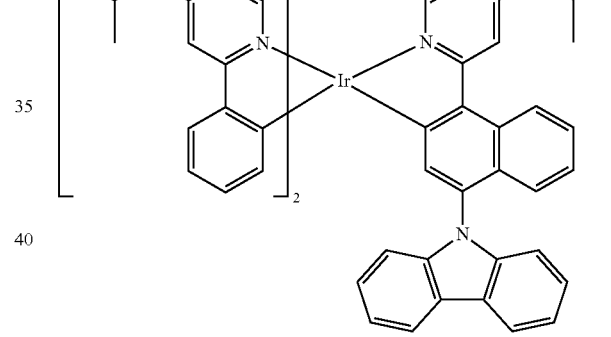
8
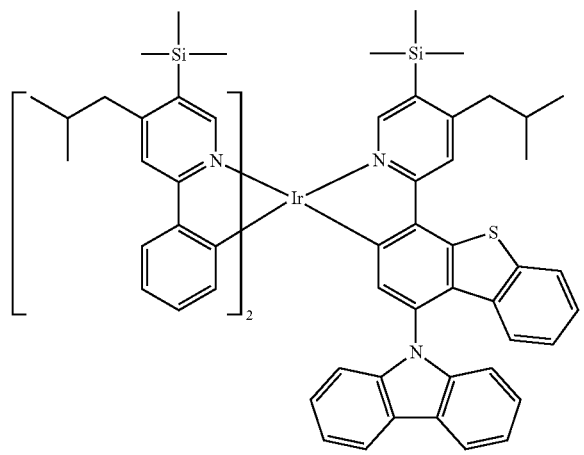
11
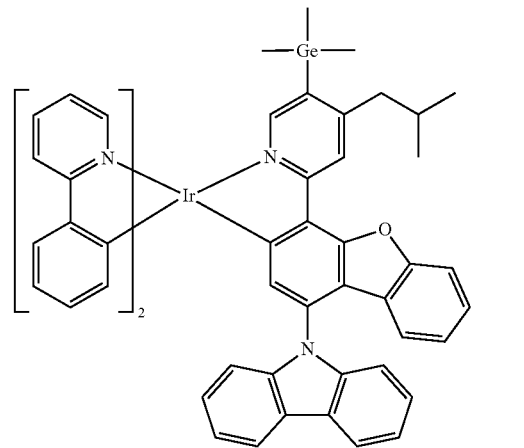

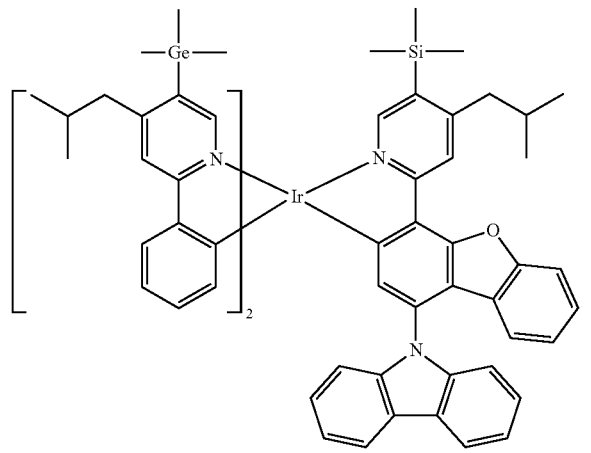
11
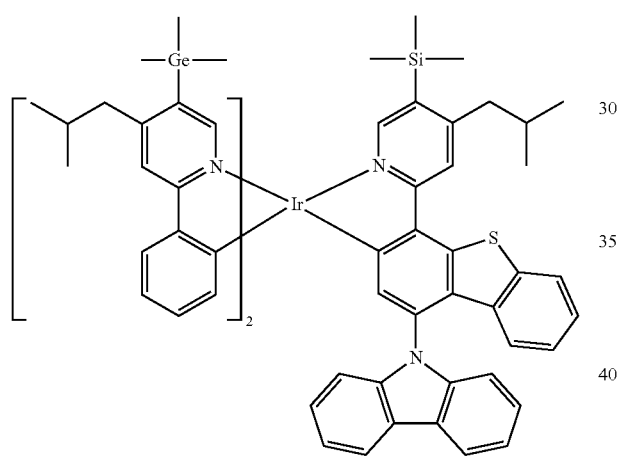
12
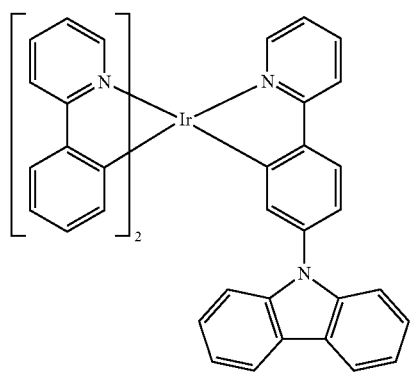
13
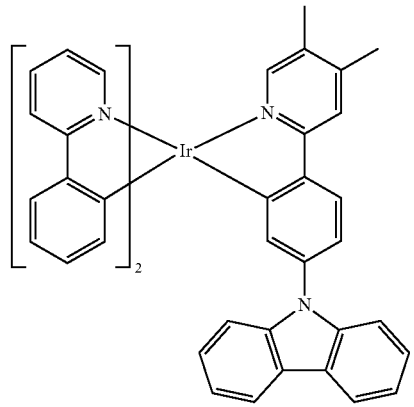
14
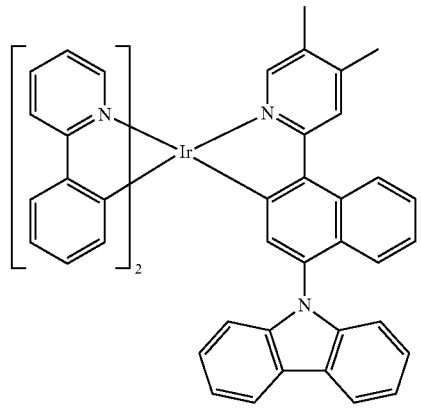
15
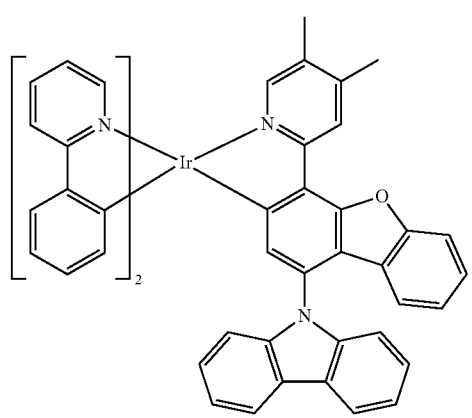
16
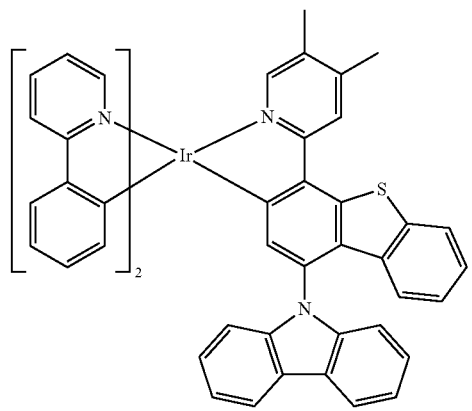
17

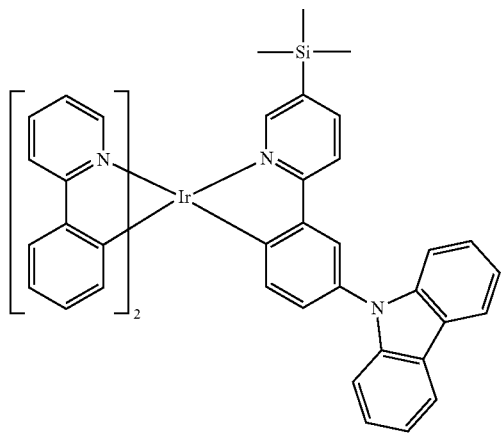
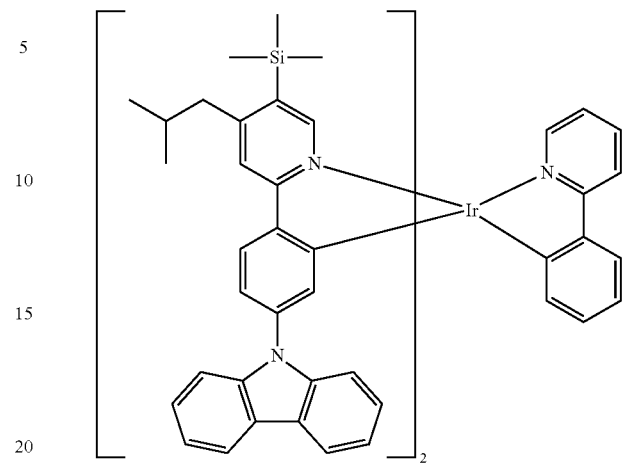
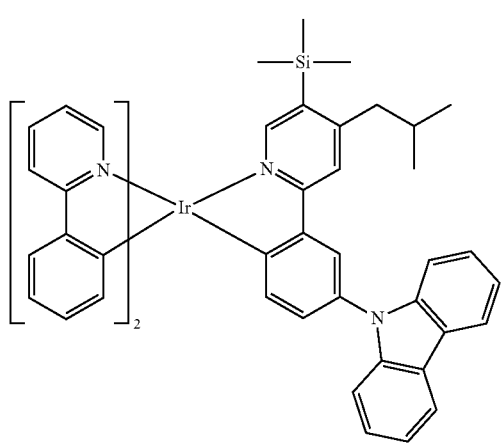
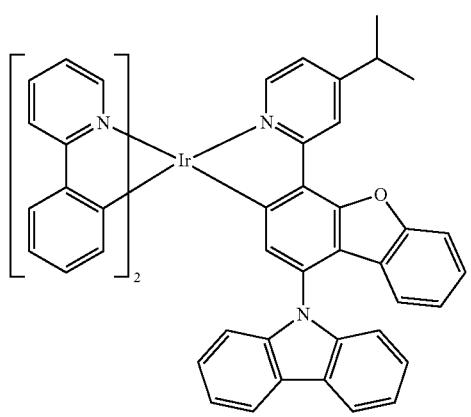

24
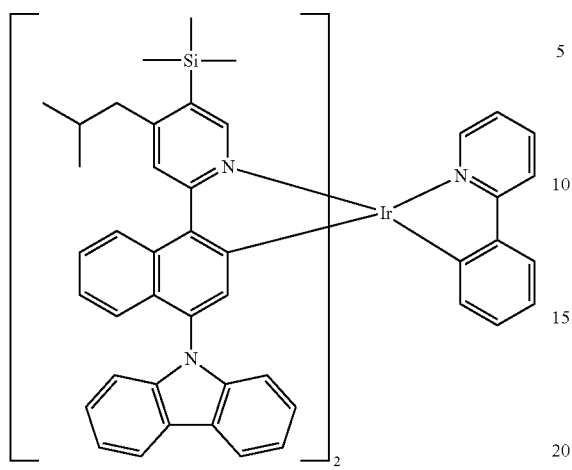
25
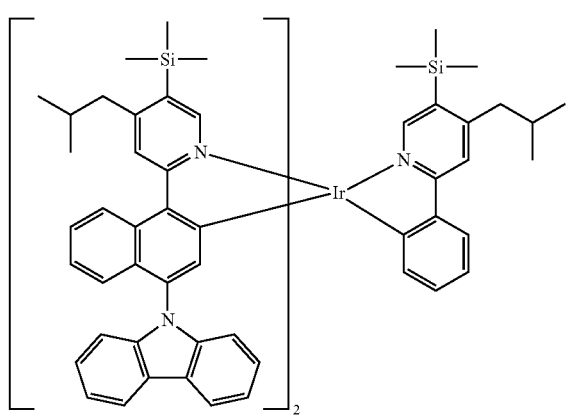
26
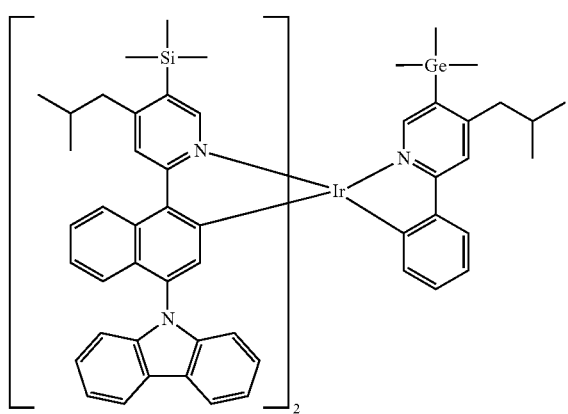
27
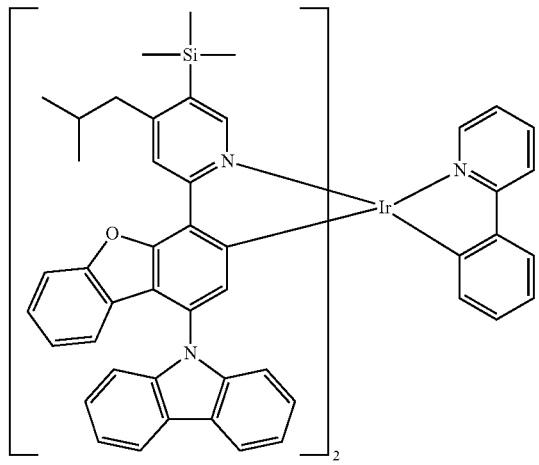
28
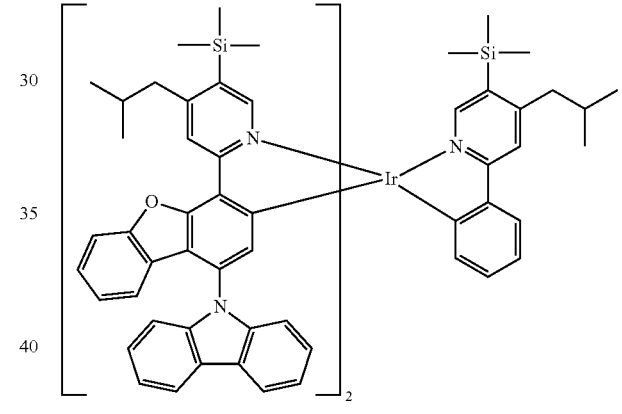
29
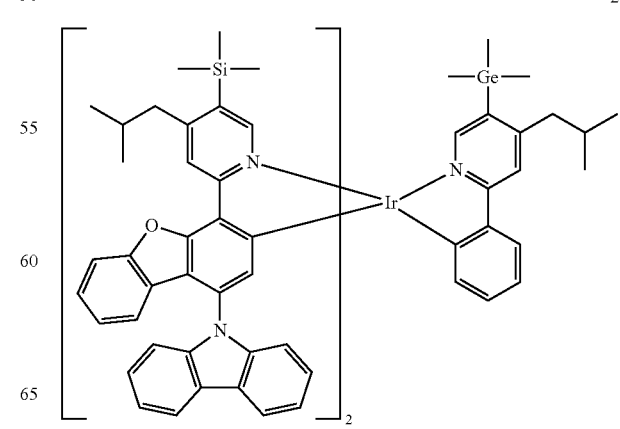

101
-continued
30
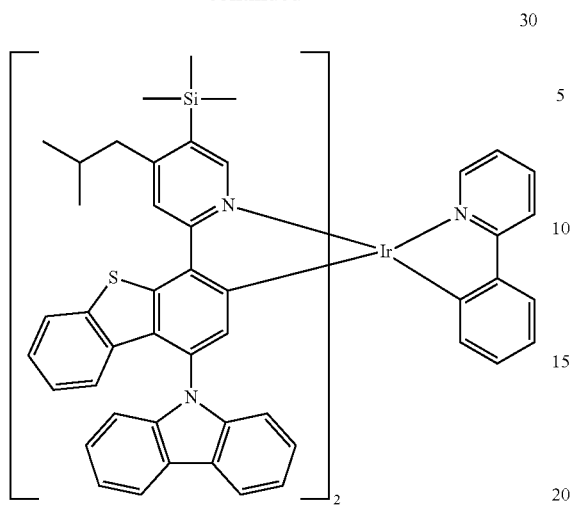
31
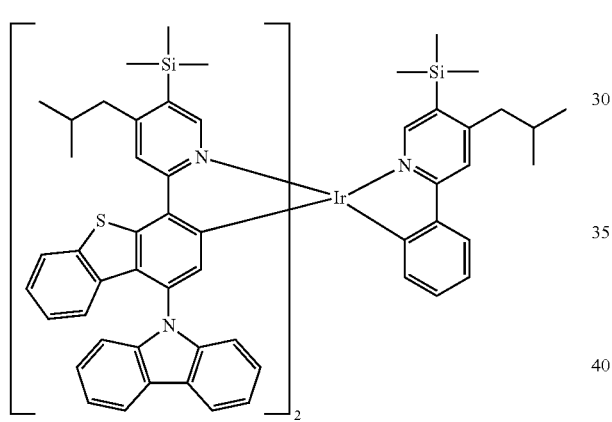
32
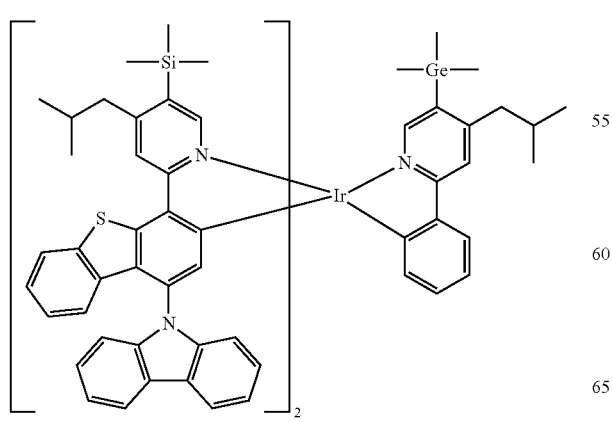
102
-continued
33
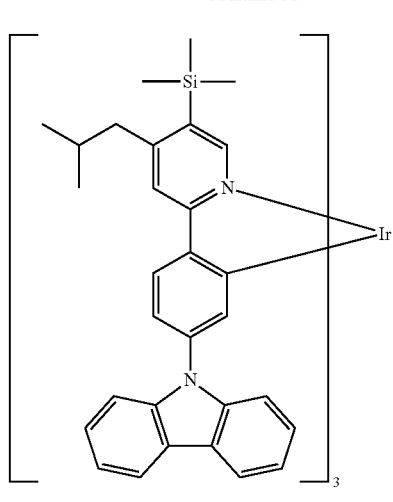
34
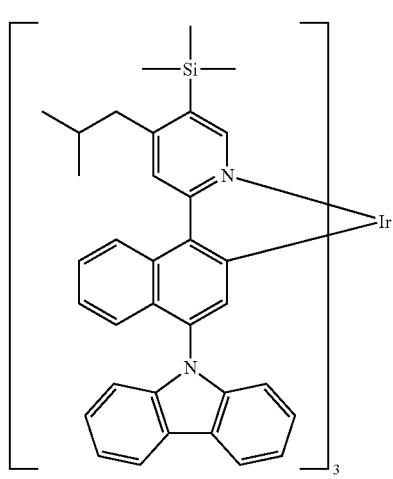
35
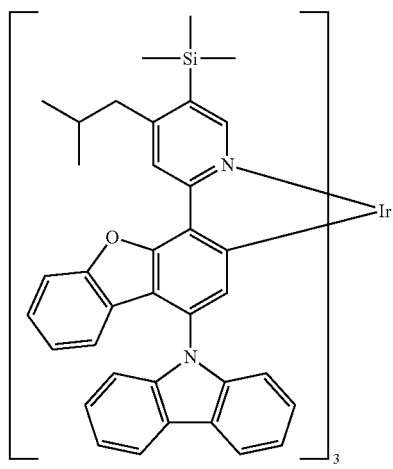

-continued

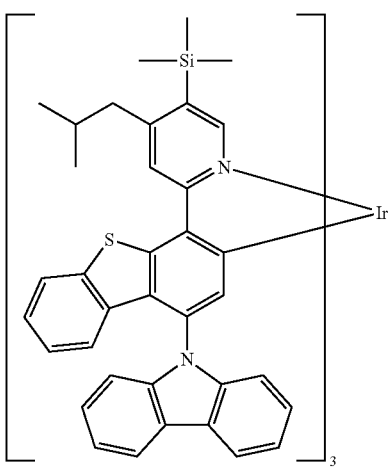

36 wherein, in Formula 1, at least one of $R_1$, $R_2$, and $R_3$ may be a group represented by Formula 1-1. In addition, when $A_1$ in Formula 1A is a benzene group, (i) at least one of $R_{20}$(s) in the number of b20 may be a substituted or unsubstituted $C_1$-$C_{60}$ alkyl group, —Si($Q_1$)($Q_2$)($Q_3$), or —Ge($Q_1$)($Q_2$)($Q_3$), or (ii) $R_1$ or $R_2$ may be a group represented by Formula 1-1.

Without wishing to be bound to theory, by introducing a structure in which a hetero group (e.g., a carbazole group) capable of supplying abundant pi electrons to $A_1$, which is a moiety related to a highest occupied molecular orbital (HOMO) energy level in the ligand represented by Formula 1A, is condensed to the organometallic compound represented by Formula 1, an organic light-emitting device using the organometallic compound may have high luminescence efficiency and excellent thermal stability.

Accordingly, an electronic device, for example, an organic light-emitting device, including the organometallic compound represented by Formula 1 may exhibit a low driving voltage, high efficiency, a long lifespan, and a reduced roll-off phenomenon.

The HOMO energy level (electron volts, eV), LUMO energy level (eV), $S_1$ energy level (eV), and $T_1$ energy level (eV) of some compounds of the organometallic compound represented by Formula 1 were evaluated using the Gaussian 09 program with the molecular structure optimization obtained by B3LYP-based density functional theory (DFT), and results thereof are shown in Table 1.

TABLE 1

| Compound No. | HOMO (eV) | LUMO (eV) | $S_1$ (eV) | $T_1$ (eV) |
| --- | --- | --- | --- | --- |
| Compound 1 | −4.868 | −1.341 | 2.883 | 2.563 |
| Compound 3 | −4.942 | −1.398 | 2.850 | 2.487 |
| Compound 4 | −4.938 | −1.402 | 2.836 | 2.476 |
| Compound 20 | −4.946 | −1.365 | 2.882 | 2.504 |
| Compound C | −4.866 | −1.607 | 2.800 | 2.535 |
| Compound D | −4.896 | −1.502 | 2.829 | 2.553 |

TABLE 1-continued

| Compound No. | HOMO (eV) | LUMO (eV) | S₁ (eV) | T₁ (eV) |
| --- | --- | --- | --- | --- |

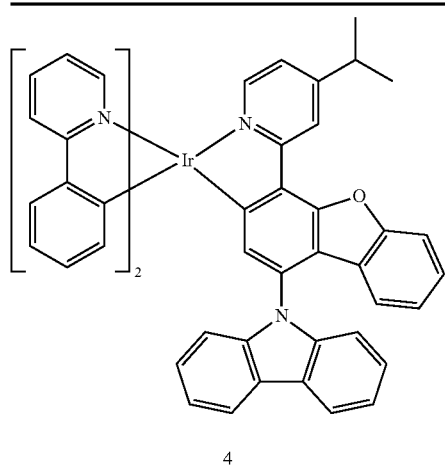

4

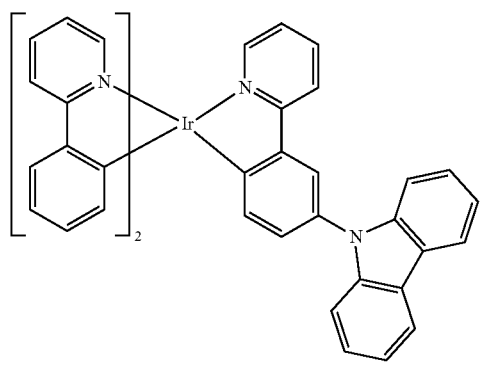

C

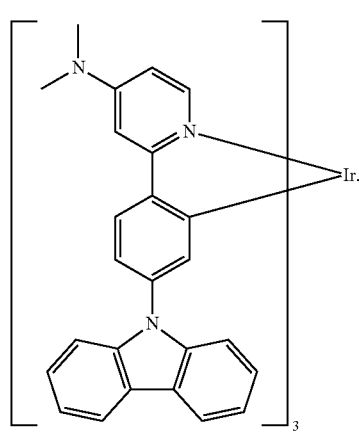

D

From Table 1, it is confirmed that the organometallic compound represented by Formula 1 has such electric characteristics that are suitable for use as a dopant for an electric device, for example, an organic light-emitting device.

In one or more embodiments, the full width at half maximum (FWHM) of the emission peak of the emission spectrum or the electroluminescence spectrum of the organometallic compound may be equal to or less than about 55 nanometers (nm). For example, the FWHM of the emission peak of the emission spectrum or the electroluminescence spectrum of the organometallic compound may be from about 30 nm to about 55 nm, about 40 nm to about 53 nm, or about 45 nm to about 52 nm.

In one or more embodiments, the maximum emission wavelength (emission peak wavelength, $\lambda_{max}$) of the emission peak of the emission spectrum or the electroluminescence spectrum of the organometallic compound may be from about 500 nm to about 600 nm.

Synthesis methods of the organometallic compound represented by Formula 1 may be recognizable by one of ordinary skill in the art by referring to Synthesis Examples provided below.

In this regard, the organometallic compound represented by Formula 1 may be suitable for use in an organic layer of an organic light-emitting device, for example, for use as a dopant in an emission layer of the organic layer. Thus, another aspect of the present disclosure provides an organic light-emitting device including: a first electrode; a second electrode; and an organic layer arranged between the first electrode and the second electrode and including an emission layer and at least one organometallic compound represented by Formula 1.

Since the organic light-emitting device has an organic layer including the organometallic compound represented by Formula 1 as described above, excellent characteristics may be obtained with respect to driving voltage, current efficiency, external quantum efficiency, a roll-off ratio, and lifespan, and the FWHM of the emission peak of the EL spectrum may be relatively narrow.

The organometallic compound of Formula 1 may be used between a pair of electrodes of the organic light-emitting device. For example, the organometallic compound represented by Formula 1 may be included in the emission layer. In this regard, the organometallic compound may act as a dopant, and the emission layer may further include a host (that is, an amount of the organometallic compound represented by Formula 1 in the emission layer is smaller than that of the host).

In one or more embodiments, the emission layer may emit green light. For example, the emission layer may emit green light having a maximum luminescence wavelength from about 500 nm to about 600 nm.

The expression "(an organic layer) includes at least one of organometallic compounds" as used herein may include a case in which "(an organic layer) includes identical organometallic compounds represented by Formula 1" and a case in which "(an organic layer) includes two or more different organometallic compounds represented by Formula 1."

In one or more embodiments, the organic layer may include, as the organometallic compound, only Compound 1. In this embodiment, Compound 1 may be included in the emission layer of the organic light-emitting device. In one or more embodiments, the organic layer may include, as the organometallic compound, Compound 1 and Compound 2. In this embodiment, Compound 1 and Compound 2 may exist in an identical layer (for example, Compound 1 and Compound 2 all may exist in an emission layer).

The first electrode may be an anode, which is a hole injection electrode, and the second electrode may be a cathode, which is an electron injection electrode; or the first electrode may be a cathode, which is an electron injection electrode, and the second electrode may be an anode, which is a hole injection electrode.

For example, in the organic light-emitting device, the first electrode may be an anode, and the second electrode may be a cathode, and the organic layer may further include a hole transport region between the first electrode and the emission layer and an electron transport region between the emission layer and the second electrode, wherein the hole transport region may include a hole injection layer, a hole transport layer, an electron blocking layer, a buffer layer, or any combination thereof, and the electron transport region may include a hole blocking layer, an electron transport layer, an electron injection layer, or any combination thereof.

The term "organic layer" as used herein refers to a single layer and/or a plurality of layers between the first electrode and the second electrode of the organic light-emitting device. The "organic layer" may include, in addition to an organic compound, an organometallic complex including metal.

FIGURE is a schematic cross-sectional view of an organic light-emitting device 10 according to one or more embodiments. Hereinafter, the structure of an organic light-emitting device according to one or more embodiments of the present disclosure and a method of manufacturing an organic light-emitting device according to one or more embodiments of the present disclosure will be described in connection with FIGURE. The organic light-emitting device 10 includes a first electrode 11, an organic layer 15, and a second electrode 19, which are sequentially stacked.

A substrate may be additionally arranged under the first electrode 11 or above the second electrode 19. For use as the substrate, any substrate that is used in organic light-emitting devices available in the art may be used, and the substrate may be a glass substrate or a transparent plastic substrate, each having excellent mechanical strength, thermal stability, transparency, surface smoothness, ease of handling, and water resistance.

In one or more embodiments, the first electrode 11 may be formed by depositing or sputtering a material for forming the first electrode 11 on the substrate.

The first electrode 11 may be an anode. The material for forming the first electrode 11 may include materials with a high work function to facilitate hole injection. The first electrode 11 may be a reflective electrode, a semi-transmissive electrode, or a transmissive electrode. In one or more embodiments, the material for forming the first electrode 11 may be indium tin oxide (ITO), indium zinc oxide (IZO), tin oxide ($SnO_2$), or zinc oxide (ZnO). In one or more embodiments, the material for forming the first electrode 11 may be metal, such as magnesium (Mg), aluminum (Al), aluminum-lithium (Al—Li), calcium (Ca), magnesium-indium (Mg—In), or magnesium-silver (Mg—Ag).

The first electrode 11 may have a single-layered structure or a multi-layered structure including two or more layers. For example, the first electrode 11 may have a three-layered structure of ITO/Ag/ITO.

The organic layer 15 is arranged on the first electrode 11.

The organic layer 15 may include a hole transport region, an emission layer, and an electron transport region.

The hole transport region may be arranged between the first electrode 11 and the emission layer.

The hole transport region may include a hole injection layer, a hole transport layer, an electron blocking layer, a buffer layer, or any combination thereof.

In one or more embodiments, the hole transport region may include only either a hole injection layer or a hole transport layer. In one or more embodiments, the hole transport region may have a hole injection layer/hole transport layer structure or a hole injection layer/hole transport layer/electron blocking layer structure, wherein, layers in each structure are sequentially stacked in this stated order from the first electrode 11.

When the hole transport region includes a hole injection layer, the hole injection layer may be formed on the first electrode 11 by using one or more suitable methods, for example, vacuum deposition, spin coating, casting, and/or Langmuir-Blodgett (LB) deposition.

When the hole injection layer is formed by vacuum deposition, the deposition conditions may vary according to a compound that is used as a material for forming the hole injection layer, and the structure and thermal characteristics of the hole injection layer. For example, the deposition conditions may include a deposition temperature in a range of about 100° C. to about 500° C., a vacuum pressure in a range of about 10-8 torr to about 10-3 torr, and a deposition rate in a range of about 0.01 Å/sec to about 100 Å/sec. However, the deposition conditions are not limited thereto.

When the hole injection layer is formed by spin coating, the coating conditions may vary according to a compound that is used as a material for forming the hole injection layer, and the structure and thermal properties of the hole injection layer. For example, the coating conditions may include a coating speed in a range of about 2,000 rpm to about 5,000 rpm, and a temperature at which a heat treatment is performed to remove a solvent after coating may be in a range of about 80° C. to about 200° C. However, the coating conditions are not limited thereto.

Conditions for forming a hole transport layer and an electron blocking layer may be understood by referring to conditions for forming the hole injection layer.

The hole transport region may include, for example, m-MTDATA, TDATA, 2-TNATA, NPB, R-NPB, TPD, Spiro-TPD, Spiro-NPB, methylated NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), poly[(9,9-dioctylfluorenyl-2,7-diyl)-co-(4,4'-(N-(4-sec-butylphenyl)diphenylamine)] (TFB), a compound represented by Formula 201, a compound represented by Formula 202, or any combination thereof:

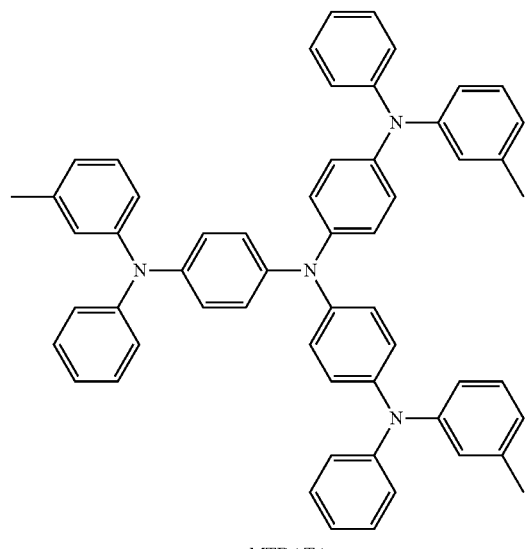

m-MTDATA

-continued
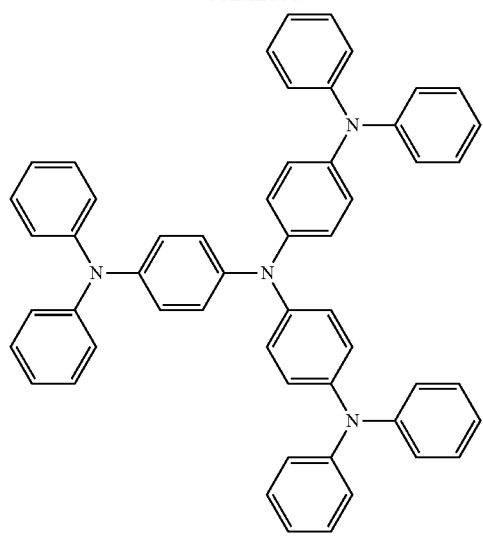
TDATA
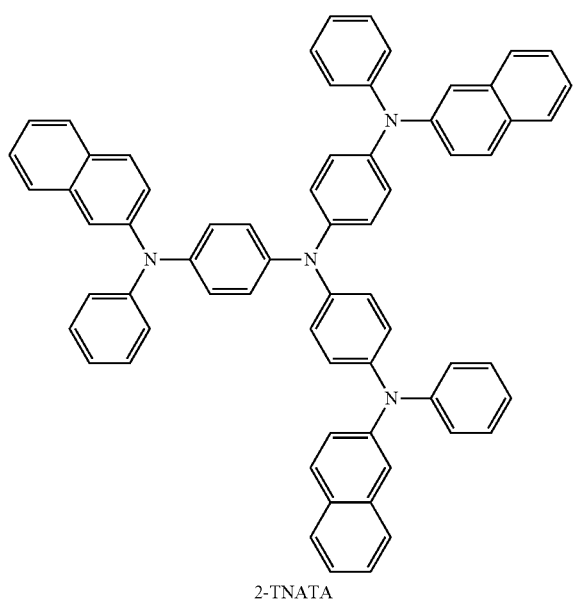
2-TNATA
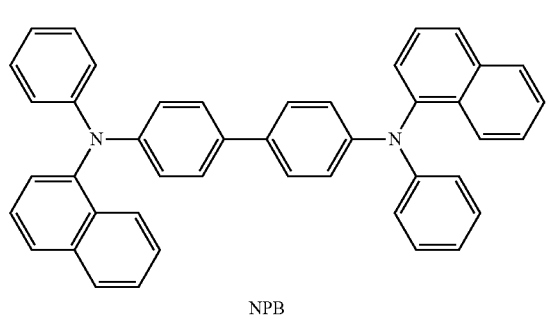
NPB
-continued
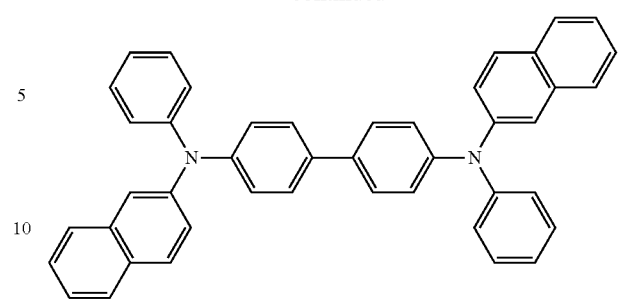
β-NPB
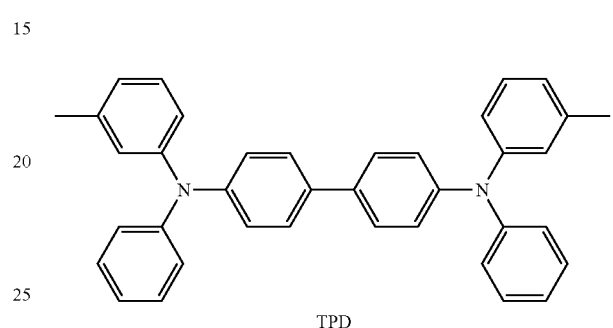
TPD
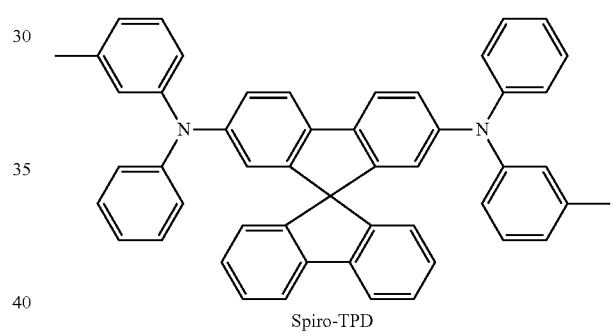
Spiro-TPD
Spiro-NPB
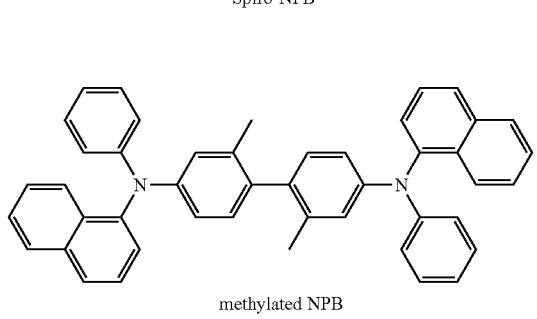
methylated NPB

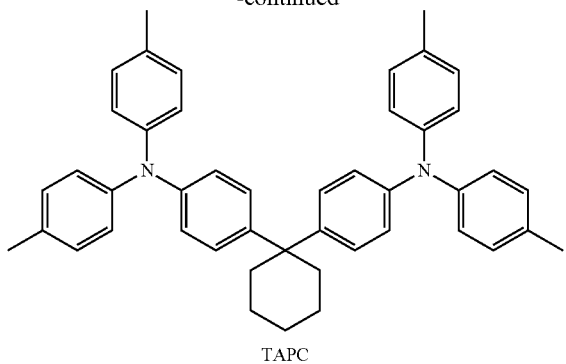

TAPC

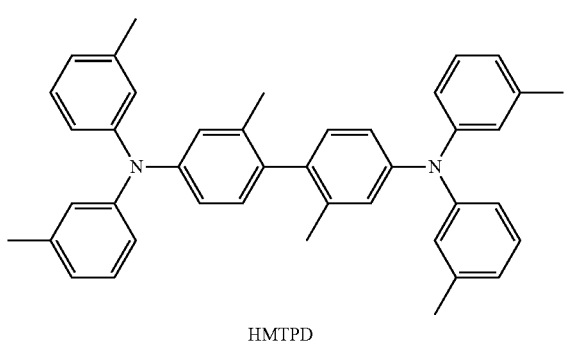

HMTPD

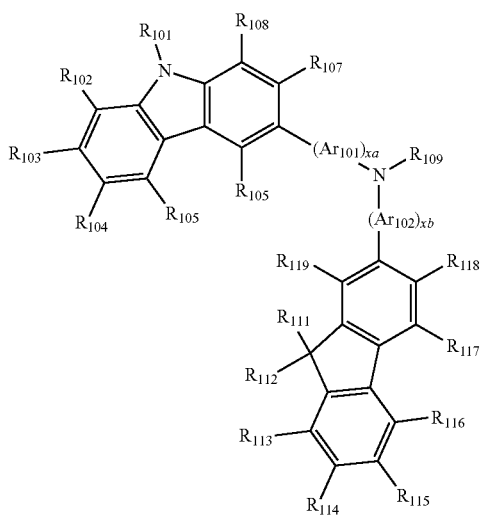

Formula 201

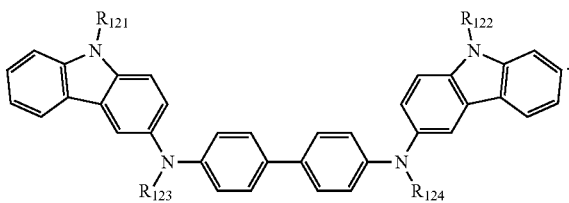

Formula 202

In Formula 201, $Ar_{101}$ and $Ar_{102}$ may each independently be a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each unsubstituted or substituted with one or more of deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, or a monovalent non-aromatic condensed heteropolycyclic group.

In Formula 201, xa and xb may each independently be an integer from 0 to 5, or 0, 1, or 2. For example, xa may be 1, and xb may be 0, but embodiments are not limited thereto.

In Formulae 201 and 202, $R_{101}$ to $R_{108}$, $R_{111}$ to $R_{119}$, and $R_{121}$ to $R_{124}$ may each independently be:

hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group (for example, a methyl group, an ethyl group, a propyl group, a butyl group, a pentyl group, a hexyl group, or the like), or a $C_1$-$C_{10}$ alkoxy group (for example, a methoxy group, an ethoxy group, a propoxy group, a butoxy group, a pentoxy group, or the like);

a $C_1$-$C_{10}$ alkyl group or a $C_1$-$C_{10}$ alkoxy group, each unsubstituted or substituted with one or more of deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, or a phosphoric acid or a salt thereof; or a phenyl group, a naphthyl group, an anthracenyl group, a fluorenyl group, or a pyrenyl group, each unsubstituted or substituted with one or more of deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, or a $C_1$-$C_{10}$ alkoxy group.

In Formula 201, $R_{109}$ may be a phenyl group, a naphthyl group, an anthracenyl group, or a pyridinyl group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthracenyl group, a pyridinyl group, or any combination thereof.

In one or more embodiments, the compound represented by Formula 201 may be represented by Formula 201A:

Formula 201A
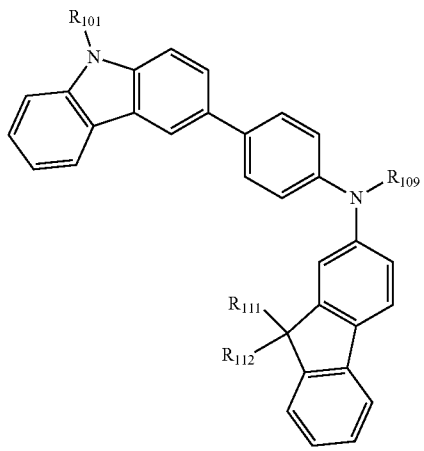
wherein, in Formula 201A, $R_{101}$, $R_{111}$, $R_{112}$, and $R_{109}$ may each be the same as described herein.
For example, the hole transport region may include one or more of Compounds HT1 to HT21, or any combination thereof:
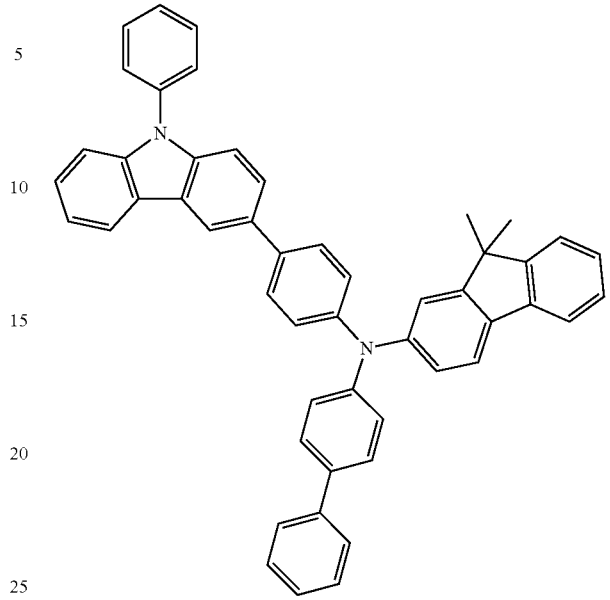
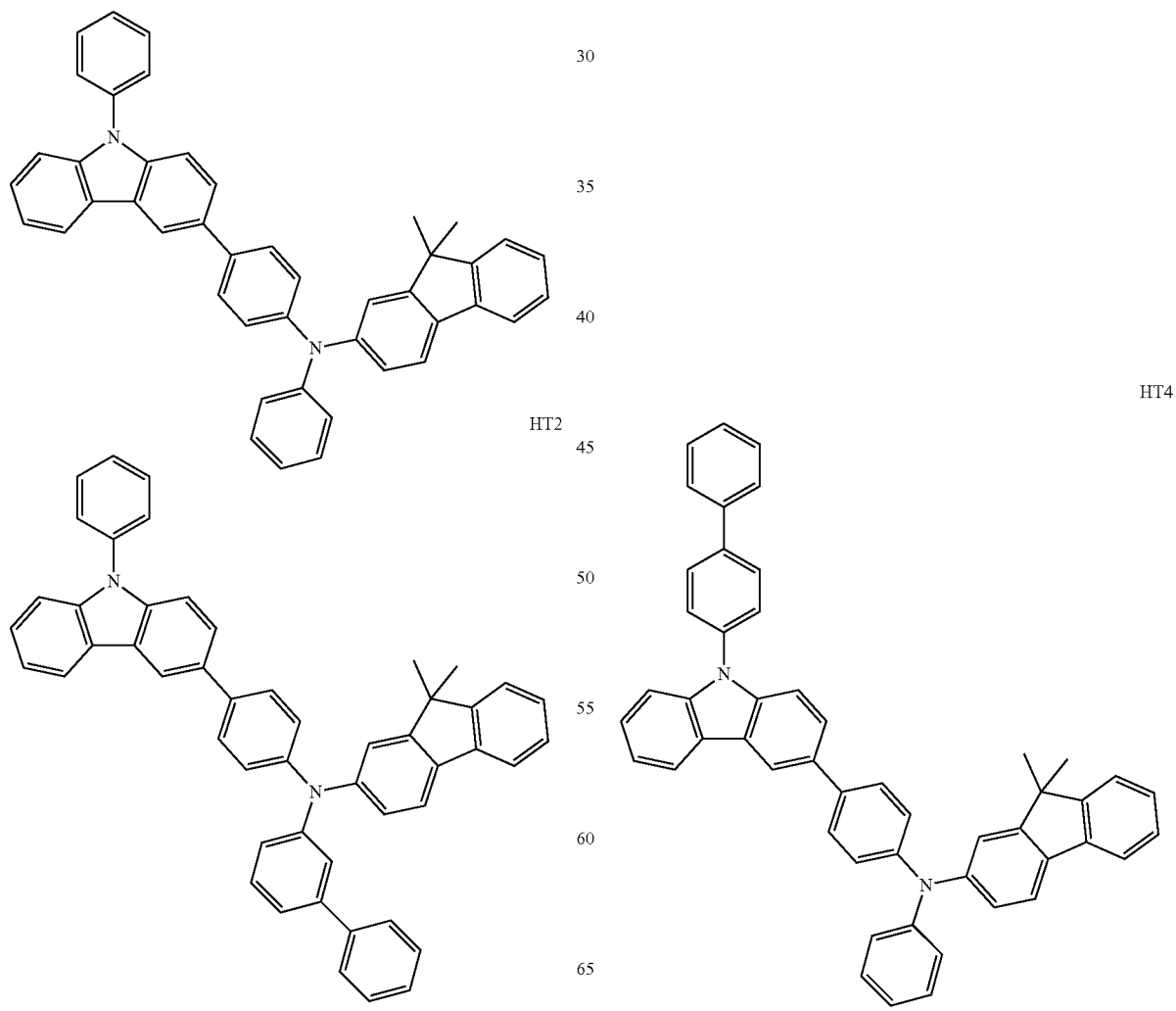

HT5
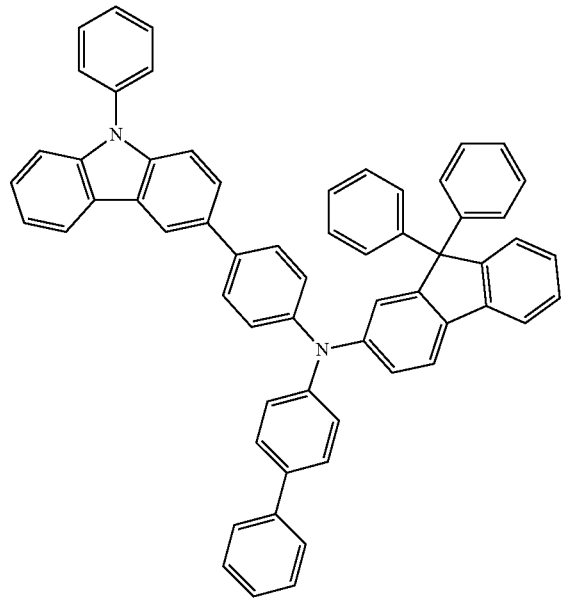
HT6
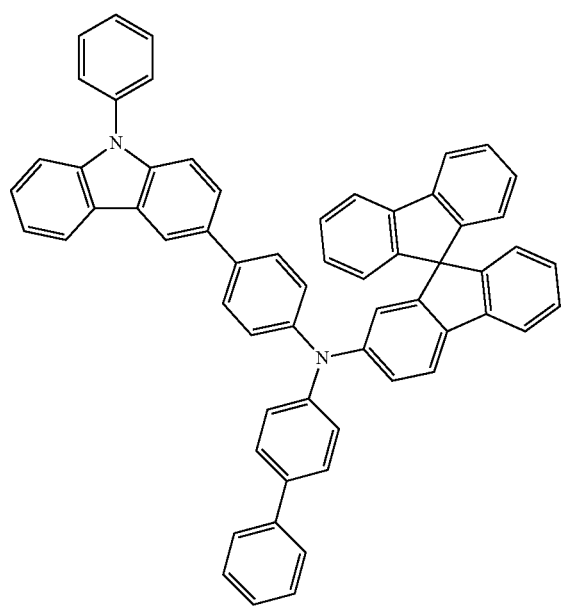
HT7
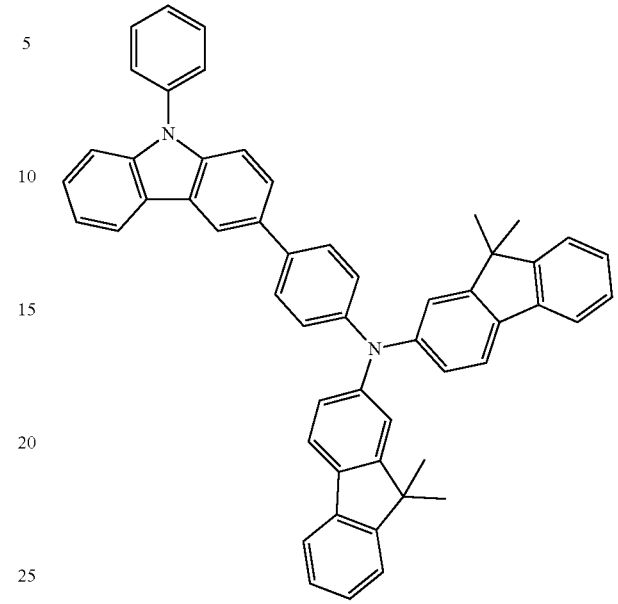
HT8
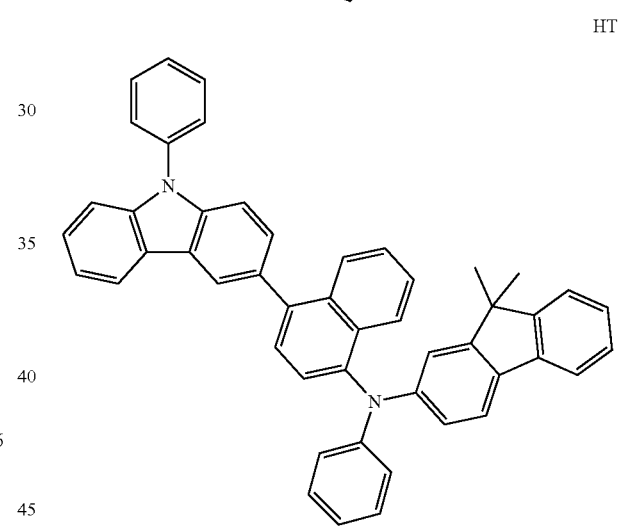
HT9
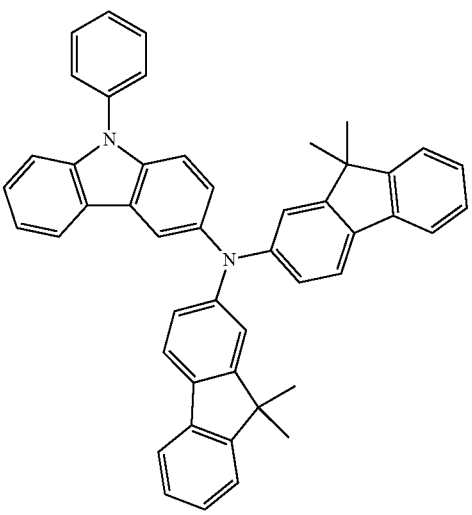

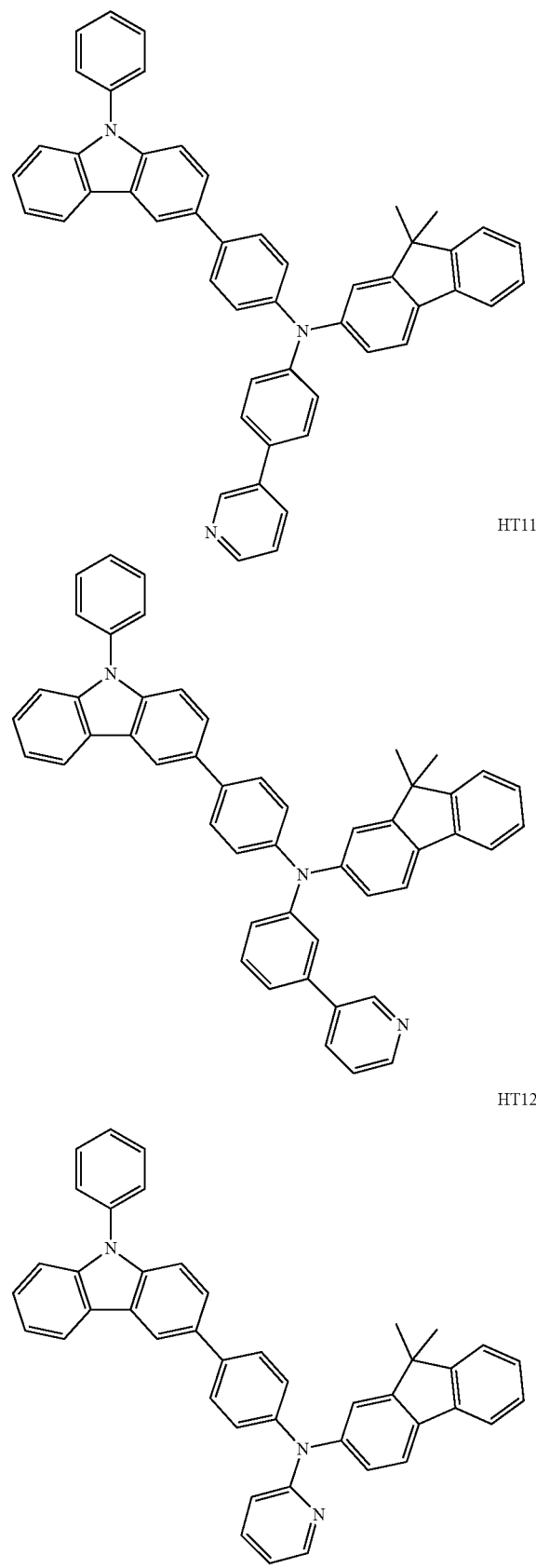
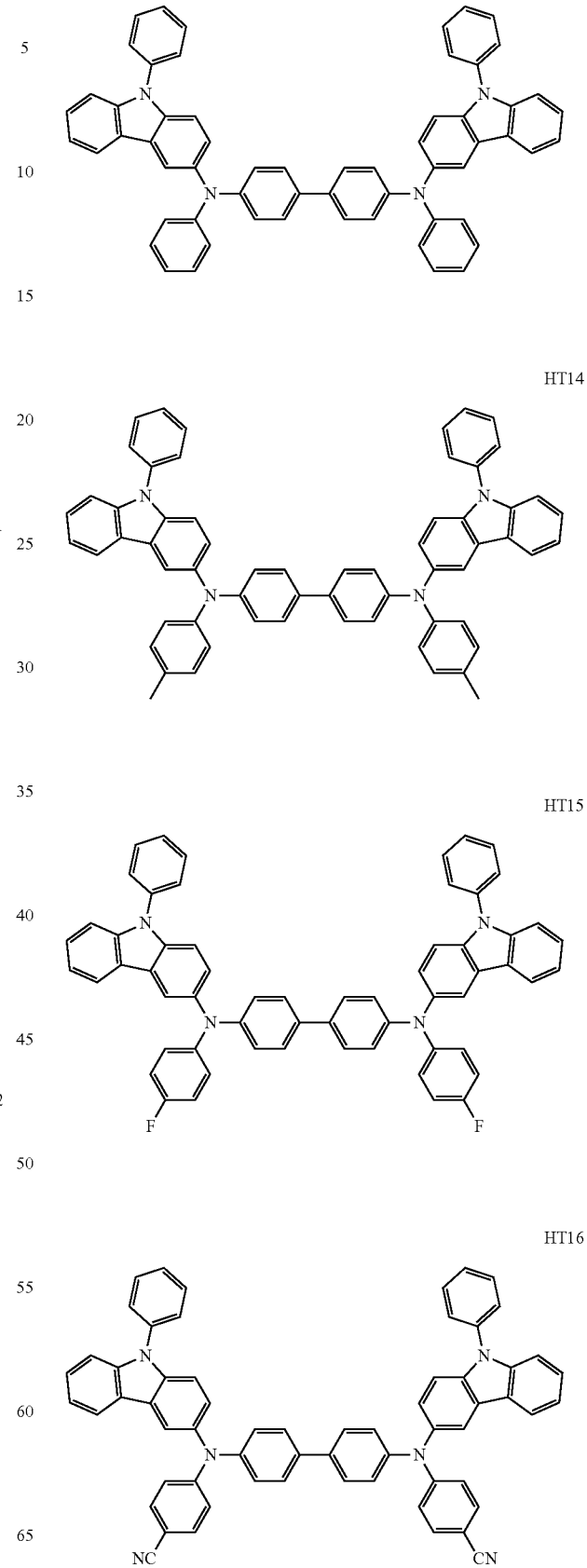

HT17

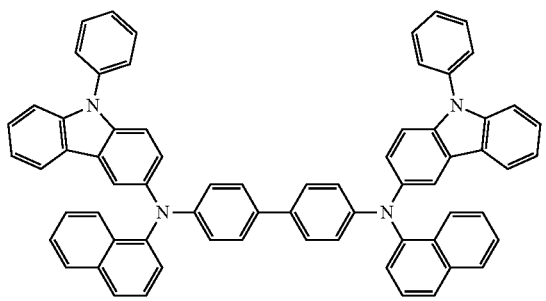

HT18

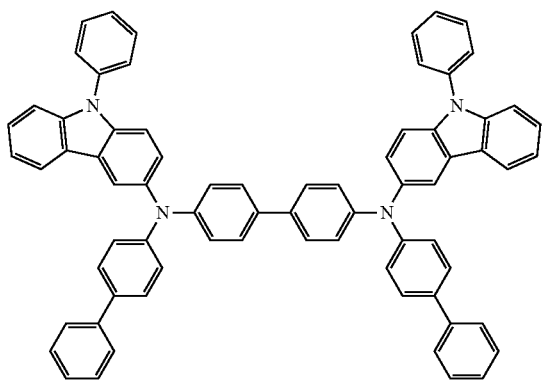

HT19

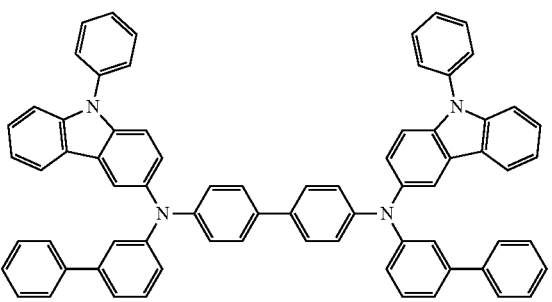

HT20

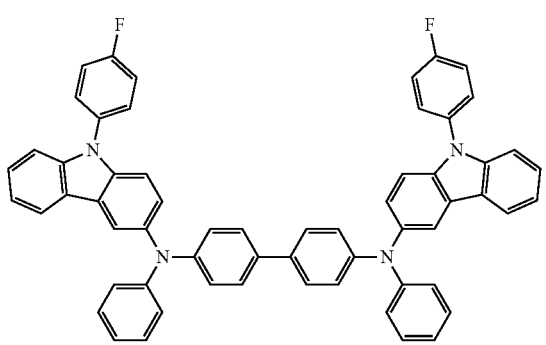

HT21

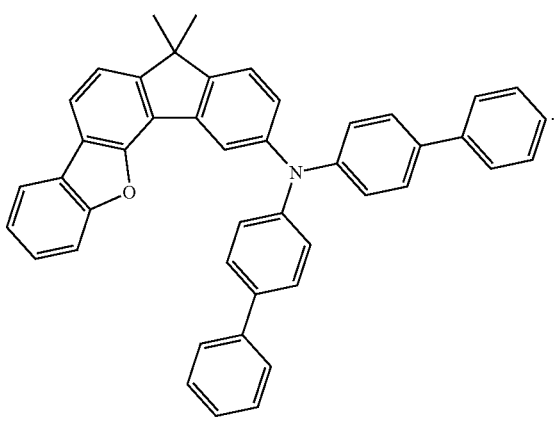

A thickness of the hole transport region may be in a range of about 100 Å to about 10,000 Å, for example, about 100 Å to about 1,000 Å. When the hole transport region includes at least one of a hole injection layer and a hole transport layer, a thickness of the hole injection layer may be in a range of about 100 Å to about 10,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer, and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may include a quinone derivative, a metal oxide, a cyano group-containing compound, or any combination particular, but embodiments of the present disclosure are not limited thereto. For example, the p-dopant may be: a quinone derivative such as tetracyanoquinodimethane (TCNQ), 2,3,5,6-tetrafluoro-tetracyano-1,4-benzoquinonedimethane (F4-TCNQ), or F6-TCNNQ; metal oxide, such as tungsten oxide and molybdenum oxide; a cyano group-containing compound, such as Compound HT-D1 or F12; or any combination thereof.

HT-D1

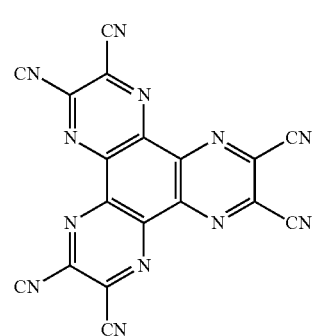

-continued

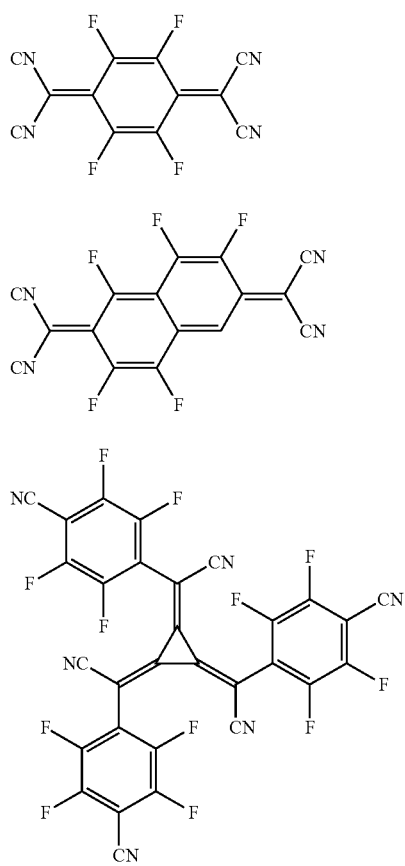

F4-TCNQ

F6-TCNNQ

F12

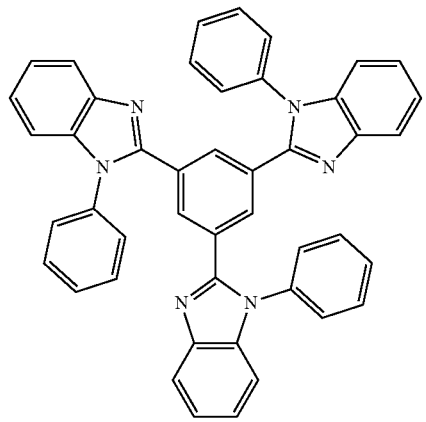

TPBi

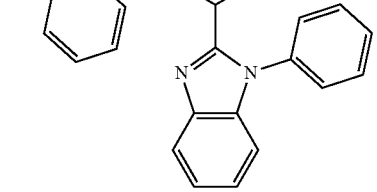

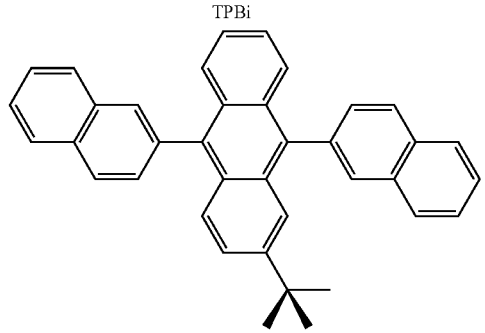

TBADN

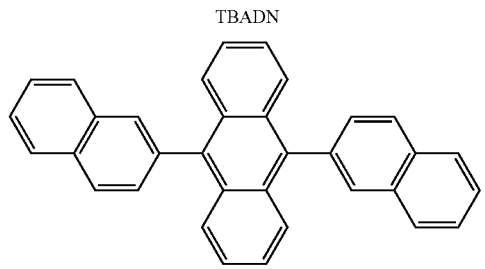

ADN

The hole transport region may include a buffer layer.

Also, the buffer layer may compensate for an optical resonance distance according to a wavelength of light emitted from the emission layer, and thus, efficiency of a formed organic light-emitting device may be improved.

Meanwhile, when the hole transport region includes an electron blocking layer, a material for forming the electron blocking layer may include a material that is used in the hole transport region as described above, a host material described below, or any combination thereof. For example, when the hole transport region includes an electron blocking layer, mCP, Compound HT21, or any combination may be used as the material for forming the electron blocking layer.

Then, the emission layer may be formed on the hole transport region by vacuum deposition, spin coating, casting, LB deposition, or the like. When the emission layer is formed by vacuum deposition or spin coating, the deposition or coating conditions may be similar to those applied in forming the hole injection layer although the deposition or coating conditions may vary according to a material that is used to form the hole transport layer.

The emission layer may include a host and a dopant, and the dopant may include the organometallic compound represented by Formula 1 as described herein.

The host may include TPBi, TBADN, ADN (also referred to as "DNA"), CBP, CDBP, TCP, mCP, Compound H50, Compound H51, Compound H52, Compound 53, Compound 54, or any combination thereof:

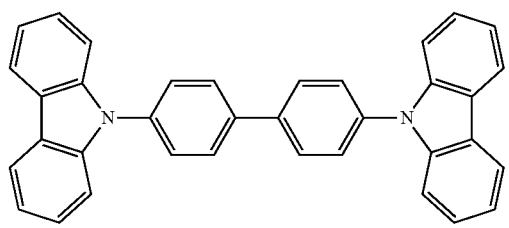

CBP

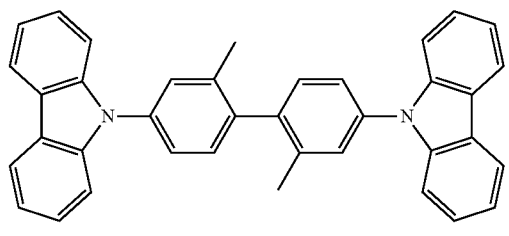

CDBP

-continued
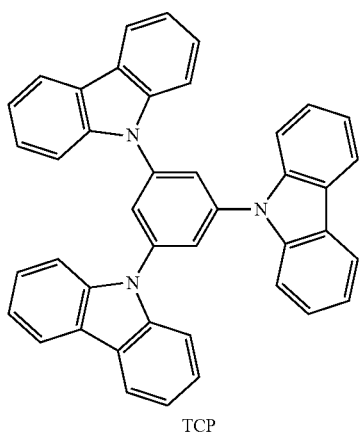
TCP
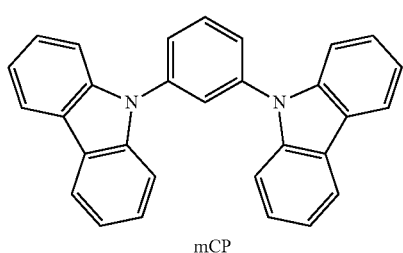
mCP
H50
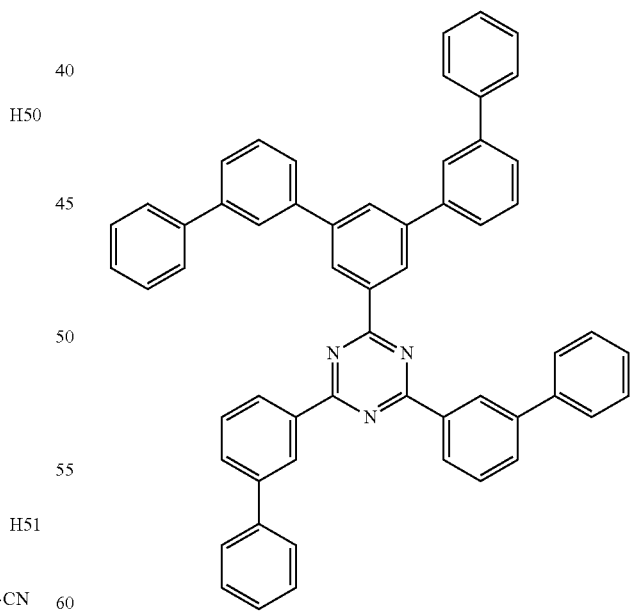
H51
-continued
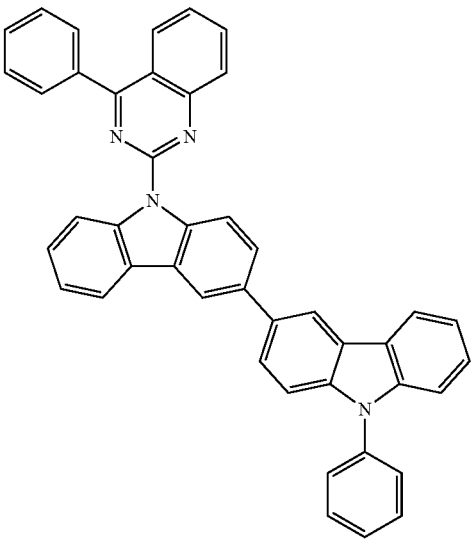
H52
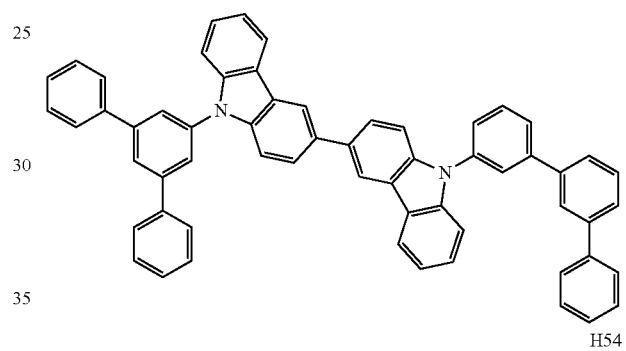
H53
H54
In one or more embodiments, when the organic light-emitting device is a full-color organic light-emitting device, the emission layer may be patterned into a red emission layer, a green emission layer, and/or a blue emission layer. In one or more embodiments, due to a stacked structure including a red emission layer, a green emission layer, and/or a blue emission layer, the emission layer may emit white light.

When the emission layer includes a host and a dopant, an amount of the dopant may be in a range of about 0.01 parts by weight to about 15 parts by weight based on 100 parts by weight of the host, but embodiments of the present disclosure are not limited thereto.

A thickness of the emission layer may be in a range of about 100 Å to about 1,000 Å, for example, about 200 Å to about 600 Å. When the thickness of the emission layer is within these ranges, excellent light-emission characteristics may be obtained without a substantial increase in driving voltage.

Then, an electron transport region may be arranged on the emission layer.

The electron transport region may include a hole blocking layer, an electron transport layer, an electron injection layer, or any combination thereof.

For example, the electron transport region may have a hole blocking layer/electron transport layer/electron injection layer structure or an electron transport layer/electron injection layer structure. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, at least one of BCP, Bphen, and BAlq.

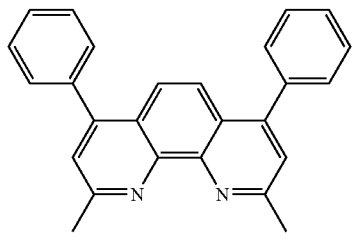

BCP

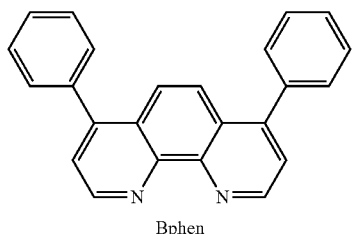

Bphen

The hole blocking layer may include the host, a material for forming an electron transport layer, a material for forming an electron injection layer, which will be described later, or any combination thereof.

A thickness of the hole blocking layer may be in a range of about 20 Å to about 1,000 Å, for example, about 30 Å to about 600 Å. When the thickness of the hole blocking layer is within these ranges, excellent hole blocking characteristics may be obtained without a substantial increase in driving voltage.

In one or more embodiments, the electron transport layer may include BCP, Bphen, TPBi, Alq$_3$, BAlq, TAZ, NTAZ, or any combination thereof:

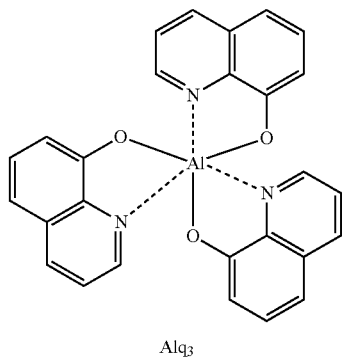

Alq$_3$

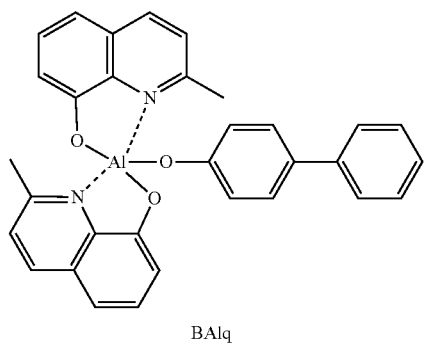

BAlq

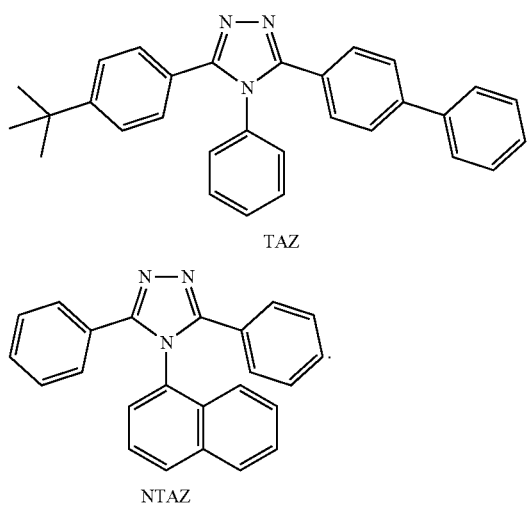

TAZ

NTAZ

In one or more embodiments, the electron transport layer may include at least one of Compounds ET1 to ET25, or any combination thereof:

-continued
ET1
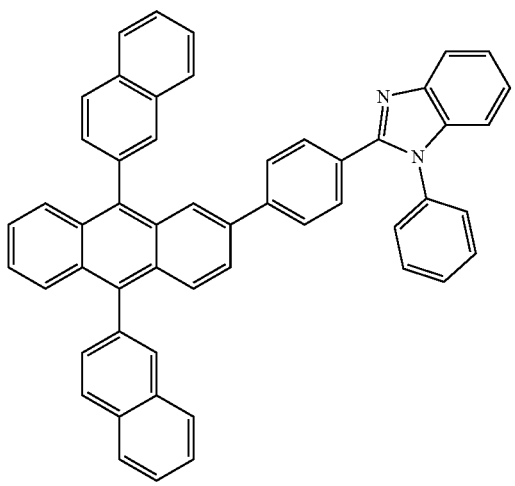
ET4
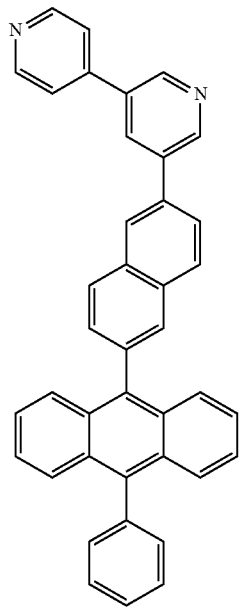
ET2
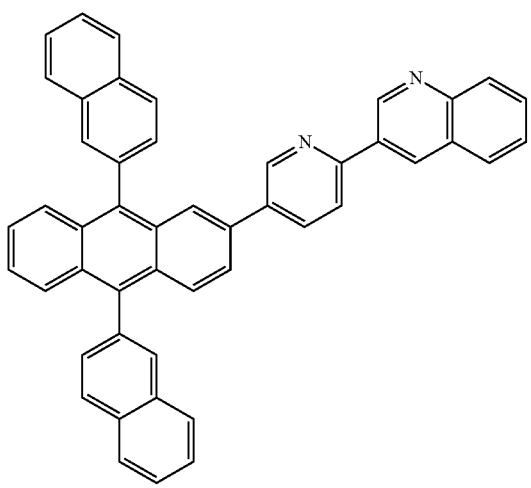
ET5
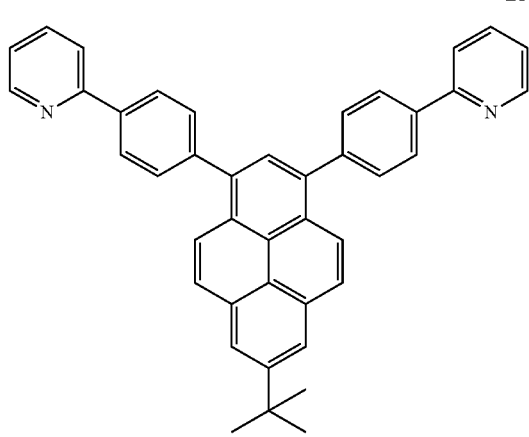
ET3
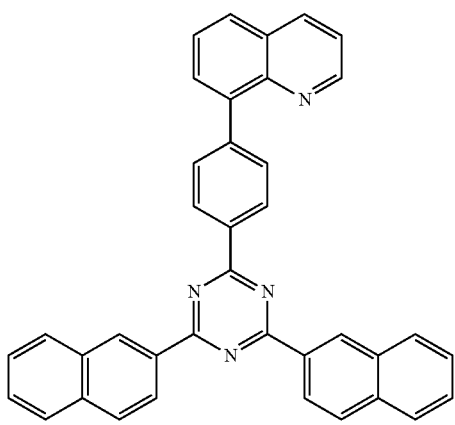
ET6
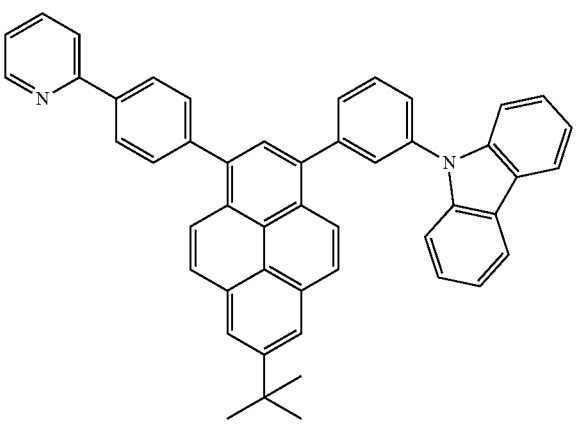

ET7
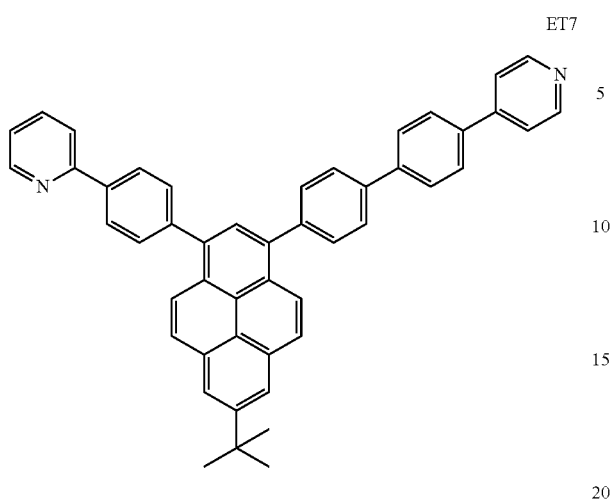
ET10
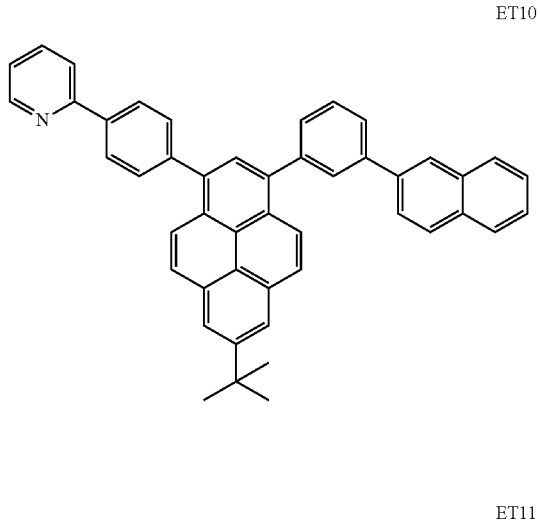
ET8
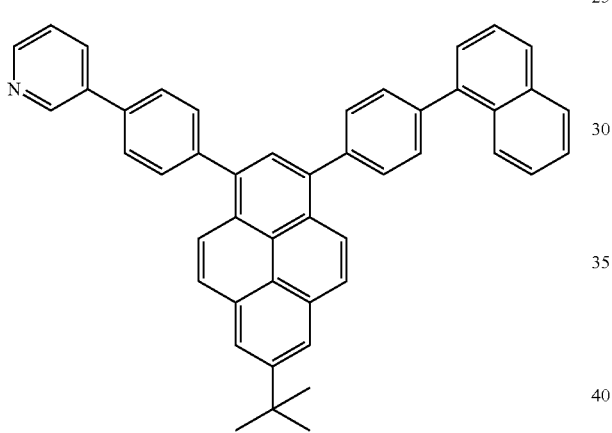
ET11
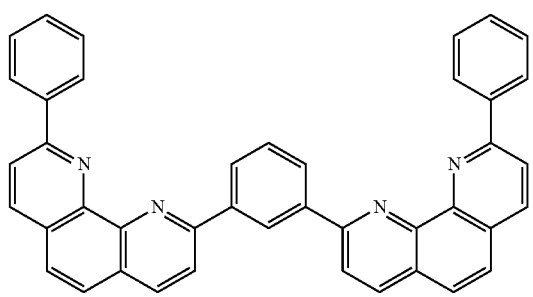
ET12
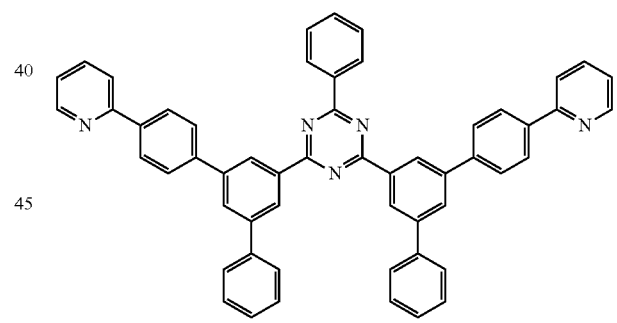
ET9
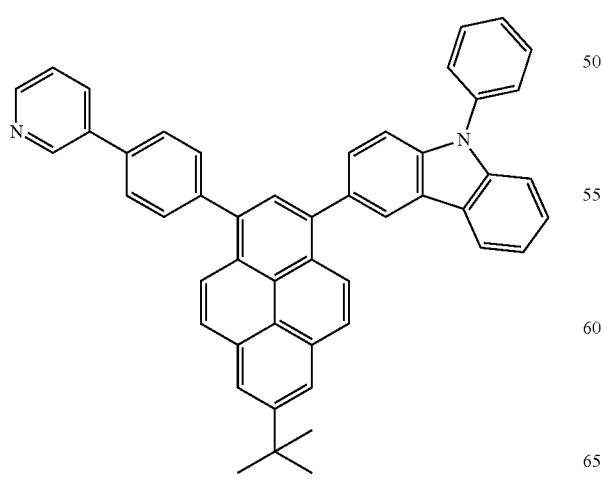
ET13
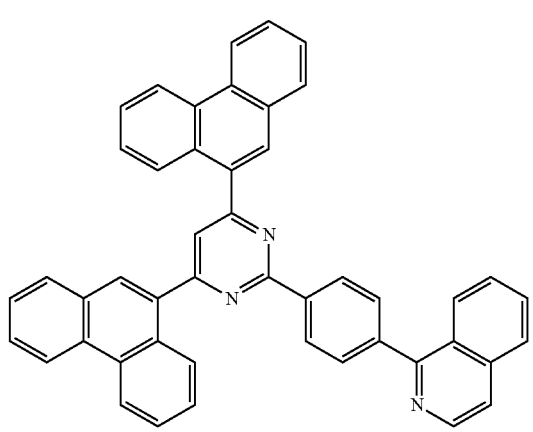

ET14
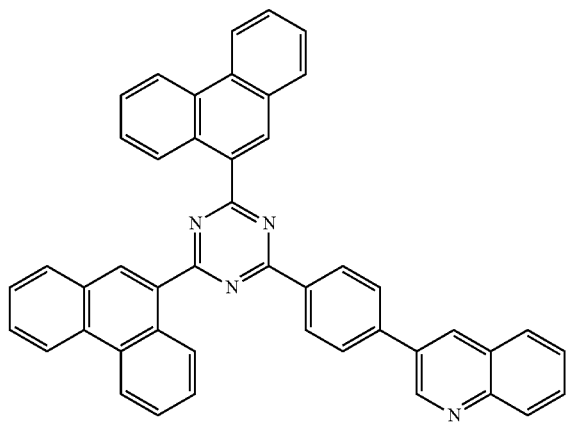
ET15
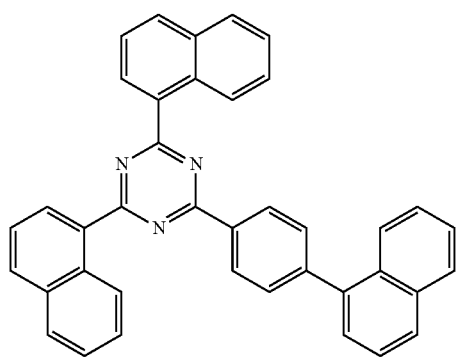
ET16
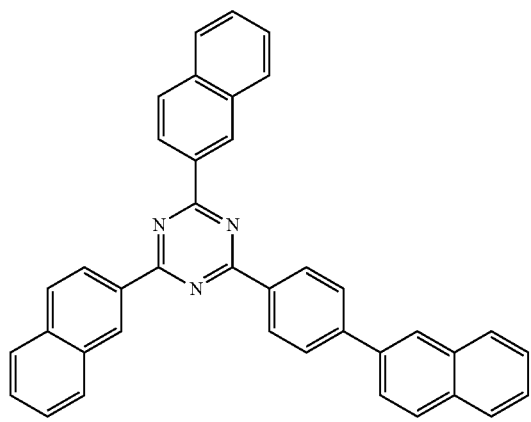
ET17
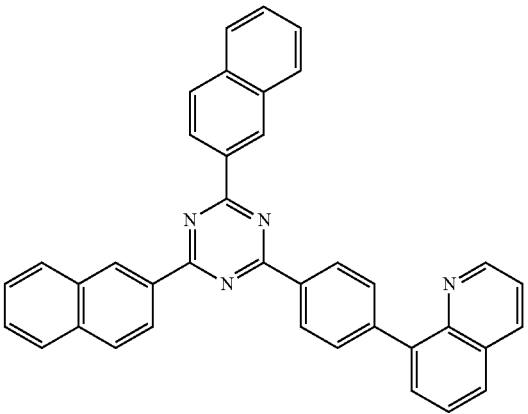
ET18
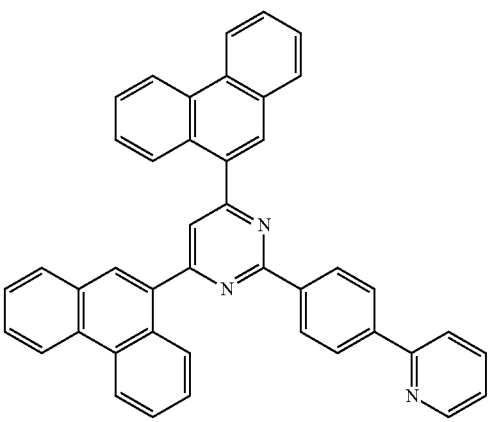
ET19
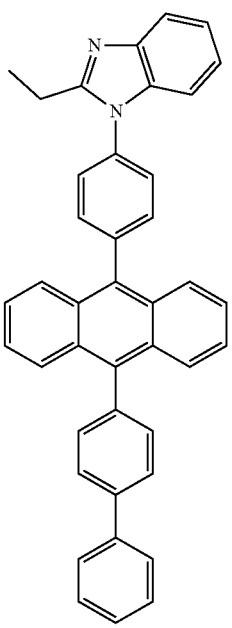

ET20
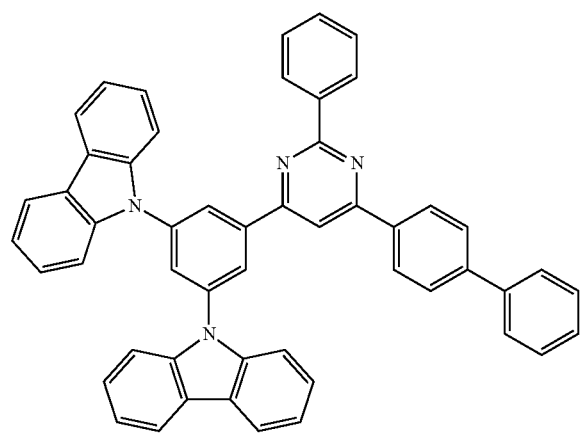
ET21
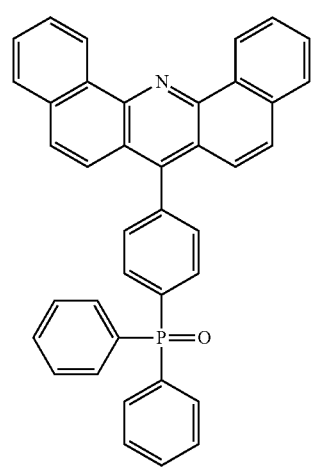
ET22
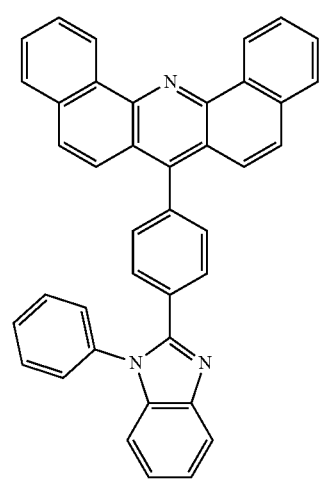
ET23
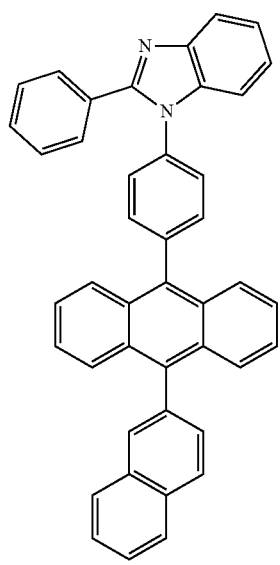
ET24
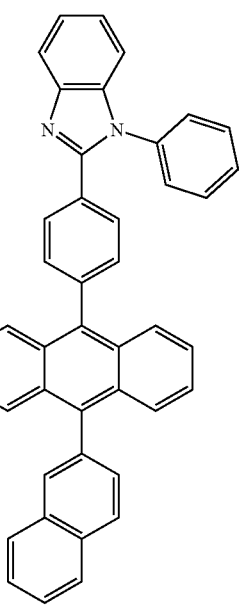
ET25
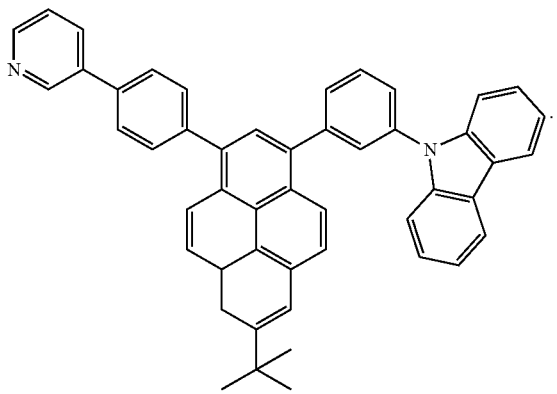
A thickness of the electron transport layer may be in a range of about 100 Å to about 1,000 Å, for example, about 150 Å to about 500 Å. When the thickness of the electron transport layer is within these ranges, satisfactory electron transport characteristics may be obtained without a substantial increase in driving voltage.

Also, the electron transport layer may further include, in addition to the materials described above, a metal-containing material.

The metal-containing material may include a Li complex. The Li complex may include, for example, Compound ET-D1 or ET-D2:

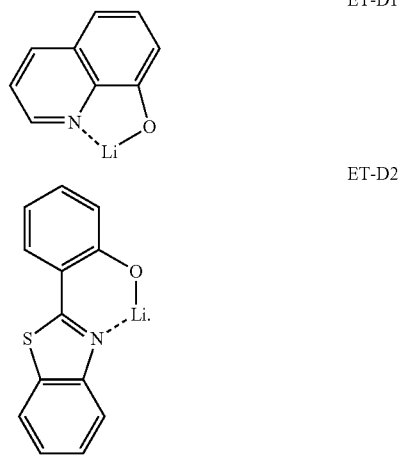

ET-D1

ET-D2

In addition, the electron transport region may include an electron injection layer that promotes the flow of electrons from the second electrode 19 thereinto.

The electron injection layer may include LiF, NaCl, CsF, $Li_2O$, BaO, or any combination thereof.

A thickness of the electron injection layer may be in a range of about 1 Å to about 100 Å, and, for example, about 3 Å to about 90 Å. When the thickness of the electron injection layer is within these ranges, satisfactory electron injection characteristics may be obtained without a substantial increase in driving voltage.

The second electrode 19 is arranged on the organic layer 15. The second electrode 19 may be a cathode. A material for forming the second electrode 19 may be metal, an alloy, an electrically conductive compound, or a combination thereof, which have a relatively low work function. For example, the material for forming the second electrode 19 may be lithium (Li), magnesium (Mg), aluminum (Al), aluminum-lithium (Al—Li), calcium (Ca), magnesium-indium (Mg—In), or magnesium-silver (Mg—Ag).

To manufacture a top-emission type light-emitting device, a transmissive electrode formed using ITO or IZO may be used as the material for forming the second electrode 19.

Hereinbefore, the organic light-emitting device has been described with reference to the FIGURE, but embodiments of the present disclosure are not limited thereto.

In one or more embodiments, the organic light-emitting device may be included in an electronic apparatus. Thus, another aspect of the present disclosure provides an electronic apparatus including the organic light-emitting device. The electronic apparatus may include, for example, a display, an illumination, a sensor, and the like.

Another aspect of the present disclosure provides a diagnostic composition including at least one organometallic compound represented by Formula 1.

The organometallic compound represented by Formula 1 provides high luminescent efficiency. Accordingly, the diagnostic composition including the organometallic compound may have high diagnostic efficiency.

The diagnostic composition may be used in various applications including a diagnosis kit, a diagnosis reagent, a biosensor, and a biomarker.

The term "$C_1$-$C_{60}$ alkyl group" as used herein refers to a linear or branched saturated aliphatic hydrocarbons monovalent group having 1 to 60 carbon atoms, and the term "$C_1$-$C_{60}$ alkylene group" as used here refers to a divalent group having the same structure as the $C_1$-$C_{60}$ alkyl group.

Examples of the $C_1$-$C_{60}$ alkyl group, the $C_1$-$C_{20}$ alkyl group, and/or the $C_1$-$C_{10}$ alkyl group are a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, or a tert-decyl group, each unsubstituted or substituted with a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, or any combination thereof. For example, Formula 9-33 is a branched C alkyl group, for example, a tert-butyl group that is substituted with two methyl groups.

The term "$C_1$-$C_{60}$ alkoxy group" as used herein refers to a monovalent group represented by —$OA_{101}$ (wherein $A_{101}$ is the $C_1$-$C_{60}$ alkyl group), and examples thereof are a methoxy group, an ethoxy group, a propoxy group, a butoxy group, and a pentoxy group.

The term "$C_2$-$C_{60}$ alkenyl group" as used herein refers to a hydrocarbon group formed by substituting at least one carbon-carbon double bond in the middle or at the terminus of the $C_2$-$C_{60}$ alkyl group, and examples thereof are an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group formed by substituting at least one carbon-carbon triple bond in the middle or at the terminus of the $C_2$-$C_{60}$ alkyl group, and examples thereof are an ethynyl group and a propynyl group. The term "$C_1$-$C_6$ alkynylene group" as used herein refers to a divalent group having the same structure as the $C_1$-$C_{60}$ alkynyl group.

The term "$C_3$-$C_{10}$ cycloalkyl group" as used herein refers to a monovalent saturated hydrocarbon monocyclic group having 3 to 10 carbon atoms, and the term "$C_3$-$C_{10}$ cycloalkylene group" as used herein refers to a divalent group having the same structure as the $C_3$-$C_{10}$ cycloalkyl group.

Examples of the $C_3$-$C_{10}$ cycloalkyl group are a cyclopropyl group, a cyclobutyl group, a cyclopentyl group, a cyclohexyl group, a cycloheptyl group, a cyclooctyl group, an adamantanyl group, a bicyclo[1.1.1]pentyl group, a bicyclo[2.1.1]hexyl group, a bicyclo[2.2.1]heptyl(norbornanyl) group, a bicyclo[2.2.2]octyl group, and the like.

The term "$C_1$-$C_{10}$ heterocycloalkyl group" as used herein refers to a monocyclic group that includes at least one heteroatom selected from N, O, P, Si and S as a ring-forming atom and 1 to 10 carbon atoms, and the term "$C_1$-$C_{10}$ heterocycloalkylene group" as used herein refers to a divalent group having the same structure as the $C_1$-$C_{10}$ heterocycloalkyl group.

Examples of the $C_1$-$C_{10}$ heterocycloalkyl group are a silolanyl group, a silinanyl group, tetrahydrofuranyl group, a tetrahydro-2H-pyranyl group, and a tetrahydrothiophenyl group.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and examples thereof are a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, P, Si, and S as a ring-forming atom, 1 to 10 carbon atoms, and at least one carbon-carbon double bond in its ring. Examples of the $C_1$-$C_{10}$ heterocycloalkenyl group are a 2,3-dihydrofuranyl group and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Examples of the $C_6$-$C_{60}$ aryl group are a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the two or more rings may be fused to each other.

The term "$C_7$-$C_{60}$ alkylaryl group" as used herein refers to a $C_6$-$C_{60}$ aryl group substituted with at least one $C_1$-$C_{60}$ alkyl group.

The term "$C_1$-$C_6$ heteroaryl group" as used herein refers to a monovalent group having at least one hetero atom selected from N, O, P, Si, and S as a ring-forming atom and a cyclic aromatic system having 1 to 60 carbon atoms, and the term "$C_1$-$C_{60}$ heteroarylene group" as used herein refers to a divalent group having at least one hetero atom selected from N, O, P, Si, and S as a ring-forming atom and a carbocyclic aromatic system having 1 to 60 carbon atoms. Examples of the $C_1$-$C_{60}$ heteroaryl group are a pyridinyl group, a pyrimidinyl group, a pyrazinyl group, a pyridazinyl group, a triazinyl group, a quinolinyl group, and an isoquinolinyl group.

When the $C_6$-$C_{60}$ heteroaryl group and the $C_6$-$C_{60}$ heteroarylene group each include two or more rings, the two or more rings may be fused to each other.

The term "$C_2$-$C_{60}$ alkylheteroaryl group" used herein refers to a $C_1$-$C_{60}$ heteroaryl group substituted with at least one $C_1$-$C_{60}$ alkyl group.

The term "$C_6$-$C_{60}$ aryloxy group" as used herein indicates —$OA_{102}$ (wherein $A_{102}$ indicates the $C_6$-$C_{60}$ aryl group), the term "$C_6$-$C_{60}$ arylthio group" as used herein indicates —$SA_{103}$ (wherein $A_{103}$ indicates the $C_6$-$C_{60}$ aryl group), and the term "$C_1$-$C_6$ alkylthio group" as used herein indicates —$SA_{104}$ (wherein $A_{104}$ indicates the $C_1$-$C_{60}$ alkyl group).

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. An example of the monovalent non-aromatic condensed polycyclic group is a fluorenyl group. The term "divalent non-aromatic condensed polycyclic group" as used herein refers to a divalent group having the same structure as a monovalent non-aromatic condensed polycyclic group.

The term "monovalent non-aromatic condensed heteropolycyclic group" as used herein refers to a monovalent group (for example, having 2 to 60 carbon atoms) having two or more rings condensed to each other, a heteroatom selected from N, O, P, Si, and S, other than carbon atoms, as a ring-forming atom, and no aromaticity in its entire molecular structure. An example of the monovalent non-aromatic condensed heteropolycyclic group is a carbazolyl group. The term "divalent non-aromatic heterocondensed polycyclic group" as used herein refers to a divalent group having the same structure as a monovalent non-aromatic heterocondensed polycyclic group.

The term "$C_5$-$C_{30}$ carbocyclic group" as used herein refers to a saturated or unsaturated cyclic group having, as a ring-forming atom, 5 to 30 carbon atoms only.

The $C_5$-$C_{30}$ carbocyclic group may be a monocyclic group or a polycyclic group.

Examples of the "$C_5$-$C_{30}$ carbocyclic group (unsubstituted or substituted with at least one $R_{1a}$)" are an adamantane group, a norbornene group, a bicyclo[1.1.1]pentane group, a bicyclo[2.1.1]hexane group, a bicyclo[2.2.1]heptane(norbornane) group, a bicyclo[2.2.2]octane group, a cyclopentane group, a cyclohexane group, a cyclohexene group, a benzene group, a naphthalene group, an anthracene group, a phenanthrene group, a triphenylene group, a pyrene group, a chrysene group, a 1,2,3,4-tetrahydronaphthalene group, a cyclopentadiene group, a silole group, and a fluorene group (each unsubstituted or substituted with at least one $R_{1a}$).

The term "$C_1$-$C_{30}$ heterocyclic group" as used herein refers to a saturated or unsaturated cyclic group having, as a ring-forming atom, at least one heteroatom selected from N, O, P, Si, Se, Ge, B, and S other than 1 to 30 carbon atoms. The $C_1$-$C_{60}$ heterocyclic group may be a monocyclic group or a polycyclic group. Examples of the "$C_1$-$C_{30}$ heterocyclic group (unsubstituted or substituted with at least one $R_{1a}$)" are a thiophene group, a furan group, a pyrrole group, a silole group, borole group, a phosphole group, a selenophene group, a germole group, a benzothiophene group, a benzofuran group, an indole group, an indene group, a benzosilole group, a benzoborole group, a benzophosphole group, a benzoselenophene group, a benzogermole group, a dibenzothiophene group, a dibenzofuran group, a carbazole group, a dibenzosilole group, a dibenzoborole group, a dibenzophosphole group, a dibenzoselenophene group, a dibenzogermole group, a dibenzothiophene 5-oxide group, a 9H-fluoren-9-one group, a dibenzothiophene 5,5-dioxide group, an azabenzothiophene group, an azabenzofuran group, an azaindole group, an azaindene group, an azabenzosilole group, an azabenzoborole group, an azabenzophosphole group, an azabenzoselenophene group, an azabenzogermole group, an azadibenzothiophene group, an azadibenzofuran group, an azacarbazole group, an azafluorene group, an azadibenzosilole group, an azadibenzoborole group, an azadibenzophosphole group, an azadibenzoselenophene group, an azadibenzogermole group, an azadibenzothiophene 5-oxide group, an aza-9H-fluoren-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, and a 5,6,7,8-tetrahydroquinoline group (each unsubstituted or substituted with at least one $R_{1a}$).

The terms "fluorinated $C_1$-$C_{60}$ alkyl group (or a fluorinated $C_1$-$C_{20}$ alkyl group or the like)", "fluorinated $C_3$-$C_{10}$ cycloalkyl group", "fluorinated $C_1$-$C_{10}$ heterocycloalkyl group," and "fluorinated phenyl group" respectively indicate a $C_1$-$C_{60}$ alkyl group (or a $C_1$-$C_{20}$ alkyl group or the like), a $C_3$-$C_{10}$ cycloalkyl group, a $C_1$-$C_{10}$ heterocycloalkyl group, and a phenyl group, each substituted with at least one fluoro group (—F). For example, the "fluorinated $C_1$ alkyl group (that is, the fluorinated methyl group)" may include —$CF_3$, —$CF_2H$, and —$CFH_2$. The "fluorinated $C_1$-$C_{60}$ alkyl group (or, a fluorinated $C_1$-$C_{20}$ alkyl group, or the like)", "the fluorinated $C_3$-$C_{10}$ cycloalkyl group", "the fluorinated $C_1$-$C_{10}$ heterocycloalkyl group", or "the fluorinated a phenyl group" may be i) a fully fluorinated $C_1$-$C_{60}$ alkyl group (or, a fully fluorinated $C_1$-$C_{20}$ alkyl group, or the like), a fully fluorinated $C_3$-$C_{10}$ cycloalkyl group, a fully fluorinated $C_1$-$C_{10}$ heterocycloalkyl group, or a fully fluorinated phenyl group, wherein, in each group, all hydrogen included therein is substituted with a fluoro group, or ii) a partially fluorinated $C_1$-$C_{60}$ alkyl group (or, a partially fluorinated $C_1$-$C_{20}$ alkyl group, or the like), a partially fluorinated $C_3$-$C_{10}$ cycloalkyl group, a partially fluorinated $C_1$-$C_{10}$ heterocycloalkyl group, or partially fluorinated phenyl group, wherein, in each group, each hydrogen included therein is not substituted with a fluoro group.

The terms "deuterated $C_1$-$C_{60}$ alkyl group (or a deuterated $C_1$-$C_{20}$ alkyl group or the like)", "deuterated $C_3$-$C_{10}$ cycloalkyl group", "deuterated $C_1$-$C_{10}$ heterocycloalkyl group," and "deuterated phenyl group" respectively indicate a $C_1$-$C_{60}$ alkyl group (or a $C_1$-$C_{20}$ alkyl group or the like), a $C_3$-$C_{10}$ cycloalkyl group, a $C_1$-$C_{10}$ heterocycloalkyl group, and a phenyl group, each substituted with at least one deuterium. For example, the "deuterated $C_1$ alkyl group (that is, the deuterated methyl group)" may include —$CD_3$, —$CD_2H$, and —$CDH_2$, and examples of the "deuterated $C_3$-$C_{10}$ cycloalkyl group" are, for example, Formula 10-501 and the like. The "deuterated $C_1$-$C_{60}$ alkyl group (or, the deuterated $C_1$-$C_{20}$ alkyl group or the like)", "the deuterated $C_3$-$C_{10}$ cycloalkyl group", "the deuterated $C_1$-$C_{10}$ heterocycloalkyl group", or "the deuterated phenyl group" may be i) a fully deuterated $C_1$-$C_{60}$ alkyl group (or, a fully deuterated $C_1$-$C_{20}$ alkyl group or the like), a fully deuterated $C_3$-$C_{10}$ cycloalkyl group, a fully deuterated $C_1$-$C_{10}$ heterocycloalkyl group, or a fully deuterated phenyl group, in which, in each group, all hydrogen included therein are substituted with deuterium, or ii) a partially deuterated $C_1$-$C_{60}$ alkyl group (or, a partially deuterated $C_1$-$C_{20}$ alkyl group or the like), a partially deuterated $C_3$-$C_{10}$ cycloalkyl group, a partially deuterated $C_1$-$C_{10}$ heterocycloalkyl group, or a partially deuterated phenyl group, in which, in each group, each hydrogen included therein is not substituted with deuterium.

The term "($C_1$-$C_{20}$ alkyl) 'X' group" as used herein refers to a 'X' group that is substituted with at least one $C_1$-$C_{20}$ alkyl group. For example, the term "($C_1$-$C_{20}$ alkyl)$C_3$-$C_{10}$ cycloalkyl group" as used herein refers to a $C_3$-$C_{10}$ cycloalkyl group substituted with at least one $C_1$-$C_{20}$ alkyl group, and the term "($C_1$-$C_{20}$ alkyl)phenyl group" as used herein refers to a phenyl group substituted with at least one $C_1$-$C_{20}$ alkyl group. An example of a ($C_1$ alkyl) phenyl group is a toluyl group.

The terms "an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluoren-9-one group, an azadibenzothiophene group, or a 5,5-dioxide group" as used herein respectively refer to heterocyclic groups having the same backbones as "an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluoren-9-one group, a dibenzothiophene group, or a 5,5-dioxide group," in which, in each group, at least one carbon selected from ring-forming carbons is substituted with nitrogen.

At least one substituent of the substituted $C_5$-$C_{30}$ carbocyclic group, the substituted $C_2$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkylaryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted $C_2$-$C_{60}$ alkylheteroaryl group, the substituted $C_2$-$C_{60}$ alkyl heteroaryl group, the substituted monovalent non-aromatic condensed polycyclic group, and the substituted monovalent non-aromatic condensed heteropolycyclic group may each independently be:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, substituted with one or more of deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid or a salt thereof, a sulfonic acid or a salt thereof, a phosphoric acid or a salt thereof, a C$_3$-C$_{10}$ cycloalkyl group, a C$_1$-C$_{10}$ heterocycloalkyl group, a C$_3$-C$_{10}$ cycloalkenyl group, a C$_1$-C$_{10}$ heterocycloalkenyl group, a C$_6$-C$_{60}$ aryl group, a C$_7$-C$_{60}$ alkyl aryl group, a C$_6$-C$_{60}$ aryloxy group, a C$_6$-C$_{60}$ arylthio group, a C$_7$-C$_{60}$ arylalkyl group, a C$_1$-C$_{60}$ heteroaryl group, a C$_1$-C$_{60}$ heteroaryloxy group, a C$_1$-C$_{60}$ heteroarylthio group, a C$_2$-C$_{60}$ heteroarylalkyl group, a C$_2$-C$_{60}$ alkylheteroaryl group, a monovalent non-aromatic condensed polycyclic group, a monovalent non-aromatic condensed heteropolycyclic group, —N(Q$_{11}$)(Q$_{12}$), —Si(Q$_{13}$)(Q$_{14}$)(Q$_{15}$), —Ge(Q$_{13}$)(Q$_{14}$)(Q$_{15}$), —B(Q$_{16}$)(Q$_{17}$), —P(=O)(Q$_{18}$)(Q$_{19}$), or —P(Q$_{18}$)(Q$_{19}$);

a C$_3$-C$_{10}$ cycloalkyl group, a C$_1$-C$_{10}$ heterocycloalkyl group, a C$_3$-C$_{10}$ cycloalkenyl group, a C$_1$-C$_{10}$ heterocycloalkenyl group, a C$_6$-C$_{60}$ aryl group, a C$_7$-C$_{60}$ alkyl aryl group, a C$_6$-C$_{60}$ aryloxy group, a C$_6$-C$_{60}$ arylthio group, a C$_7$-C$_{60}$ arylalkyl group, a C$_1$-C$_{60}$ heteroaryl group, a C$_1$-C$_{60}$ heteroaryloxy group, a C$_1$-C$_{60}$ heteroarylthio group, a C$_2$-C$_{60}$ heteroarylalkyl group, a C$_2$-C$_{60}$ alkylheteroaryl group, a monovalent non-aromatic condensed polycyclic group, or a monovalent non-aromatic condensed heteropolycyclic group, each unsubstituted or substituted with one or more of deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid or a salt thereof, a sulfonic acid or a salt thereof, a phosphoric acid or a salt thereof, a C$_1$-C$_{60}$ alkyl group, a C$_2$-C$_{60}$ alkenyl group, a C$_2$-C$_{60}$ alkynyl group, a C$_1$-C$_{60}$ alkoxy group, a C$_1$-C$_{60}$ alkylthio group C$_3$-C$_{10}$ cycloalkyl group, a C$_1$-C$_{10}$ heterocycloalkyl group, a C$_3$-C$_{10}$ cycloalkenyl group, a C$_1$-C$_{10}$ heterocycloalkenyl group, a C$_6$-C$_{60}$ aryl group, a C$_7$-C$_{60}$ alkyl aryl group, a C$_6$-C$_{60}$ aryloxy group, a C$_6$-C$_{60}$ arylthio group, a C$_7$-C$_{60}$ arylalkyl group, a C$_1$-C$_{60}$ heteroaryl group, a C$_1$-C$_{60}$ heteroaryloxy group, a C$_1$-C$_{60}$ heteroarylthio group, a C$_2$-C$_{60}$ heteroarylalkyl group, a C$_2$-C$_{60}$ alkylheteroaryl group, a monovalent non-aromatic condensed polycyclic group, a monovalent non-aromatic condensed heteropolycyclic group, —N(Q$_{21}$)(Q$_{22}$), —Si(Q$_{23}$)(Q$_{24}$)(Q$_{25}$), —Ge(Q$_{23}$)(Q$_{24}$)(Q$_{25}$), —B(Q$_{26}$)(Q$_{27}$), —P(=O)(Q$_{28}$)(Q$_{29}$), or —P(Q$_{28}$)(Q$_{29}$); —N(Q$_{31}$)(Q$_{32}$), —Si(Q$_{33}$)(Q$_{34}$)(Q$_{35}$), —Ge(Q$_{33}$)(Q$_{34}$)(Q$_{35}$), —B(Q$_{36}$)(Q$_{37}$), —P(=O)(Q$_{38}$)(Q$_{39}$), or —P(Q$_{38}$)(Q$_{39}$); or any combination thereof.

In the present specification, Q$_1$ to Q$_9$, Q$_{11}$ to Q$_{19}$, Q$_{21}$ to Q$_{29}$, and Q$_{31}$ to Q$_{39}$ may each independently be: hydrogen; deuterium; —F; —Cl; —Br; —I; a hydroxyl group; a cyano group; a nitro group; an amidino group; a hydrazine group; a hydrazone group; a carboxylic acid or a salt thereof; a sulfonic acid or a salt thereof; a phosphoric acid or a salt thereof; a C$_1$-C$_{60}$ alkyl group which is unsubstituted or substituted with deuterium, a C$_1$-C$_{60}$ alkyl group, a C$_6$-C$_{60}$ aryl group, or any combination thereof; a C$_2$-C$_{60}$ alkenyl group; a C$_2$-C$_{60}$ alkynyl group; a C$_1$-C$_{60}$ alkoxy group; a C$_1$-C$_{60}$ alkylthio group; a C$_3$-C$_{10}$ cycloalkyl group; a C$_1$-C$_{10}$ heterocycloalkyl group; a C$_3$-C$_{10}$ cycloalkenyl group; a C$_1$-C$_{10}$ heterocycloalkenyl group; a C$_6$-C$_{60}$ aryl group which is unsubstituted or substituted with deuterium, a C$_1$-C$_{60}$ alkyl group, a C$_6$-C$_{60}$ aryl group, or any combination thereof; a C$_6$-C$_{60}$ aryloxy group; a C$_6$-C$_{60}$ arylthio group; a C$_7$-C$_{60}$ arylalkyl group; a C$_1$-C$_{60}$ heteroaryl group; a C$_1$-C$_{60}$ heteroaryloxy group; a C$_1$-C$_{60}$ heteroarylthio group; a C$_2$-C$_{60}$ heteroarylalkyl group; a C$_2$-C$_{60}$ alkylheteroaryl group; a monovalent non-aromatic condensed polycyclic group; or a monovalent non-aromatic condensed heteropolycyclic group.

For example, Q$_1$ to Q$_9$, Q$_{11}$ to Q$_{19}$, Q$_{21}$ to Q$_{29}$, and Q$_{31}$ to Q$_{39}$ described herein may each independently be:
—CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CD$_2$H, or —CD$_2$CDH$_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, a C$_1$-C$_{10}$ alkyl group, or a phenyl group, or any combination thereof.

Hereinafter, a compound and an organic light-emitting device according to embodiments are described in detail with reference to Synthesis Example and Examples. However, the present disclosure is not limited thereto. The wording "'B' was used instead of 'A'" used in describing Synthesis Examples means that an amount of 'A' used was identical to an amount of 'B' used, in terms of a molar equivalent.

EXAMPLES

Synthesis Example 1: (Synthesis of Compound 1)

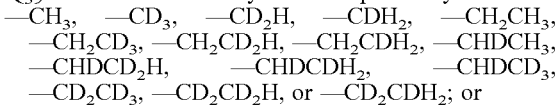

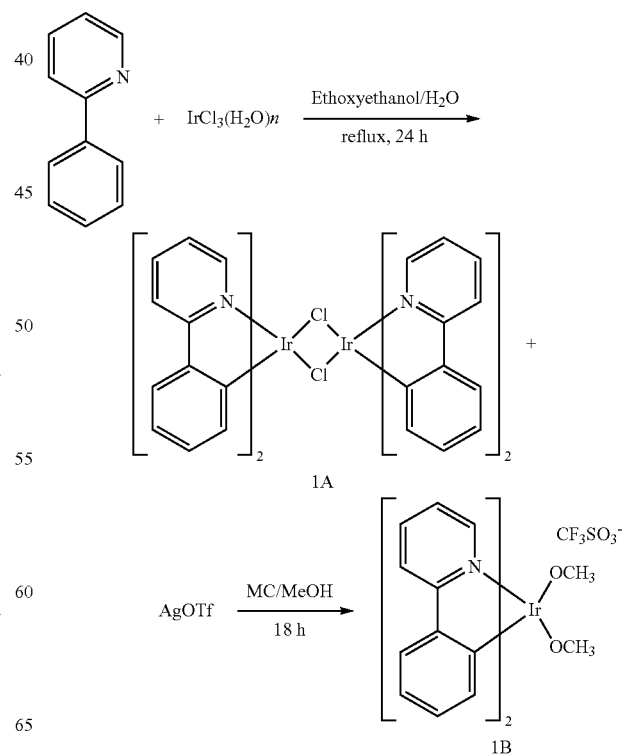

-continued

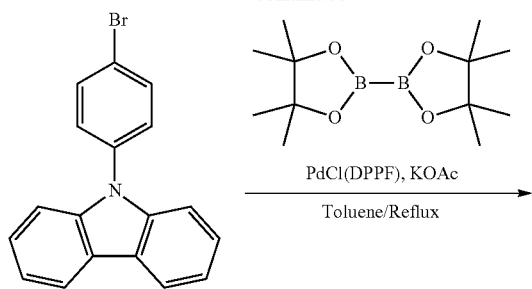

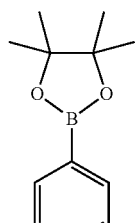

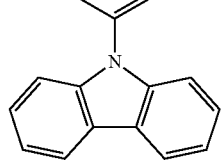

2A

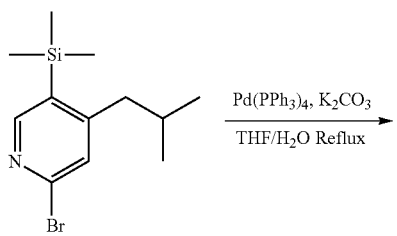

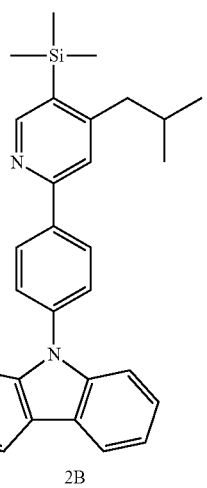

2B

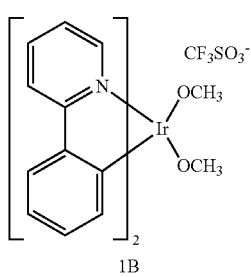

1B

-continued

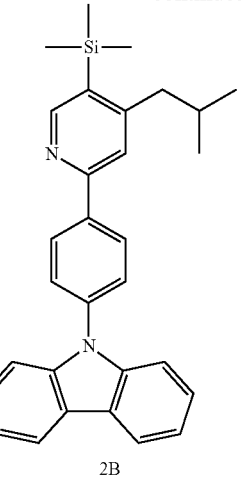

2B

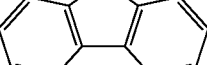

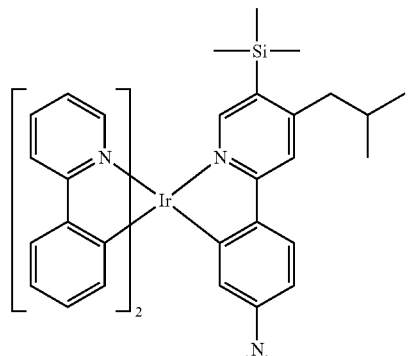

1

(1) Synthesis of Compound 1A 2-phenyl-pyridine (5.2 grams (g), 33.1 millimoles (mmol)) and iridium chloride (5.2 g, 14.7 mmol) were mixed with 120 milliliters (mL) of ethoxyethanol and 40 mL of deionized water (DI water), and the resultant mixed solution was stirred under reflux for 24 hours. Then, the reaction temperature was lowered to room temperature. A solid produced therefrom was separated by filtration, washed thoroughly with water/methanol/hexane in this stated order, and dried in a vacuum oven, so as to obtain 8.2 g (yield of 92%) of Compound 1 Å. Compound 1 Å was used in the next reaction without performing any additional purification process thereon.

(2) Synthesis of Compound 1B

Compound 1 Å (1.6 g, 1.5 mmol) was mixed with 45 mL of methylene chloride, and a mixture of silver triflate (AgOTf) (0.8 g, 3.1 mmol) and 15 mL of methanol were added thereto. Afterwards, the resultant mixed solution was stirred for 18 hours while blocking light with aluminum foil, and then, filtered through celite to remove the resultant solid. The filtrate was decompressed to obtain a solid (Compound 1B), which was used in the next reaction without performing any additional purification process thereon.

(3) Synthesis of Compound 2A

In a nitrogen environment, 9-(4-bromophenyl)-9H-carbazole (1.5 g, 4.66 mmol), bis(pinacolato)diboron (1.54 g, 6.05 mmol), [1,1-bis(diphenylphphineo)-ferrocene]palladium (II) dichloride (0.34 g, 0.47 mmol), and potassium acetate (1.37 g, 13.97 mmol) were added to a 1,4-dioxane/toluene (1:1) solvent and stirred. The mixed solution was stirred in an oil bath at a temperature of 120° C. for 17 hours. After completion of the reaction, the reaction temperature was cooled to room temperature, the solvent was removed, and the obtained solid was subjected to column chromatography (eluent:methylene chloride (MC) and hexane), so as to obtain 1.6 g (yield of 93%) of 9-(4-(4,4,5,5-tetramethyl-1,3,2-dioxoborolane-2-yl)phenyl)-9H-carbazole. The obtained material was identified by HRMS and HPLC analysis.

High resolution mass spectrometry (matrix assisted laser desorption ionization) (HRMS (MALDI)) calcd for $C_{24}H_{24}BNO_2$: m/z: 369.19 Found: 370.23.

(4) Synthesis of Compound 2B

In a nitrogen environment, 2-bromo-4-isobutyl-5-(trimethylsilyl)pyridine (1.5 g, 5.24 mmol) was dissolved in 100 mL of tetrahydrofuran, and 9-(4-(4,4,5,5-tetramethyl-1,3,2-dioxoborolan-2-yl)phenyl)-9H-carbazole (Compound 1 Å) (2.1 g, 5.76 mmol) was added thereto. Potassium carbonate ($K_2CO_3$) (1.7 g, 15.72 mmol) was dissolved in 25 mL of DI water and added to the reaction mixture. A palladium catalyst ($Pd(PPh_3)_4$) (0.6 g, 0.52 mmol) was then added thereto. Then, the resultant reaction mixture was stirred at reflux at a temperature of 80° C. Following an extraction process, the obtained solid was subjected to column chromatography (eluent: MC and hexane), so as to obtain 1.91 g (yield of 92%) of 9-(4-(4-isobutyl-5-(trimethylsilyl)pyridin-2-yl)phenyl)-9H-carbazole. The obtained material was identified by HRMS and high-performance liquid chromatography (HPLC) analysis.

HRMS(MALDI) calcd for $C_{30}H_{32}N_2Si$: m/z: 448.23 Found: 449.69.

(5) Synthesis of Compound 1

Compound 1B (1.5 g, 2.10 mmol) and 9-(4-(4-isobutyl-5-(trimethylsilyl)pyridin-2-yl)phenyl)-9H-carbazole (Compound 2B) (1.0 g, 2.31 mmol) were mixed with 40 mL of 2-ethoxyethanol, and the resultant mixed solution was stirred at a temperature of 110° C. for 24 hours. Then, the reaction temperature was reduced. The resultant mixture was decompressed, and the obtained solid was subjected to column chromatography (eluent:methylene chloride and hexanes), to obtain 0.93 g (yield of 47%) of Compound 1. The obtained material was identified by HRMS and HPLC analysis.

HRMS(MALDI) calcd for $C_{52}H_{47}IrN_4Si$: m/z: 948.32 Found: 949.28.

Synthesis Example 2: (Synthesis of Compound 3)

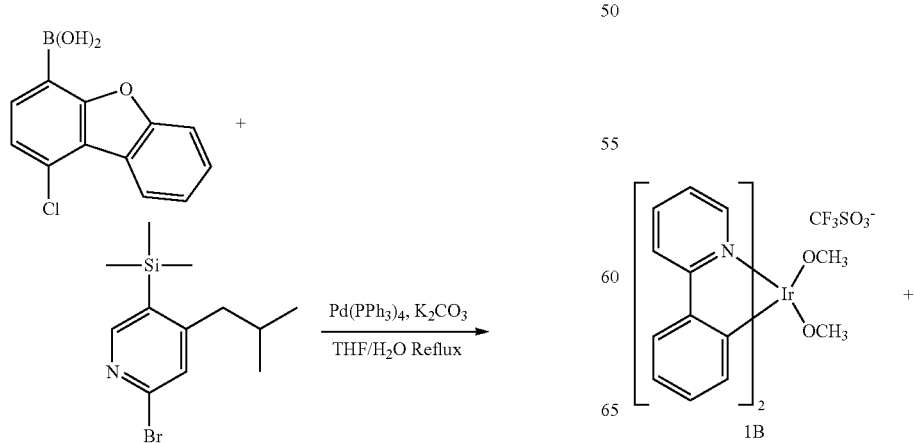

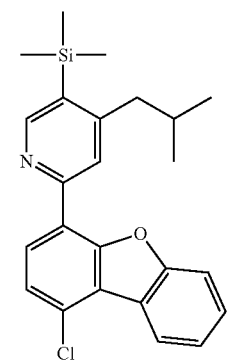

3A

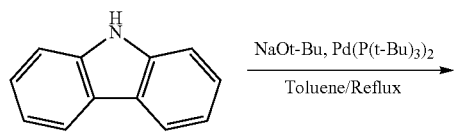

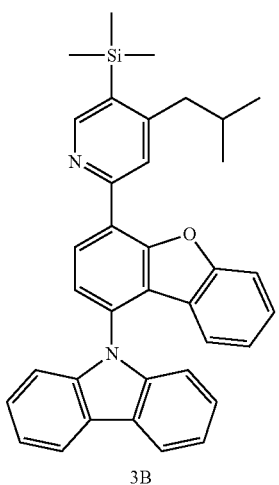

3B

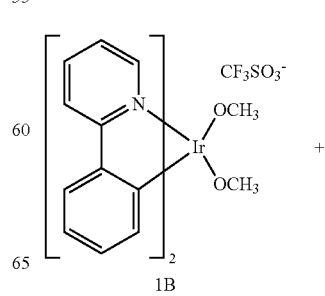

1B

-continued

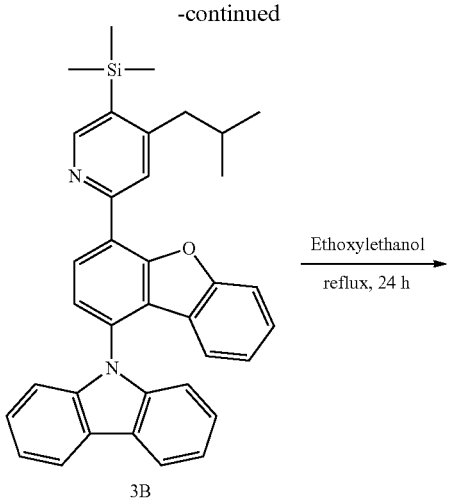

3B

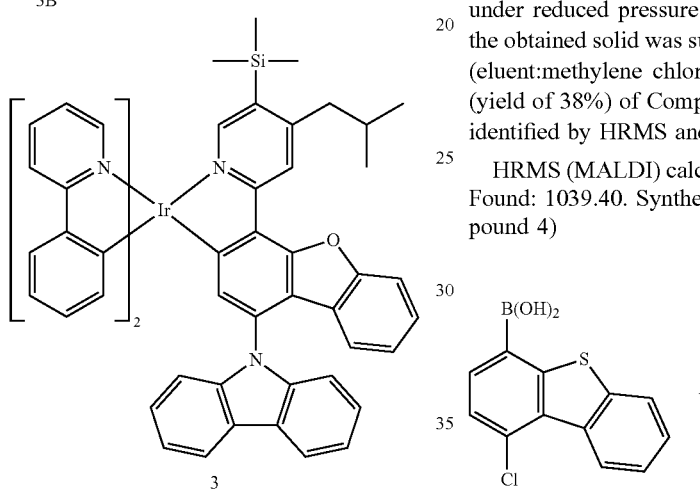

3

(1) Synthesis of Compound 3A

In a nitrogen environment, (1-chlorodibenzo[b,d]furan-4-yl)boronic acid (3.0 g, 10.5 mmol) and 2-bromo-4-isobutyl-5-(trimethylsilyl)pyridine (3.1 g, 12.6 mmol) were dissolved in 200 mL of tetrahydrofuran. $K_2CO_3$ (3.3 g, 31.4 mmol) was dissolved in 50 mL of DI water and added to the reaction mixture. Then, a palladium catalyst ($Pd(PPh_3)_4$) (1.2 g, 1.05 mmol) was added thereto. Next, the resultant reaction mixture was stirred at reflux at a temperature of 100° C. Following an extraction process, the obtained solid was subjected to column chromatography (eluent: MC and hexane), so as to obtain 3.9 g (yield of 95%) of 2-(1-chlorodibenzo[b,d]furan-4-yl)-4-isobutyl-5-(trimethylsilyl)pyridine. The obtained material was identified by HRMS and HPLC analysis.

HRMS (MALDI) calcd for $C_{24}H_{26}ClNOSi$: m/z: 407.15 Found: 409.20.

(2) Synthesis of Compound 3B

In a nitrogen environment, Compound 3 Å (6.1 g, 14.9 mmol), 9H-carbazole (1.0 g, 6.0 mmol), sodium t-butoxide (1.2 g, 11.9 mmol), and bis(tri-t-butylphosphine)palladium (0) (610 mg, 1.2 mmol) were added to 50 mL of toluene, and stirred at reflux. After completion of the reaction, the reaction temperature was cooled to room temperature, and an extraction process was performed using methylene chloride and water. After treatment with anhydrous magnesium sulfate, the resultant product was filtered and concentrated under reduced pressure. Following an extraction process, the obtained solid was subjected to column chromatography (eluent:methylene chloride and hexanes), to obtain 2.7 g (yield of 84%) of 9-(4-(4-isobutyl-5-(trimethylsilyl)pyridin-2-yl)dibenzo[b.d]furan-1-yl)-9H-carbazole. The obtained material was identified by HRMS and HPLC analysis.

HRMS (MALDI) calcd for $C_{36}H_{34}N_2OSi$: m/z: 538.24 Found: 539.78.

(3) Synthesis of Compound 3

Compound 1B (1.5 g, 2.1 mmol) and Compound 3B (1.3 g, 2.3 mmol) were combined with 20 mL of 2-ethoxyethanol and 20 mL of N,N-dimethylformamide, and the resultant mixed solution was stirred at a temperature of 110° C. for 24 hours. Then, the reaction temperature was reduced. An extraction process was performed using methylene chloride and water. After treatment with anhydrous magnesium sulfate, the resultant product was filtered and concentrated under reduced pressure. Following the extraction process, the obtained solid was subjected to column chromatography (eluent:methylene chloride and hexanes), to obtain 0.8 g (yield of 38%) of Compound 3. The obtained material was identified by HRMS and HPLC analysis.

HRMS (MALDI) calcd for $C_{58}H_{49}IrN_4OSi$: m/z: 1038.33 Found: 1039.40. Synthesis Example 3: (Synthesis of Compound 4)

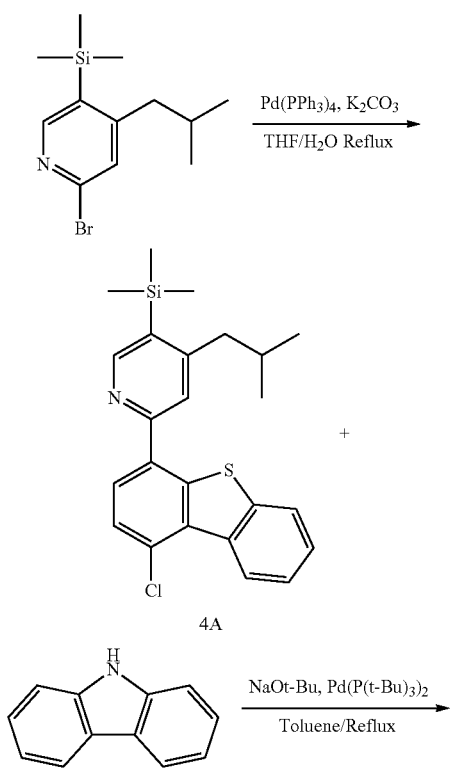

4A

-continued

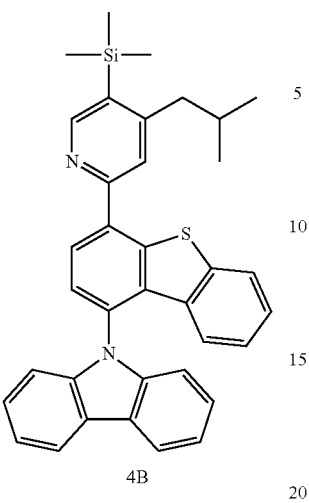

4B

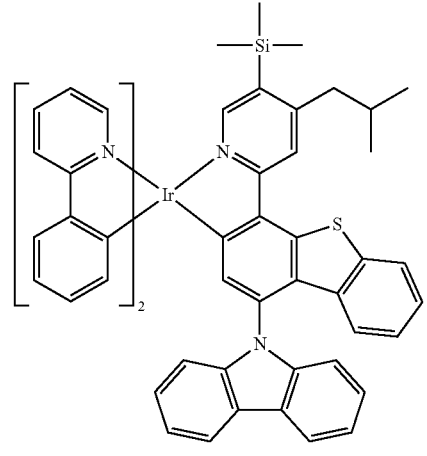

4

0.8 g (yield of 36%) of Compound 4 was obtained in the same manner as in the synthesis of Compound 3, except that, instead of (1-chlorodibenzo[b,d]furan-4-yl)boronic acid, 1-chlorodibenzo[b,d]thiophen-4-yl)boronic acid was used as a starting material in synthesizing Compound 3A so as to synthesize Compound 4A. The obtained material was identified by HRMS and HPLC analysis.

HRMS (MALDI) calcd for $C_{58}H_{49}IrN_4SSi$: m/z: 1054.31 Found: 1055.48

Synthesis Example 4: (Synthesis of Compound 5)

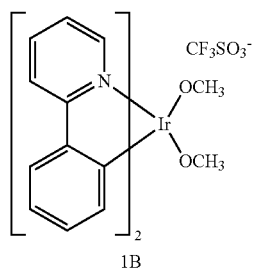

1B

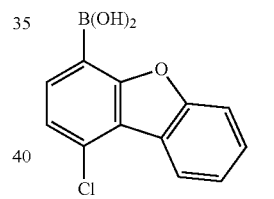

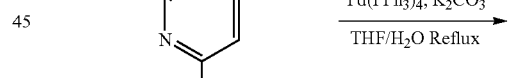

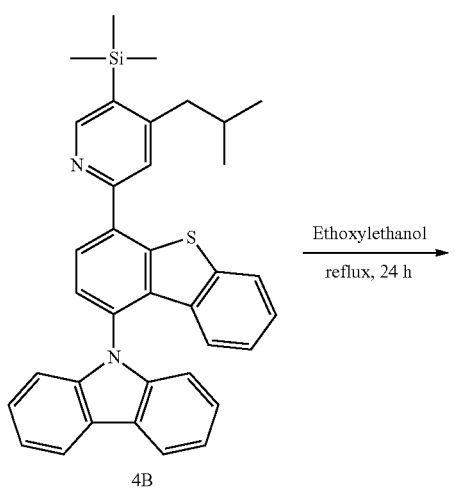

4B

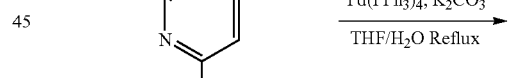

5A

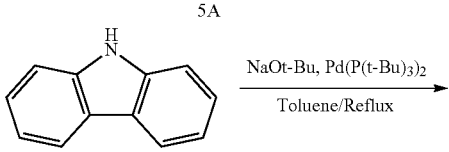

-continued

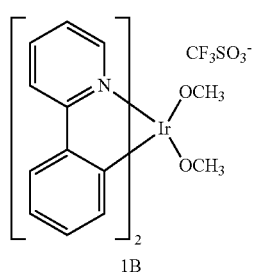
1B

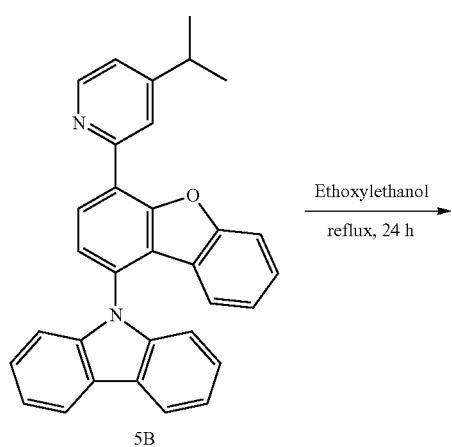
5B

Ethoxylethanol
reflux, 24 h

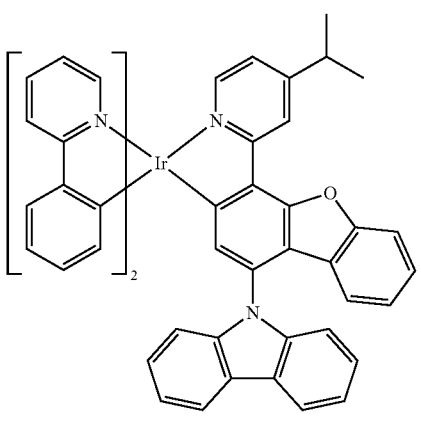
5

0.9 g (yield of 44%) of Compound 5 was obtained in the same manner as in the synthesis of Compound 3, except that, instead of 2-bromo-4-isobutyl-5-(trimethylsilyl)pyridine, 2-bromo-4-isopropylpyridine was used as a starting material in synthesizing Compound 3A so as to synthesize Compound 5A. The obtained material was identified by HRMS and HPLC analysis.

HRMS (MALDI) calcd for $C_{54}H_{39}IrN_4O$: m/z: 952.28 Found: 953.15

Example 1

As an anode, an ITO-patterned glass substrate was cut to a size of 50 mm×50 mm×0.5 mm, sonicated with isopropyl alcohol and DI water each for 5 minutes, and then cleaned by exposure to ultraviolet rays and ozone for 30 minutes. The resultant glass substrate was loaded onto a vacuum deposition apparatus.

Compounds HT3 and F12 (p-dopant) were vacuum co-deposited on the anode at a weight ratio of 98:2 to form a hole injection layer having a thickness of 100 Å, and Compound HT3 was vacuum deposited on the hole injection layer to form a hole transport layer having a thickness of 1,650 Å.

Sub sequentially, Compound GH3 (host) and Compound 1 (dopant) were co-deposited at a weight ratio of 92:8 on the hole transport layer to form an emission layer having a thickness of 400 Å.

Next, Compound ET3 and LiQ (n-dopant) were co-deposited at a volume ratio of 50:50 on the emission layer to form an electron transport layer having a thickness of 350 Å, LiQ was vacuum-deposited on the electron transport layer to form an electron injection layer having a thickness of 10 Å, and Al was vacuum-deposited on the electron injection layer to form a cathode having a thickness of 1,000 Å, thereby completing the manufacture of an organic light-emitting device.

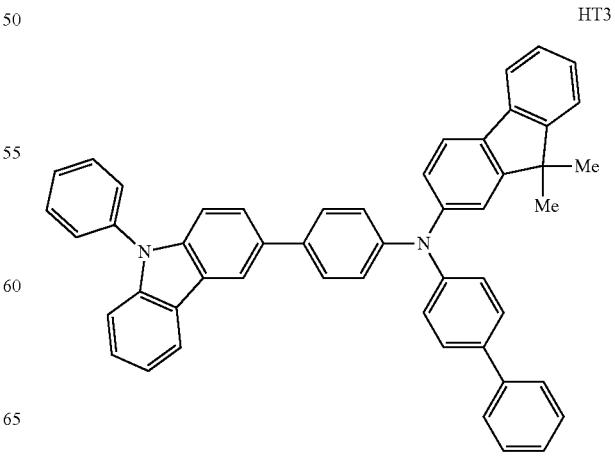
HT3

-continued

F12

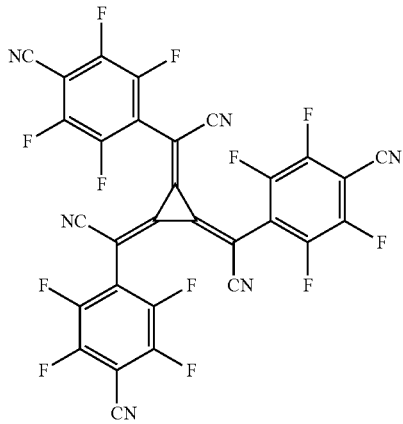

GH3

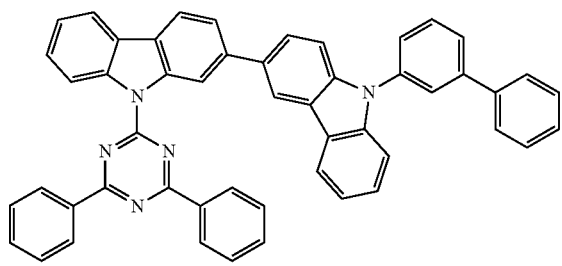

ETL

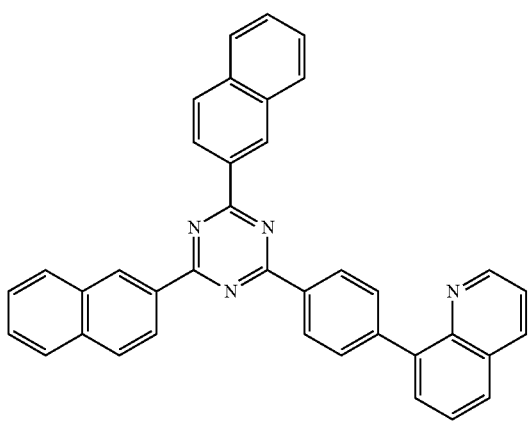

LiQ

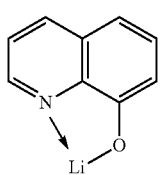

Example 2 and Comparative Examples 1 to 4

Organic light-emitting devices were manufactured in the same manner as in Example 1, except that compounds shown in Table 2 were each used instead of Compound 1 as a dopant in forming an emission layer.

Evaluation of Example: Characterization of Organic Light-Emitting Devices

For each organic light-emitting device manufactured in Examples 1 and 2 and Comparative Examples 1 to 4, a maximum value of external quantum efficiency (Max EQE), a roll-off ratio (%), and a driving voltage (V) were evaluated, and results are shown in Table 2. As evaluation apparatuses, a current-voltage meter (KEITHLEY 2400) and a luminance meter (MINOLTA Cs-1000A) were used. The roll-off ratio was calculated according to Equation 20:

Roll off ratio={1−(efficiency (at 3500 nit)/maximum emission efficiency)}×100%   Equation 20

TABLE 2

| | Dopant in emission layer | Max EQE (%) | Roll-off ratio (%) | Driving voltage (V) |
|---|---|---|---|---|
| Example 1 | Compound 1 | 21.5 | 11% | 3.9 |
| Example 2 | Compound 3 | 22.0 | 10% | 4.0 |
| Comparative Example 1 | Compound A | 19.0 | 13% | 4.2 |
| Comparative Example 2 | Compound B | 20.0 | 16% | 4.1 |
| Comparative Example 3 | Compound C | 21.0 | 14% | 4.1 |
| Comparative Example 4 | Compound D | 18.5 | 16% | 4.4 |

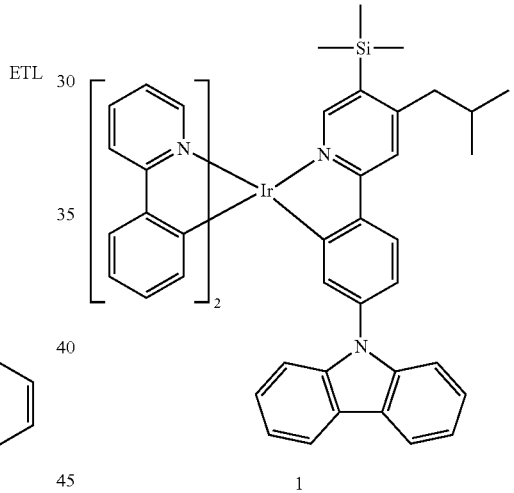

1

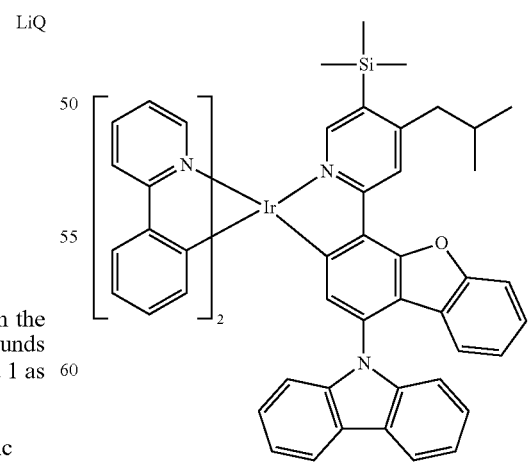

3

TABLE 2-continued

| Dopant in emission layer | Max EQE (%) | Roll-off ratio (%) | Driving voltage (V) |
|---|---|---|---|

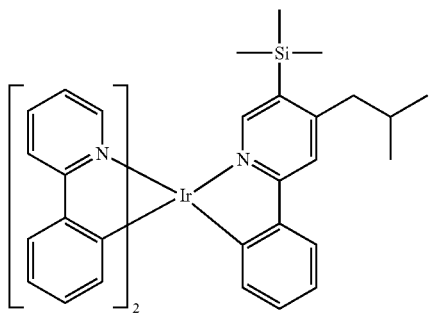

A

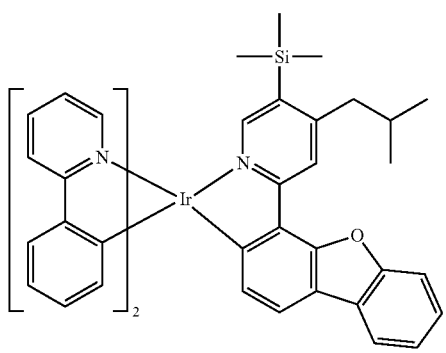

B

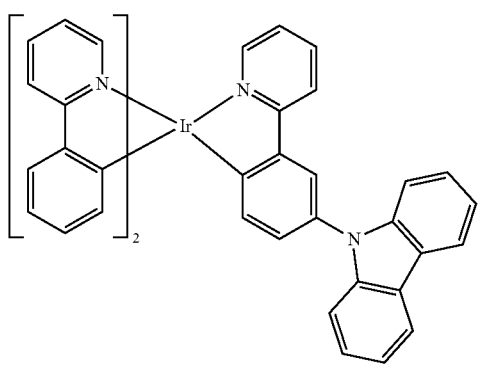

C

TABLE 2-continued

| Dopant in emission layer | Max EQE (%) | Roll-off ratio (%) | Driving voltage (V) |
|---|---|---|---|

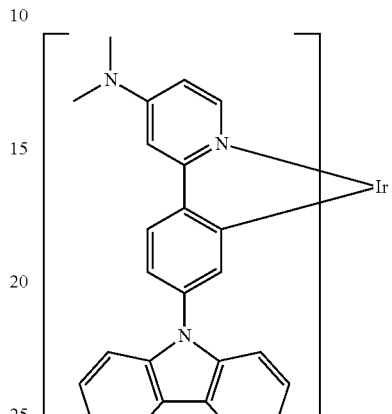

D

Referring to Table 2, it was confirmed that the organic light-emitting devices of Examples 1 and 2 exhibited improved characteristics, such as a low driving voltage, high EQE, a decreased roll-off ratio, and a long lifespan. In addition, it was also confirmed that the organic light-emitting devices of Examples 1 and 2 exhibited a decreased roll-off ratio and excellent EQE and lifespan characteristics compared to the organic light-emitting devices of Comparative Examples 1 to 4.

According to the one or more embodiments, an organometallic compound has excellent electrical characteristics and stability. Thus, an electronic device, such as an organic light-emitting device, including the organometallic compound may have a low driving voltage, high efficiency, a long lifespan, a decreased roll-off ratio, and a FWHM of an emission peak of a relatively narrow EL spectrum. Therefore, the use of the organometallic compound may enable the embodiment of a high-quality organic light-emitting device and an electron device including the same.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:
1. A compound represented by one of Compounds 1 to 36:
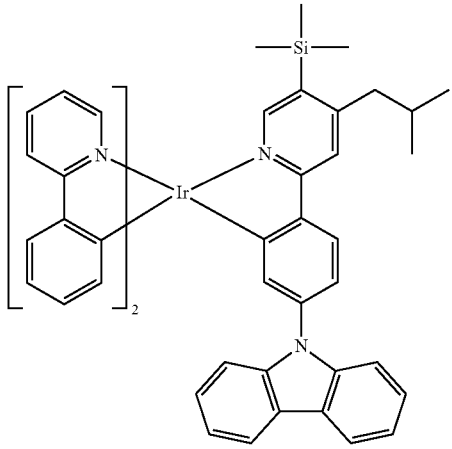
1
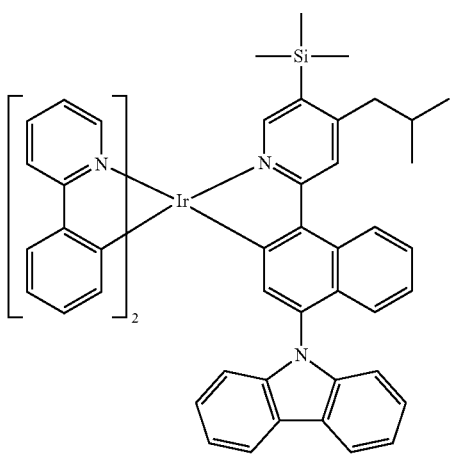
2
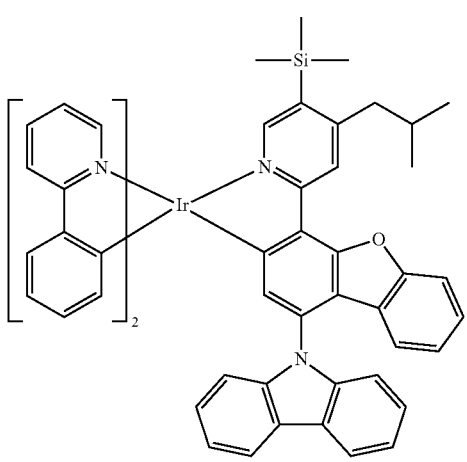
3
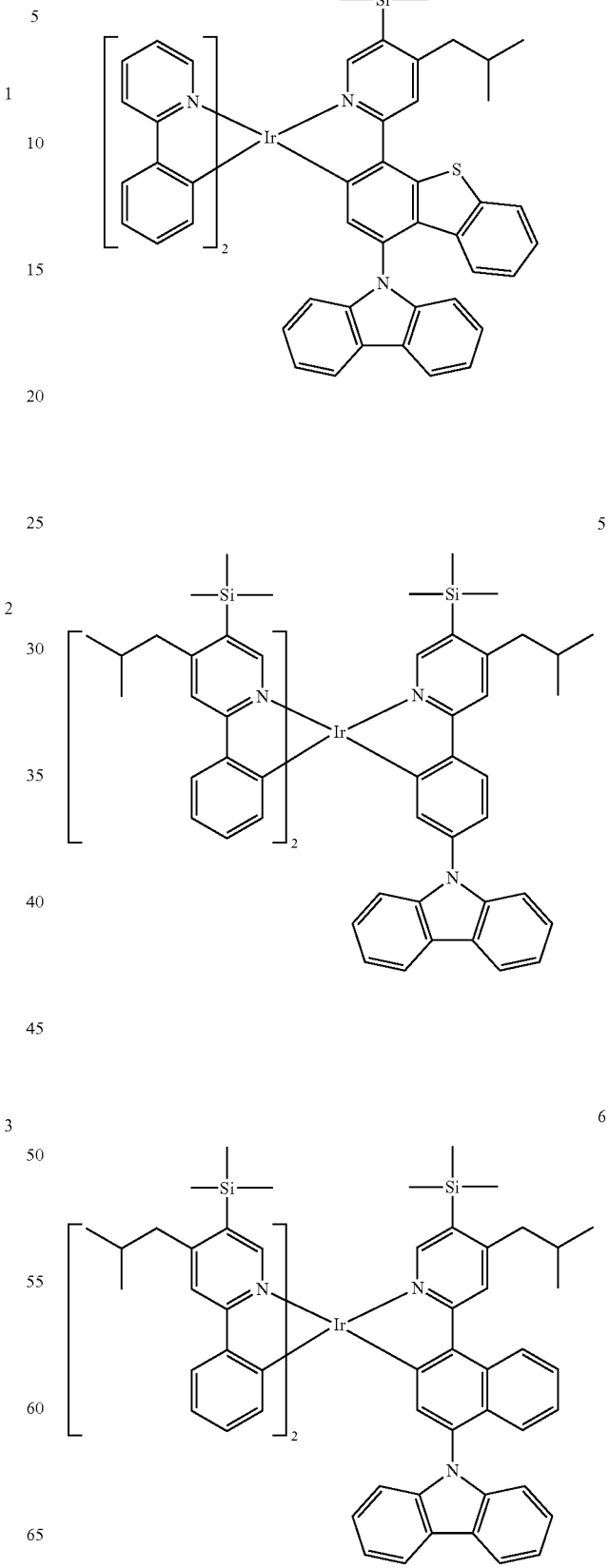

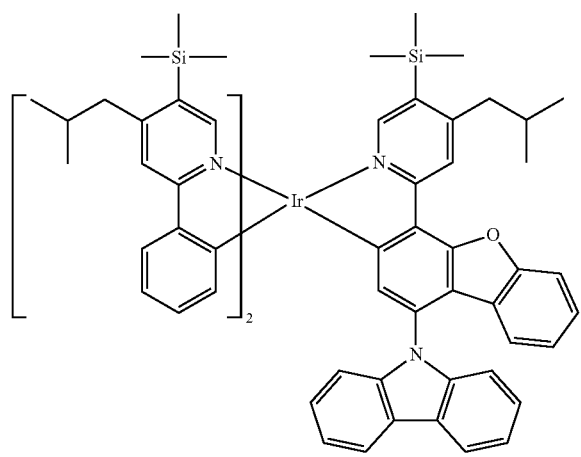
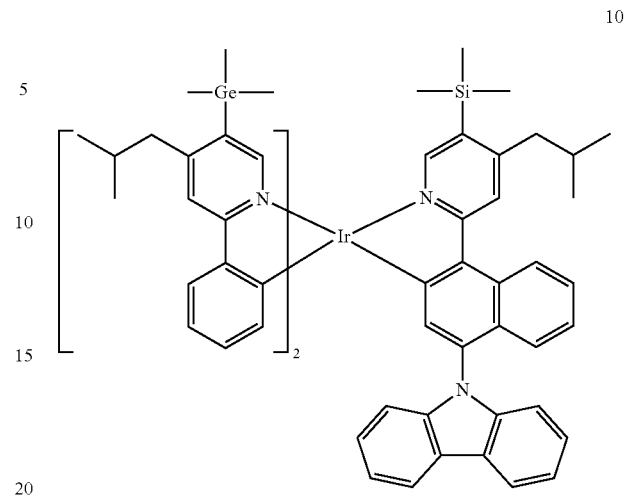
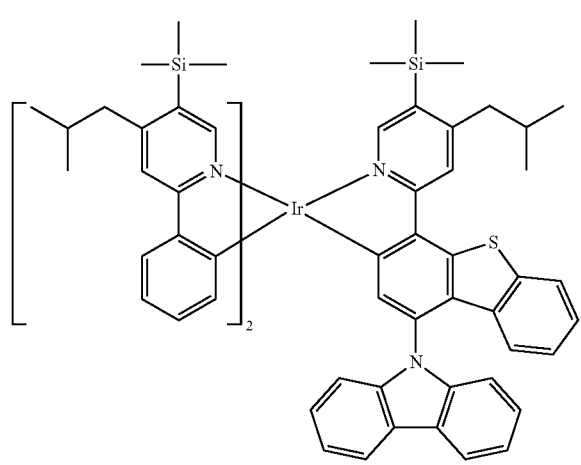
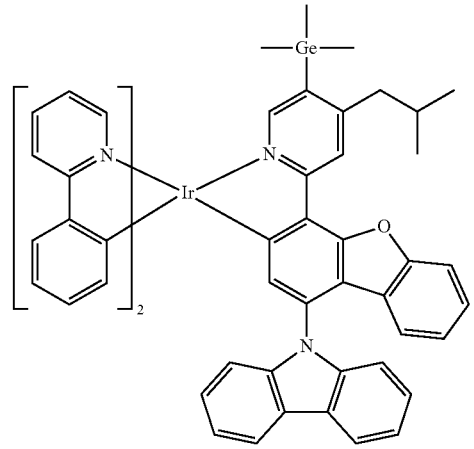
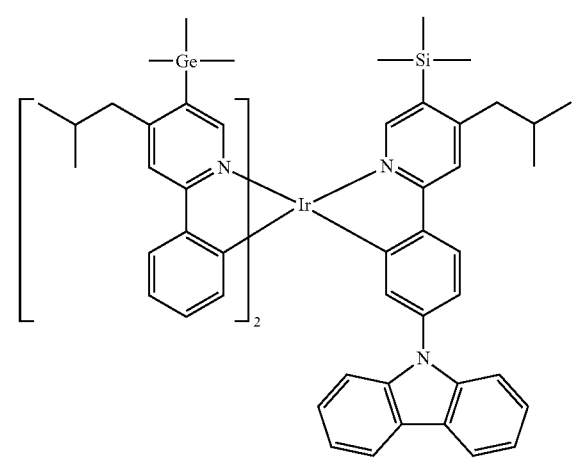
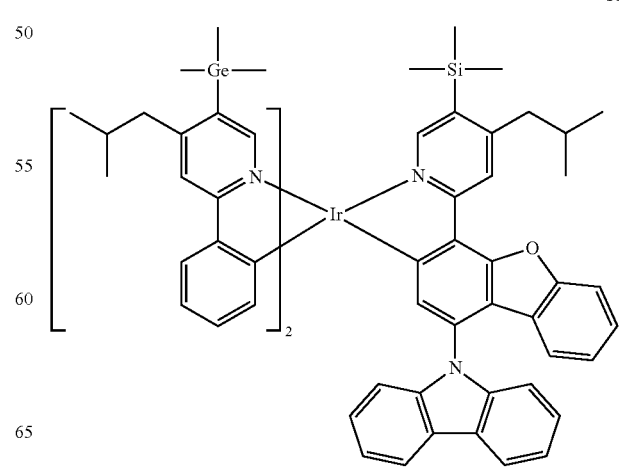

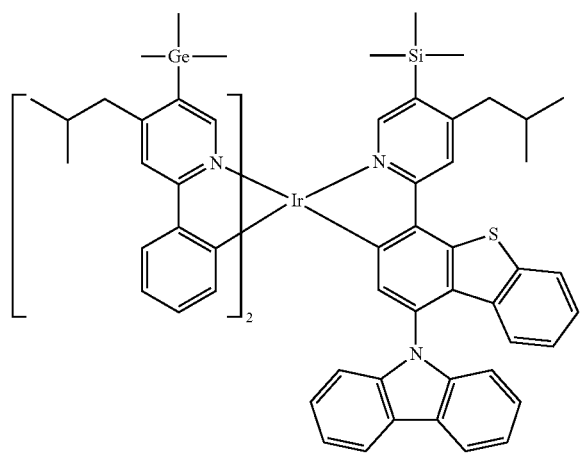
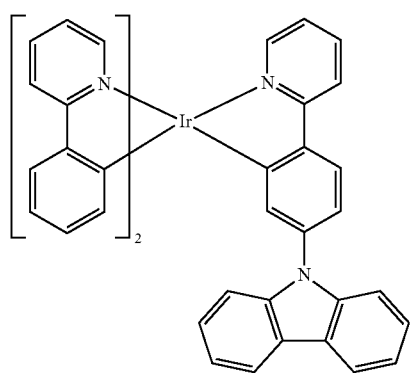
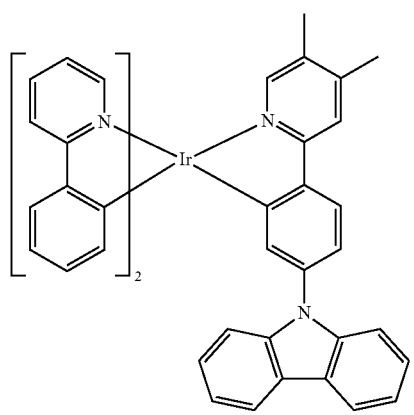
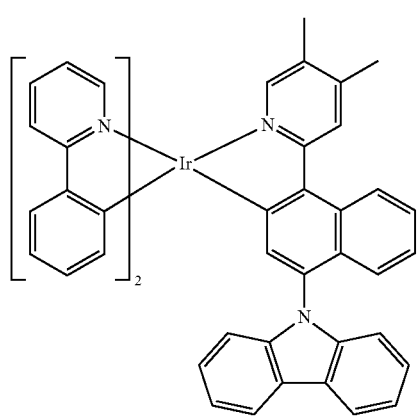
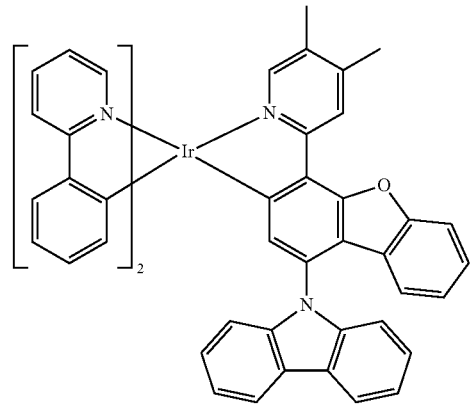
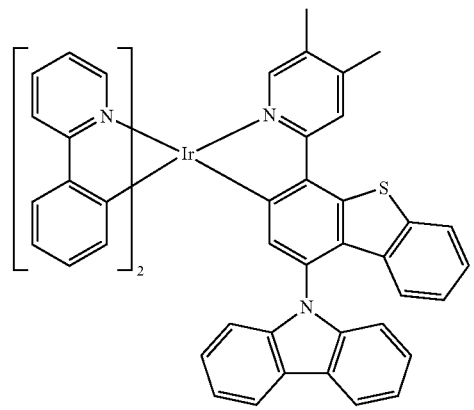
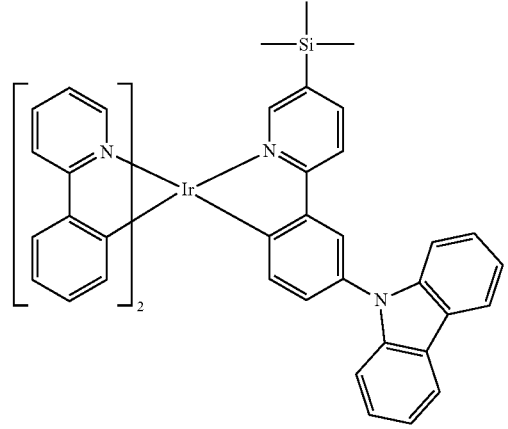

19
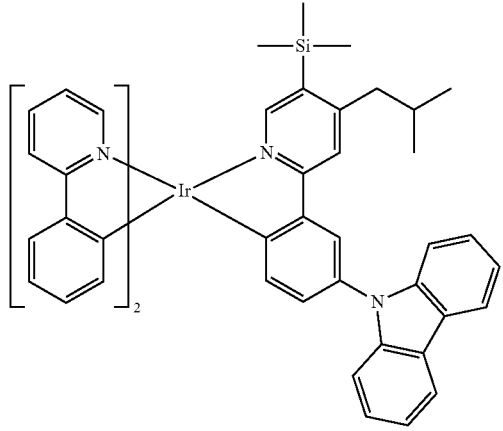
20
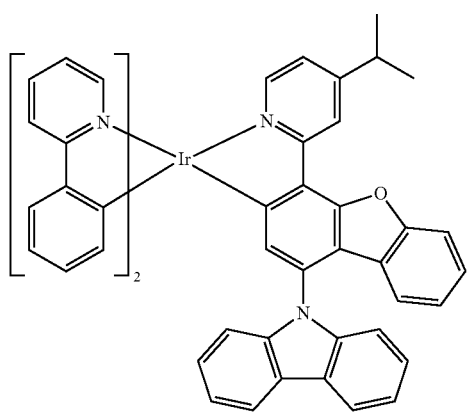
21
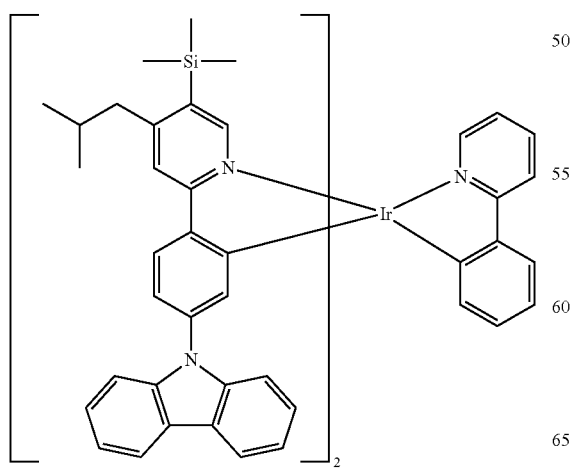
22
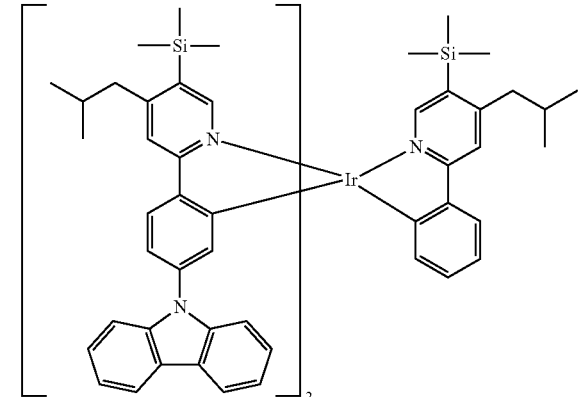
23
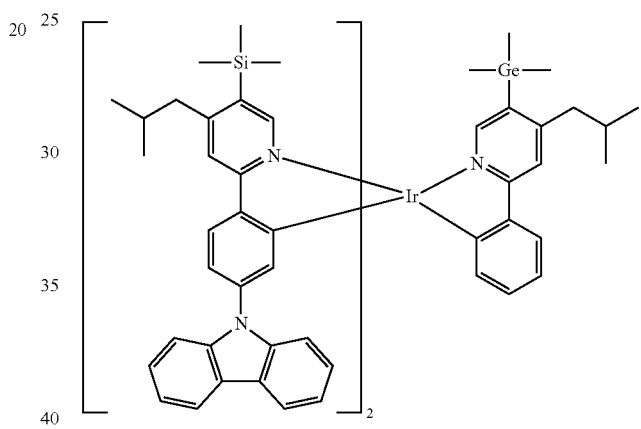
24
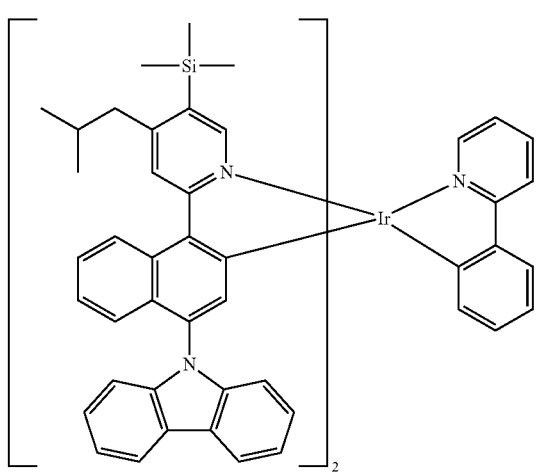

25
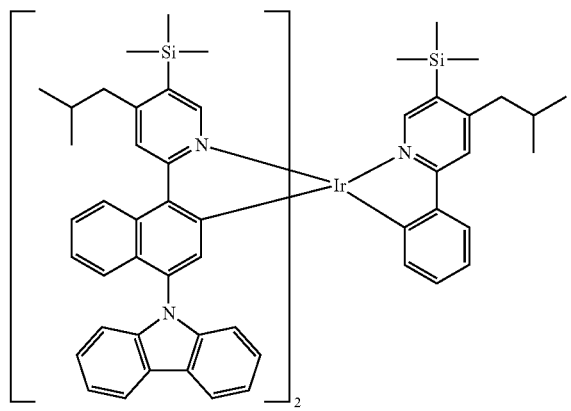
26
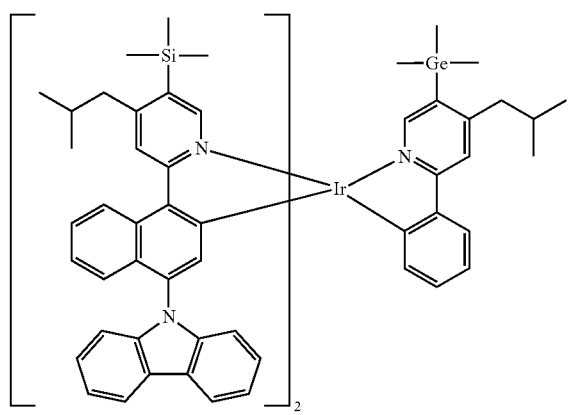
27
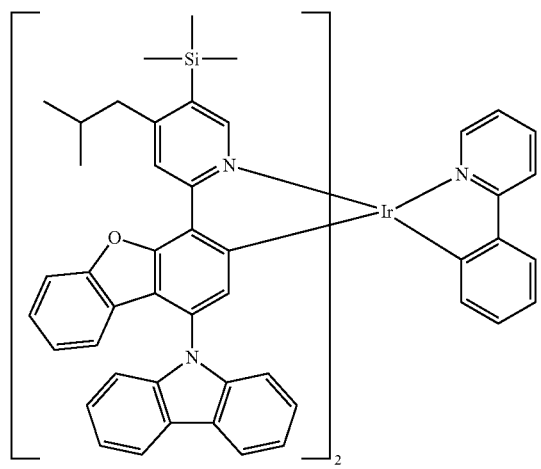
28
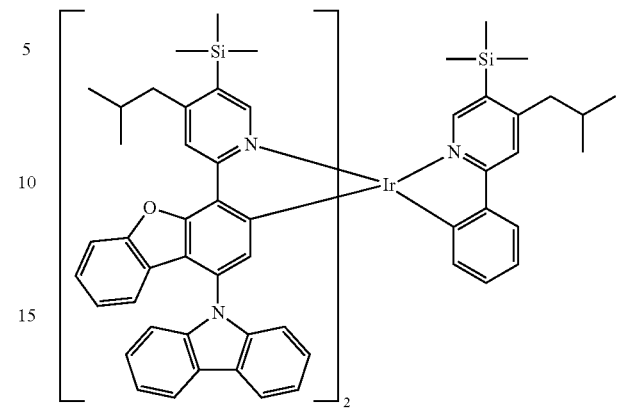
29
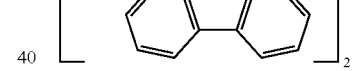
30
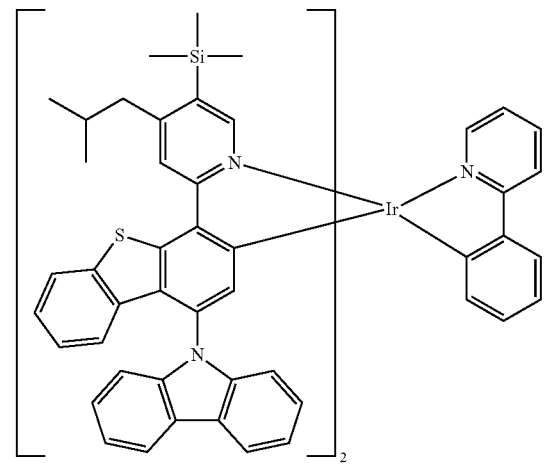

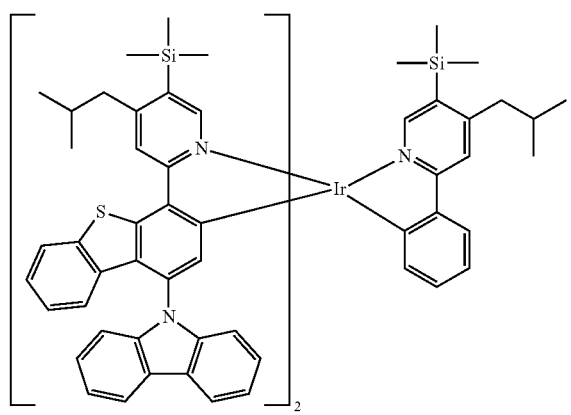
31
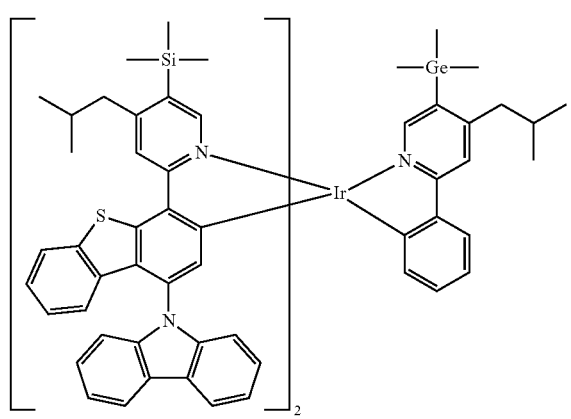
32
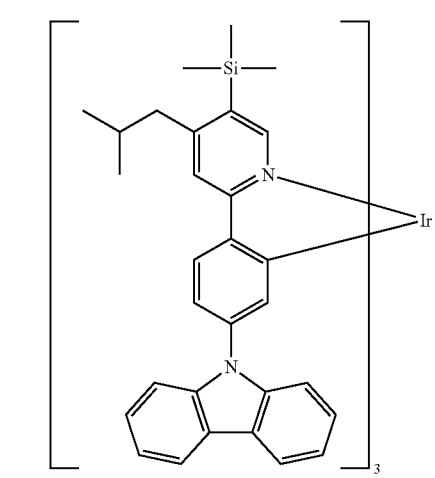
33
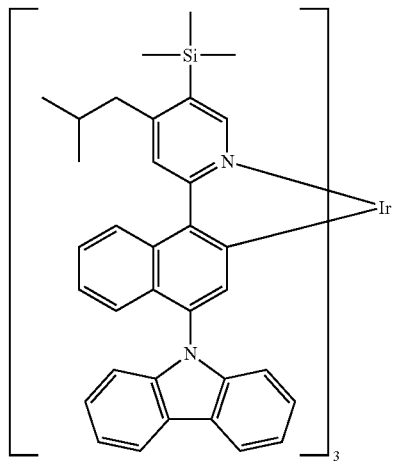
34
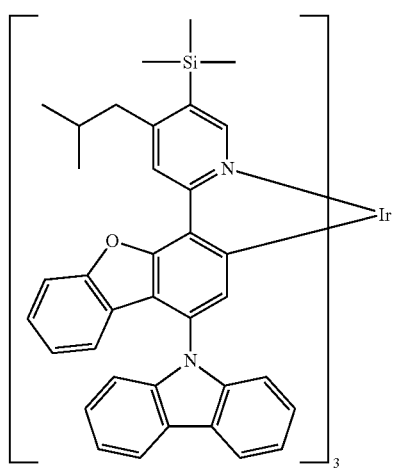
35
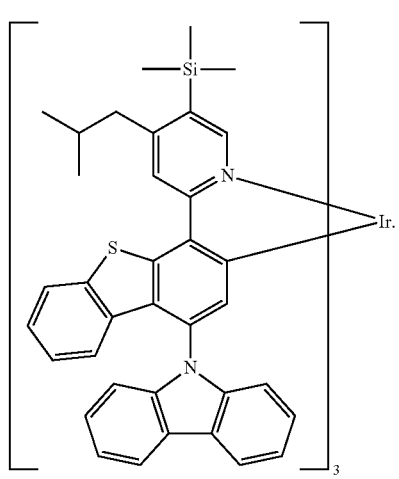
36
2. An organic light-emitting device comprising:
a first electrode;
a second electrode, and
an organic layer arranged between the first electrode and the second electrode and comprising an emission layer, wherein
wherein the organic layer comprises at least one organometallic compound of claim 1.

3. The organic light-emitting device of claim 2, wherein the emission layer comprises the at least one organometallic compound.

4. The organic light-emitting device of claim 3, wherein the emission layer further comprises a host, and an amount of the host is greater than an amount of the at least one organometallic compound in the emission layer.

5. The organic light-emitting device of claim 4, wherein the emission layer emits green light having a maximum emission wavelength of about 500 nanometers to about 600 nanometers.

6. The organic light-emitting device of claim 2, wherein
the first electrode is an anode,
the second electrode is a cathode,
the organic layer further comprises a hole transport region between the first electrode and the emission layer and an electron transport region between the emission layer and the second electrode,
the hole transport region comprises a hole injection layer, a hole transport layer, an electron blocking layer, a buffer layer, or a combination thereof, and
the electron transport region comprises a hole blocking layer, an electron transport layer, an electron injection layer, or a combination thereof.

7. An electronic apparatus comprising the organic light-emitting device of claim 2.

* * * * *